United States Patent
Jang et al.

(10) Patent No.: US 10,388,690 B2
(45) Date of Patent: Aug. 20, 2019

(54) WAFER LEVEL LIGHT-EMITTING DIODE ARRAY

(71) Applicant: Seoul Viosys Co., Ltd., Ansan-si (KR)

(72) Inventors: Jong Min Jang, Ansan-si (KR); Jong Hyeon Chae, Ansan-si (KR); Joon Sup Lee, Ansan-si (KR); Daewoong Suh, Ansan-si (KR); Hyun A. Kim, Ansan-si (KR); Won Young Roh, Ansan-si (KR); Min Woo Kang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 77 days.

(21) Appl. No.: 15/081,134

(22) Filed: Mar. 25, 2016

(65) Prior Publication Data

US 2016/0211410 A1 Jul. 21, 2016

Related U.S. Application Data

(63) Continuation-in-part of application No. 14/420,175, filed as application No. PCT/KR2013/007091 on
(Continued)

(30) Foreign Application Priority Data

Aug. 7, 2012 (KR) .................... 10-2012-0086329
Aug. 28, 2012 (KR) .................... 10-2012-0094107
(Continued)

(51) Int. Cl.
*H01L 33/08* (2010.01)
*H01L 33/38* (2010.01)
(Continued)

(52) U.S. Cl.
CPC .......... *H01L 27/153* (2013.01); *H01L 27/156* (2013.01); *H01L 33/20* (2013.01);
(Continued)

(58) Field of Classification Search
None
See application file for complete search history.

(56) References Cited

U.S. PATENT DOCUMENTS 6,504,180 B1 * 1/2003 Heremans ............ G02B 6/4249
257/88
6,573,537 B1 6/2003 Steigerwald et al.
(Continued)

FOREIGN PATENT DOCUMENTS

JP 2000323750 A 11/2000
JP 2001156331 A 6/2001
(Continued)

OTHER PUBLICATIONS

International Search Report, Korean Intellectual Property Office, International Application No. PCT/KR2013/007105, dated Nov. 26, 2013, pages.
(Continued)

*Primary Examiner* — Walter H Swanson
*Assistant Examiner* — Kien C Ly
(74) *Attorney, Agent, or Firm* — Perkins Coie LLP

(57) ABSTRACT

A light emitting diode array is provide to include: a substrate; light emitting diodes positioned over the substrate, each including a first semiconductor layer, an active layer, and a second semiconductor layer, wherein each light emitting diode is disposed to form a first via hole structure exposing a portion of the corresponding first semiconductor layer; lower electrodes disposed over the second semiconductor layer; a first interlayer insulating layer disposed over the lower electrodes and configured to expose the portion of
(Continued)

the first semiconductor layer of corresponding light emitting diodes; upper electrodes electrically connected to the first semiconductor layer through the first via hole structure, wherein the first via hole structure is disposed in parallel with one side of the corresponding second semiconductor layer and the first interlayer insulating layer is disposed to form a second via hole structure exposing a portion of the lower electrodes.

23 Claims, 46 Drawing Sheets

Related U.S. Application Data

Aug. 6, 2013, now Pat. No. 9,318,530, application No. 15/081,134, which is a continuation-in-part of application No. 14/722,011, filed on May 26, 2015, now Pat. No. 9,318,529, which is a continuation-in-part of application No. 14/426,723, filed as application No. PCT/KR2013/007105 on Aug. 6, 2013, now Pat. No. 9,412,922.

(30) Foreign Application Priority Data

| Sep. 7, 2012 | (KR) | 10-2012-0099263 |
|---|---|---|
| Sep. 13, 2012 | (KR) | 10-2012-0101716 |
| Jul. 26, 2013 | (KR) | 10-2013-0088709 |
| Jul. 26, 2013 | (KR) | 10-2013-0088710 |
| Jul. 26, 2013 | (KR) | 10-2013-0088712 |
| Jul. 26, 2013 | (KR) | 10-2013-0088714 |
| May 26, 2014 | (KR) | 10-2014-0063157 |

(51) Int. Cl.
*H01L 33/62* (2010.01)
*H01L 27/15* (2006.01)
*H01L 33/20* (2010.01)
*H01L 33/44* (2010.01)

(52) U.S. Cl.
CPC ............ *H01L 33/387* (2013.01); *H01L 33/44* (2013.01); *H01L 33/62* (2013.01)

(56) References Cited

U.S. PATENT DOCUMENTS

| 7,009,199 | B2 | 3/2006 | Hall | |
|---|---|---|---|---|
| 7,709,849 | B1 | 5/2010 | Kal et al. | |
| 2002/0070386 | A1* | 6/2002 | Krames | H01L 33/38 |
| | | | | 257/94 |
| 2002/0179914 | A1 | 12/2002 | Sheu | |
| 2003/0160251 | A1 | 8/2003 | Wanlass et al. | |
| 2006/0231852 | A1* | 10/2006 | Kususe | H01L 24/06 |
| | | | | 257/99 |
| 2006/0284195 | A1 | 12/2006 | Nagai | |
| 2007/0262323 | A1 | 11/2007 | Sonobe et al. | |
| 2008/0179602 | A1* | 7/2008 | Negley | H01L 21/2654 |
| | | | | 257/88 |
| 2008/0251796 | A1* | 10/2008 | Lee | H01L 27/153 |
| | | | | 257/88 |
| 2010/0059733 | A1* | 3/2010 | Shei | H01L 27/156 |
| | | | | 257/13 |
| 2010/0078656 | A1 | 4/2010 | Seo et al. | |
| 2010/0140637 | A1* | 6/2010 | Donofrio | H01L 33/46 |
| | | | | 257/98 |
| 2010/0151604 | A1 | 6/2010 | Kal et al. | |
| 2010/0320488 | A1 | 12/2010 | Horie | |
| 2011/0101390 | A1* | 5/2011 | Engl | H01L 27/156 |
| | | | | 257/93 |
| 2011/0127549 | A1* | 6/2011 | Lee | H01L 27/153 |
| | | | | 257/88 |
| 2011/0084294 | A1 | 7/2011 | Yao | |
| 2011/0266579 | A1* | 11/2011 | Nagai | H01L 27/156 |
| | | | | 257/98 |
| 2011/0284884 | A1* | 11/2011 | Lee | H01L 27/153 |
| | | | | 257/88 |
| 2012/0018764 | A1* | 1/2012 | Choi | H01L 33/54 |
| | | | | 257/99 |
| 2012/0074441 | A1* | 3/2012 | Seo | H01L 27/153 |
| | | | | 257/91 |
| 2012/0120176 | A1* | 5/2012 | Kinoshita | G03G 15/04036 |
| | | | | 347/224 |
| 2012/0146066 | A1* | 6/2012 | Tischler | H01L 27/156 |
| | | | | 257/89 |
| 2012/0236532 | A1* | 9/2012 | Koo | F21K 9/00 |
| | | | | 362/84 |
| 2013/0126914 | A1* | 5/2013 | Pan | H01L 27/156 |
| | | | | 257/88 |
| 2017/0097123 | A1* | 4/2017 | Tischler | H01L 27/156 |
| 2018/0286915 | A1* | 10/2018 | Yeon | H01L 27/153 |

FOREIGN PATENT DOCUMENTS

| JP | 2002009331 A | 1/2002 |
|---|---|---|
| JP | 2008-192710 A | 8/2008 |
| KR | 1020070035745 A | 4/2007 |
| KR | 1020080002161 A | 1/2008 |
| KR | 10-2009-0053435 A | 5/2009 |
| KR | 1020110067313 A | 6/2011 |

OTHER PUBLICATIONS

Office Action, Taiwan Intellectual Property Office, Application No. 1052135920, dated Oct. 28, 2016, 11 pages.
Office Action in Korean Patent Application No. 10-2013-0088714, dated Nov. 21, 2017 (with English translation).
Office Action in Korean Patent Application No. 10-2013-0088712, dated Nov. 21, 2017 (with English translation).
Examination Report from related Indian Patent Application No. 387/KOLNP/2015 dated Jan. 8, 2019 (5 pages).

* cited by examiner

A1 - A2

A1 - A2

A1 - A2

B1 - B2

C1 - C2

D1 - D2

E1 - E2

B1 - B2

C1 - C2

D1 - D2

E1 - E2

B1 - B2

C1 - C2

D1 - D2

E1 - E2

B1 - B2

C1 - C2

D1 - D2

E1 - E2

A1 – A2

A1 – A2

A1 – A2

B1 – B2

C1 – C2

D1 – D2

E1 - E2

B1 – B2

C1 – C2

D1 – D2

E1 – E2

B1 - B2

C1 - C2

D1 - D2

E1 – E2

C2 – C3

A1 – A2

A1 – A2

A1 – A2

B1 - B2

C1 - C2

D1 - D2

E1 – E2

B1 - B2

C1 - C2

D1 - D2

E1 - E2

B1 - B2

C1 - C2

D1 - D2

E1 - E2

US 10,388,690 B2

WAFER LEVEL LIGHT-EMITTING DIODE ARRAY

CROSS REFERENCE TO RELATED APPLICATION

This patent document is continuation-in-part of, and claims the benefits and priorities to, U.S. patent application Ser. No. 14/420,175, filed on Feb. 6, 2015, now U.S. Pat. No. 9,318,530, issued on Apr. 19, 2016, which is the U.S. National Stage entry of International Application No. PCT/KR2013/007091, filed on Aug. 6, 2013, which further claims the benefits and priorities of prior Korean Patent Application No. 10-2013-0088710, filed on Jul. 26, 2013, prior Korean Patent Application No. 10-2013-0088709, filed on Jul. 26, 2013, prior Korean Patent Application No. 10-2012-0094107, filed on Aug. 28, 2012, prior Korean Patent Application No. 10-2012-0086329, filed on Aug. 7, 2012, and is a continuation-in-part of, and claims the benefits and priorities to, U.S. patent application Ser. No. 14/722,011, filed on May 26, 2015, now U.S. Pat. No. 9,318,529, issued on Apr. 19, 2016, which is a continuation-in-part of U.S. patent application Ser. No. 14/426,723, which is the U.S. National Stage Entry of International Application No. PCT/KR2013/007105, filed on Aug. 6, 2013, which further claims the benefits and priorities of prior Korean Patent Application No. 10-2012-0099263, filed on Sep. 7, 2012, prior Korean Patent Application No. 10-2012-0101716, filed on Sep. 13, 2012, prior Korean Patent Application No. 10-2013-0088712, filed on Jul. 26, 2013, prior Korean Patent Application No. 10-2013-0088714, filed on Jul. 26, 2013 and prior Korean Patent Application No. 10-2014-0063157, filed on May 26, 2014. The entire disclosures of the above applications are incorporated by reference in their entirety as part of this document.

TECHNICAL FIELD

This patent document relates to a light emitting diode array, and more particularly, to a light emitting diode array with a plurality of light emitting diodes connected through wires and formed into a flip chip type.

BACKGROUND

A light emitting diode is a device for performing a light emitting operation when a voltage of a turn-on voltage or more is applied thereto through anode and cathode terminals thereof. Generally, the turn-on voltage for causing the light emitting diode to emit light has a value much lower than the voltage of a common power source. Therefore, the light emitting diode has a disadvantage in that it cannot be used directly under the common AC power source of 110V or 220V. The operation of the light emitting diode using the common AC power source requires a voltage converter for lowering the supplied AC voltage. Accordingly, a driving circuit for the light emitting diode should be provided, which becomes one factor causing fabrication costs of an illuminating apparatus including the light emitting diode to be increased. Since a discrete driving circuit should be provided, the volume of the illuminating apparatus is increased and unnecessary heat is generated. In addition, there are problems such as improvement of a power factor for the supplied power.

To use the common AC power source in a state where a discrete voltage converting means is excluded, there has been suggested a method of constructing an array by connecting a plurality of light emitting diode chips in series to one another. To implement the light emitting diodes as an array, the light emitting diode chips should be formed into individual packages. Thus, a substrate separating process, a packaging process for a separated light emitting diode chip, and the like are required, and a mounting process of arranging the packages on an array substrate and a wiring process for forming wirings between electrodes of the packages are additionally required. Therefore, there are problems in that a processing time for constructing the array is increased, and fabrication costs of the array are increased.

Moreover, wire bonding is used for the wiring process of forming the array, and a molding layer for protecting bonding wires is additionally formed on an entire surface of the array. Accordingly, there is a problem in that a molding process of forming the molding layer is additionally required, resulting in increase in the complexity of processes. Particularly, in a case of application of a chip type with a lateral structure, the light-emitting performance of the light emitting diode chip is lowered, and the quality of the light emitting diode is deteriorated due to the generation of heat.

SUMMARY

Some implementations of the disclosed technology in this patent document provide a flip-chip type light emitting diode array that can be driven at a high voltage.

Some implementations of the disclosed technology provide a light emitting diode array that can be mounted directly on a printed circuit board or the like without any submount substrate.

Some implementations of the disclosed technology provide a flip-chip type light emitting diode array that can prevent light loss without using a discrete reflective metal layer in addition to wires for connecting a plurality of light emitting diodes.

Some implementations of the disclosed technology provide a light emitting diode array that can prevent cracks from occurring in layers covering light emitting diodes, thereby improving the reliability thereof.

Some implementations of the present disclosure provide a flip-chip type light emitting diode array capable of reducing a light loss to improve light extraction efficiency.

Some implementations of the present disclosure provide a flip-chip type light emitting diode array capable of effectively diffusing a current.

In one aspect, a light emitting diode array is provided to comprise: a substrate, light emitting diodes positioned over the substrate, each light emitting diode including a first semiconductor layer, an active layer, and a second semiconductor layer, wherein each light emitting diode is disposed to form a first via hole structure exposing a portion of the corresponding first semiconductor layer; lower electrodes disposed over the second semiconductor layer of corresponding light emitting diodes, a first interlayer insulating layer disposed over the lower electrodes and configured to expose the portion of the first semiconductor layer of corresponding light emitting diodes, and upper electrodes formed over the first interlayer insulating layer and electrically connected to the first semiconductor layer of corresponding light emitting diodes through the first via hole structures, wherein the first via hole structure of each light emitting diode is disposed in parallel with one side of the corresponding second semiconductor layer, and the first interlayer insulating layer is disposed to form second via hole structures exposing a portion of the lower electrodes of corresponding light emitting diodes.

In some implementations, the first via hole structure of a given light emitting diode includes a pair of via holes disposed near edges of the given light emitting diode and a connection part connecting the pair of via holes, and one of the pair of via holes is spaced apart by a predetermined distance from at least one of the second via holes. In some implementations, the first via hole structure has a dumbbell shape, a rectangular shape, or a rectangular shape with round corners. In some implementations, the first via hole structure has a length proportional to a length of a longer side of the second semiconductor layer. In some implementations, the first via hole structure for at least one of the light emitting diodes is disposed in a middle region of the corresponding second semiconductor layer. In some implementations, the first via hole structure has a length ranging from no less than 30% to less than 100% of a length of one side of the second semiconductor layer. In some implementations, at least one of the upper electrodes is electrically connected to a second semiconductor layers of corresponding light emitting diodes, and at least one of the upper electrodes is insulated from the second semiconductor layers of the corresponding light emitting diodes. In some implementations, at least one of the upper electrodes is electrically connected to the second semiconductor layer of the corresponding light emitting diodes through the exposed portions of the lower electrodes. In some implementations, the light emitting diode array further comprises: a second interlayer insulating layer covering the upper electrodes, wherein the second interlayer insulating layer is disposed to form third via hole structures exposing a portion of the corresponding lower electrodes and a portion of the corresponding upper electrodes. In some implementations, at least two of the third via hole structures are symmetrical with respect to the corresponding first via hole structures in a given light emitting diode. In some implementations, the third via hole structures are spaced apart by a predetermined distance from a portion of the corresponding first via hole structure in a given light emitting diode. In some implementations, the light emitting diode array further comprises: first and second pads positioned over the second interlayer insulating layer, wherein the light emitting diodes are connected in series by the upper electrodes, and the first pad is connected to the exposed portion of the corresponding lower electrodes and the second pad is connected to the exposed portion of the corresponding upper electrodes. In some implementations, the upper electrodes include ohmic contact layers providing ohmic-contacts with the first semiconductor layers. In some implementations, the upper electrodes further include reflective layers positioned over the ohmic contact layers. In some implementations, each of the lower electrodes includes a reflective layer. In some implementations, at least one of the upper electrodes occupies an area no less than 30% and less than 100% of an entire area of the light emitting diode array. In some implementations, at least one of the upper electrodes has a length or a width greater than that of the corresponding light emitting diode.

In another aspect, a light emitting diode array is provided to comprise: a substrate; light emitting units respectively disposed in a first region and a second region, each light emitting unit including a first semiconductor layer, an active layer, and a second semiconductor layer, wherein the light emitting units in the first and second regions are disposed to form first via structures to expose a portion of the corresponding first semiconductor layers; lower electrodes disposed over the light emitting units in the first region and the second region except the exposed portion of the first semiconductor layer; interlayer insulation layers disposed over the lower electrodes to form second via structures to expose a portion of the exposed portion of the first semiconductor layer, wherein the interlayer insulating layers are further disposed to expose a portion of the lower electrodes; and upper electrodes disposed over the interlayer insulation layers, wherein one of the upper electrodes is disposed in the first region to electrically connect the first semiconductor layer of the corresponding light emitting unit in the first region to the second semiconductor layer of the corresponding light emitting unit in the second region.

In some implementations, at least one of the first via structures includes a pair of holes disposed at ends of the at least one of the first via structures and a connection part connecting the pair of holes. In some implementations, the first region and the second region are spaced apart and the upper electrodes are spaced apart to shield spaces between the first region and the second region. According to some embodiments of the disclosed technology, it is possible to provide a light emitting diode array on a wafer level, which can be driven at a high voltage and can be mounted directly on a printed circuit board or the like. For example, since light emitting diodes of the light emitting diode array are connected in series by upper electrodes, a submount substrate is not required. Since the upper electrode can include an ohmic contact layer, it is not necessary to form a separate ohmic contact layer.

In addition, side surfaces of the light emitting diodes are formed to be inclined at a predetermined angle, so that it is possible to provide a flip-chip type light emitting diode array on a wafer level, which has improved reliability. Further, the side surfaces of the lower electrodes, first interlayer insulating layer, upper electrodes or second interlayer insulating layer are formed to be inclined at a predetermined angle, so that it is possible to prevent cracks from being produced in another layer formed on the respective layers.

Further, since the upper electrodes occupy a relatively large area, and also cover side surfaces of the light emitting diodes and most of the regions between the light emitting diodes, the upper electrodes can be used to reflect light. Thus, it is possible to reduce a loss of light generated in the regions between the light emitting diodes. Therefore, it is not necessary to additionally form a separate reflective metal layer for reflecting light, in addition to the upper electrodes.

Furthermore, the upper electrodes are made in the form of a plate or sheet having a wide area, thereby improve current distribution performance and decreasing a forward voltage at an identical current while using an identical number of light emitting diodes.

Moreover, the current diffusion performance of the light emitting diode may be improved by the appropriate disposition and form of the via holes, thereby improving the overall current diffusion performance of the light emitting diode array.

DESCRIPTION OF REFERENCE NUMERALS

Figure 1:
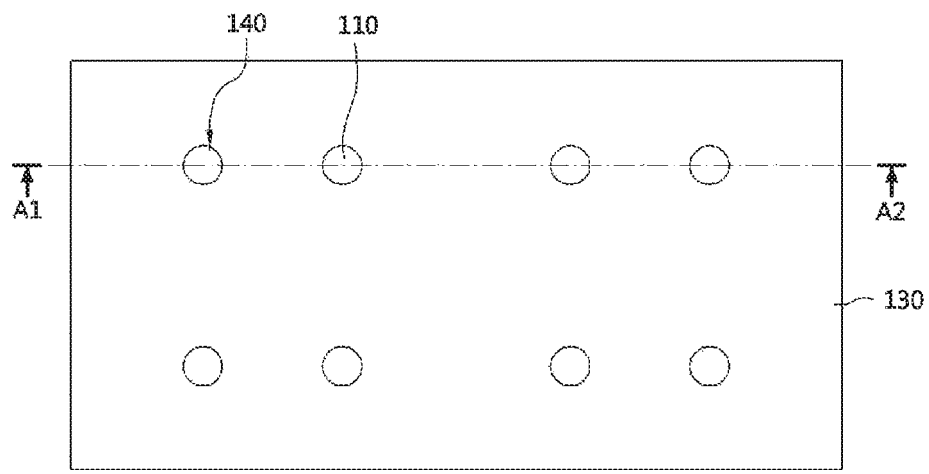
FIGS. 1 and 2 are plan and sectional views showing that a plurality of via hole structures are formed in a laminated structure according to an embodiment of the disclosed technology.

| | |
|---|---|
| 100: substrate | 111, 112, 113, 114: first semiconductor layer |
| 121, 122, 123, 124: active layer | 131, 132, 133, 134: second semiconductor layer |
| 140: via hole | 151: first lower electrode |
| 152: second lower electrode | 153: third lower electrode |
| 154: fourth lower electrode | 161: first cell region |
| 162: second cell region | 163: third cell region |
| 164: fourth cell region | 170: first interlayer insulating layer |
| 181: first upper electrode | 182: second upper electrode |
| 183: third upper electrode | 184: fourth upper electrode |
| 190: second interlayer insulating layer | |
| 210: first pad | 220: second pad |

DETAILED DESCRIPTION

In order to solve problems associated with the conventional array of light emitting diodes, there has been proposed a light emitting diode chip array in which an array including a plurality of light emitting diode chips is fabricated as a single package.

In Korean Patent Laid-Open Publication No. 2007-0035745, a plurality of lateral type light emitting diode chips are electrically connected on a single substrate through metal wiring formed using an air bridge process. According to this laid-open publication, there is an advantage in that a discrete packaging process is not required for each of the individual chips, and an array is formed on a wafer level. However, the air bridge connection structure results in weak durability and the lateral type causes a problem of deterioration of the light-emitting performance or heat-dissipating performance.

In U.S. Pat. No. 6,573,537, a plurality of flip-chip type light emitting diodes is formed on a single substrate. However, n- and p-electrodes of each of the light emitting diodes are exposed to the outside in a state where the n- and p-electrodes are separated from each other. Therefore, a wiring process of connecting a plurality of electrodes to one another should be added in order to use a single power source. To this end, a submount substrate is used. That is, the flip-chip type light emitting diodes should be mounted on a discrete submount substrate for wiring between the electrodes. At least two electrodes for electrical connection with another substrate should be formed on a back surface of the submount substrate. In the US patent, since the flip-chip type light emitting diodes are used, there is an advantage of improvement of the light-emitting performance and heat-dissipating performance. On the contrary, the use of the submount substrate causes increase in both fabrication costs and the thickness of a final product. In addition, there are further disadvantages of needs for an additional wiring process for the submount substrate and an additional process of mounting the submount substrate on a new substrate.

Korean Patent Laid-Open Publication No. 2008-0002161 discloses a configuration in which flip-chip type light emitting diodes are connected in series to one another. According to the laid-open patent publication, a packaging process on a chip basis is not required, and the use of the flip-chip type light emitting diodes exhibits an effect of improvement of the light-emitting performance and heat-dissipating performance. However, a discrete reflective layer is used in addition to wiring between n-type and p-type semiconductor layers, and interconnection wiring is used on the n-type electrode. Therefore, a plurality of patterned metal layers should be formed. To this end, various kinds of masks should be used, which becomes a problem. In addition, exfoliation or crack occurs due to a difference in thermal expansion coefficient between the n-electrode and the interconnection electrode, or the like, and therefore, there is a problem in that electrical contact therebetween is opened.

Hereinafter, various embodiments of the disclosed technology are provided to provide a novel light emitting diode array. The embodiments of the disclosed technology will be described in greater detail with reference to the accompanying drawings. The disclosed technology is not limited to the following embodiments but may be implemented in other forms.

In these embodiments, it will be understood that the term "first", "second", "third" or the like does not impose any limitation on components but are only used to distinguish the components.

Figure 2:
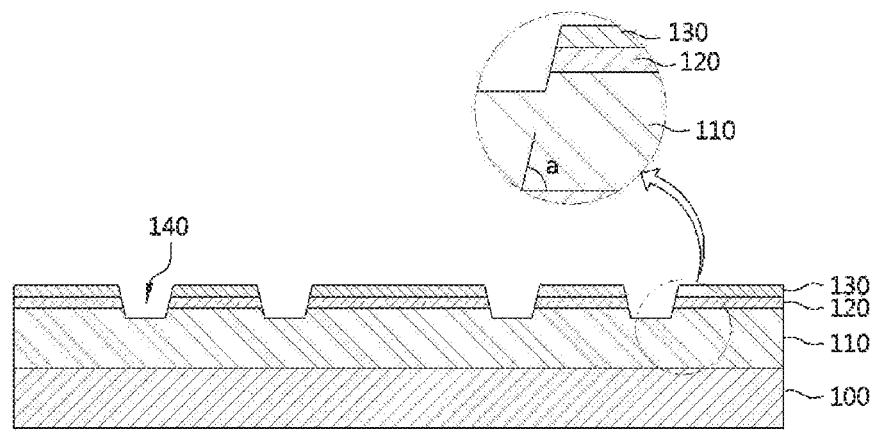

FIGS. 1 and 2 are plan and sectional views showing that a plurality of via hole structures are formed in a laminated structure according to an embodiment of the disclosed technology.

In particular, FIG. 2 is a sectional view taken along line A1-A2 in the plan view of FIG. 1.

Referring to FIGS. 1 and 2, a first semiconductor layer 110, an active layer 120 and a second semiconductor layer 130 are formed on a substrate 100, and via holes 140 are formed to allow a surface of the semiconductor layer 110 to be exposed therethrough.

The substrate 100 comprises a material such as sapphire, silicon carbide or GaN. Any material may be used for the substrate 100 as long as it can induce the growth of a thin film to be formed on the substrate 100. The first semiconductor layer 110 may have n-type conductivity. The active layer 120 may have a multiple quantum well structure, and the second semiconductor layer 130 is formed on the active layer 120. When the first semiconductor layer 110 has the n-type conductivity, the second semiconductor layer 130 has p-type conductivity. A buffer layer (not shown) may be further formed between the substrate 100 and the first semiconductor layer 110 so as to facilitate single crystalline growth of the first semiconductor layer 110.

Subsequently, selective etching is performed on the structure formed with the second semiconductor layer 130, and a plurality of via hole structures 140 are formed. Portions of the lower first semiconductor layer 110 are exposed through the via hole structures 140. The via hole structures 140 may be formed through a conventional etching process. For example, a photoresist is applied, and portions of the photoresist on regions where the via hole structures will be formed are then removed through a conventional patterning process to form a photoresist pattern. Thereafter, an etching process is performed by using the photoresist pattern as an etching mask. The etching process is performed until the portions of the first semiconductor layer 110 are exposed. After the etching process, the photoresist pattern remaining is removed.

The via hole structures 140 have a range of inclination angles (a) with respect to a surface of the substrate or a surface of the first semiconductor layer 110, which is exposed by performing the etching process. In particular, if the via hole structures 140 do not have a range of inclination angles, in a subsequent process of vapor-depositing a metal or applying an insulation material, cracks may be produced in a deposited metal layer or applied insulation material layer. Even though no crack is produced in a fabrication process, a problem of reliability is caused when a light emitting diode is used later. Heat and electrical stress generated when the light emitting diode emits light according to the supply of electrical power cause cracks to be produced in metal or insulation material layers formed on the via hole structures 140 beyond the particular inclination angle (a). The produced cracks cause malfunction of the light emitting diode and thus a decrease in luminance.

In some implementations, the via hole structures 140 have an angle of 10 to 60 degrees with respect to the surface of the substrate 100 or the surface of the first semiconductor layer 110.

If the inclination angle (a) is less than 10 degrees, the area of the active layer 120 is decreased due to an excessively low slope. The decrease in the area of the active layer causes a decrease in luminance. The substantial area of the second semiconductor layer 130 is much smaller than that of the first semiconductor layer 110. Generally, the semiconductor layer 130 has p-type conductivity, and the first semiconductor layer 110 has n-type conductivity. When the light emitting diode emits light, the first semiconductor layer 110 supplies electrons to the active layer 120, and the second semiconductor layer 130 supplies holes to the active layer 120. The improvement of light-emitting efficiency tends to rely on the uniform and smooth supply of holes rather than the supply of electrons. Thus, an excessive decrease in the area of the second semiconductor layer 130 may cause the light-emitting efficiency to be lowered. In a case where the inclination angle (a) exceeds 60 degrees, cracks may be produced in a subsequent metal or insulation material layer due to a high slope.

Meanwhile, the shape and number of the via hole structures 140 may be variously changed.

Figure 3:
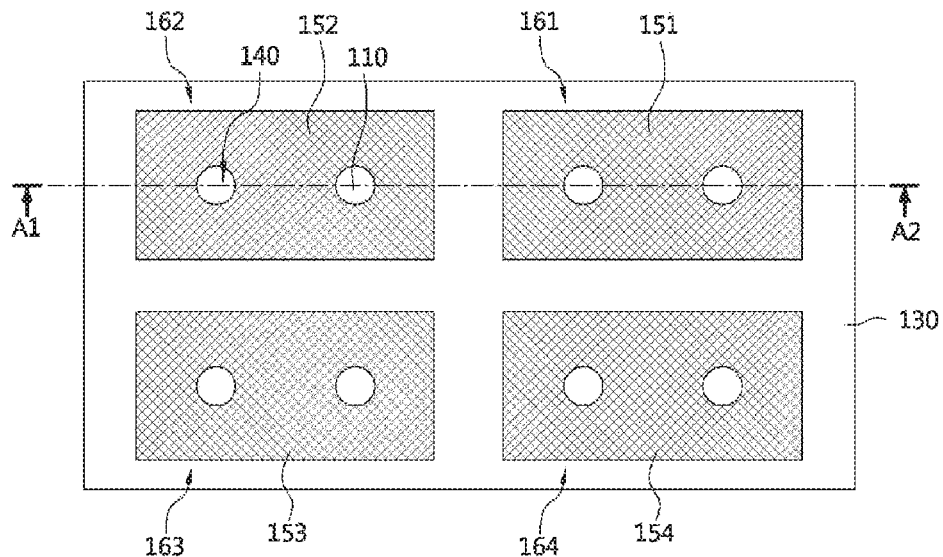
FIGS. 3 and 4 are plan and sectional views showing that lower electrodes are formed on a second semiconductor layer of FIG. 1.
Figure 4:
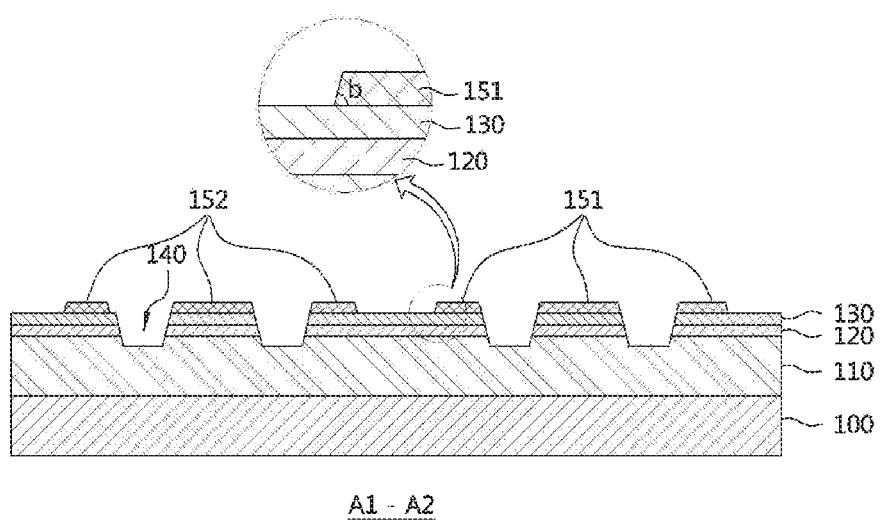

FIGS. 3 and 4 are plan and sectional views showing that lower electrodes are formed on the second semiconductor layer of FIG. 1. Particularly, FIG. 4 is a sectional view taken along line A1-A2 in the plan view of FIG. 3.

Referring to FIGS. 3 and 4, the lower electrodes 151, 152, 153 and 154 are formed in regions except the via hole structures 140, and a plurality of cell regions 161, 162, 163 and 164 may be defined by the formation of the lower electrodes 151, 152, 153 and 154. The lower electrodes 151, 152, 153 and 154 may be formed by employing a lift-off process used upon formation of a metal electrode. For example, a photoresist is formed in separating regions excluding the virtual cell regions 161, 162, 163 and 164 and in the regions in which the via hole structures 140 are formed, and a metal layer is formed through conventional thermal deposition or the like. Subsequently, the photoresist is removed, thereby forming the lower electrodes 151, 152, 153 and 154 on the second semiconductor layer 130. Any material may be employed for the lower electrodes 151, 152, 153 and 154 as long as it is a metallic material capable of being in ohmic contact with the second semiconductor layer 130. The lower electrodes 151, 152, 153 and 154 may comprise Ni, Cr or Ti, and may be composed of or include a composite metal layer of Ti/Al/Ni/Au.

The lower electrodes 151, 152, 153 and 154 may have thicknesses in a range of 2000 to 10000 Å. If the thicknesses of the lower electrodes 151, 152, 153 and 154 are less than 2000 Å, the reflection of light from the lower electrodes 151, 152, 153 and 154 toward the substrate 100 is not smooth, and there is a leakage of light transmitted through the lower electrodes 151, 152, 153 and 154 in the form of thin films. If the thicknesses of the lower electrodes 151, 152, 153 and 154 exceed 10000 Å, there is a problem in that it takes an excessive amount of time to perform a process of forming the lower electrodes, such as thermal deposition.

The lower electrodes 151, 152, 153 and 154 may have inclination angles (b) of 10 to 45 degrees with respect to the surface of the second semiconductor layer 130. If the inclination angles (b) of the lower electrodes 151, 152, 153 and 154 are less than 10 degrees, the efficiency of reflection of light is lowered due to a very gentle slope. In addition, there is a problem in that the uniformity of thickness on the surface of the lower electrode cannot be ensured due to a low inclination angle. If the inclination angles (b) of the lower electrodes 151, 152, 153 and 154 exceed 45 degrees, cracks may be produced in a subsequent layer due to a high inclination angle.

The adjustment of the inclination angles (b) of the lower electrodes 151, 152, 153 and 154, which are defined with respect to the surface of the second semiconductor layer 130, can be achieved by means of changes in disposition of the substrate and the angle of the substrate with respect to the advancing direction of metal atoms in a process such as thermal deposition.

In FIGS. 3 and 4, the regions in which the four lower electrodes 151, 152, 153 and 154 are formed define four cell regions 161, 162, 163 and 164, respectively. The second semiconductor layer 130 is exposed in spaces among the cell regions 161, 162, 163 and 164. The number of the cell regions 161, 162, 163 and 164 may correspond to that of light emitting diodes included in an array to be formed. Therefore, the number of the cell regions may be variously changed.

Although FIG. 4 shows that the lower electrode 151, 152, 153 or 154 is discrete in the same cell region 161, 162, 163 or 164, this is because FIG. 4 shows the sectional view taken along line A1-A2 traversing the via hole structures 140. As can be seen in FIG. 3, the lower electrode 151, 152, 153 or 154 formed in the same cell region is physically continuous. Thus, the lower electrode 151, 152, 153 or 154 formed in the same cell region is in an electrically short-circuited state even though the via hole structures 140 are formed therein.

Figure 5:
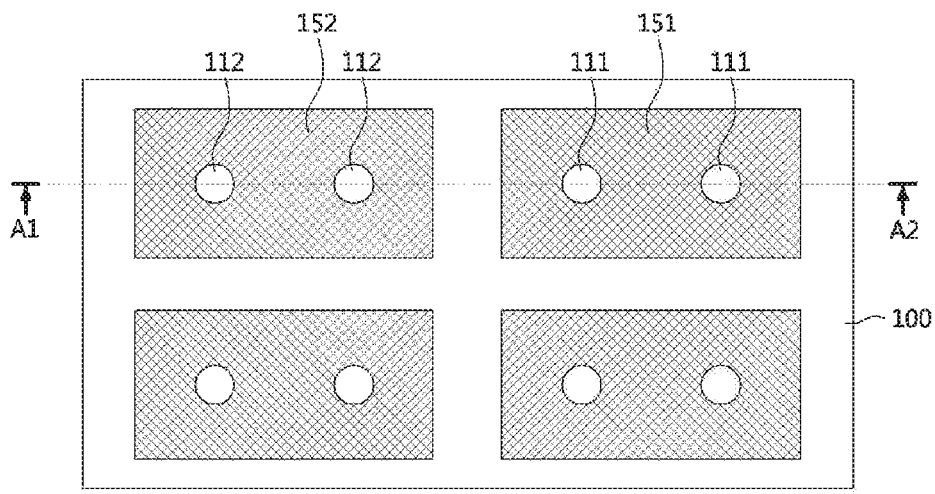
FIG. 5 is a plan view showing a state where cell regions are separated with respect to the structure of FIG. 3.
Figure 6:
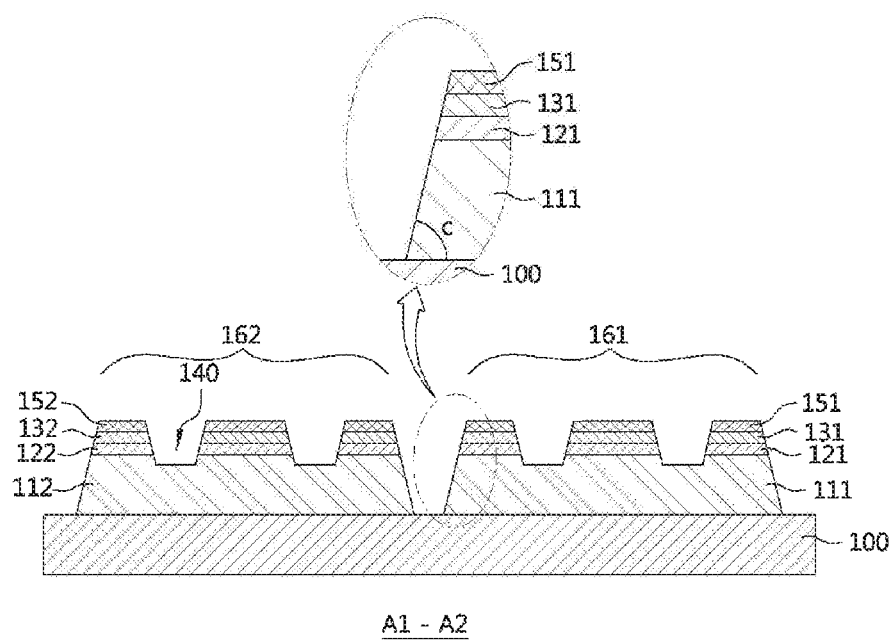
FIG. 6 is a sectional view taken along line A1-A2 in the plan view of FIG. 5.
Figure 7:
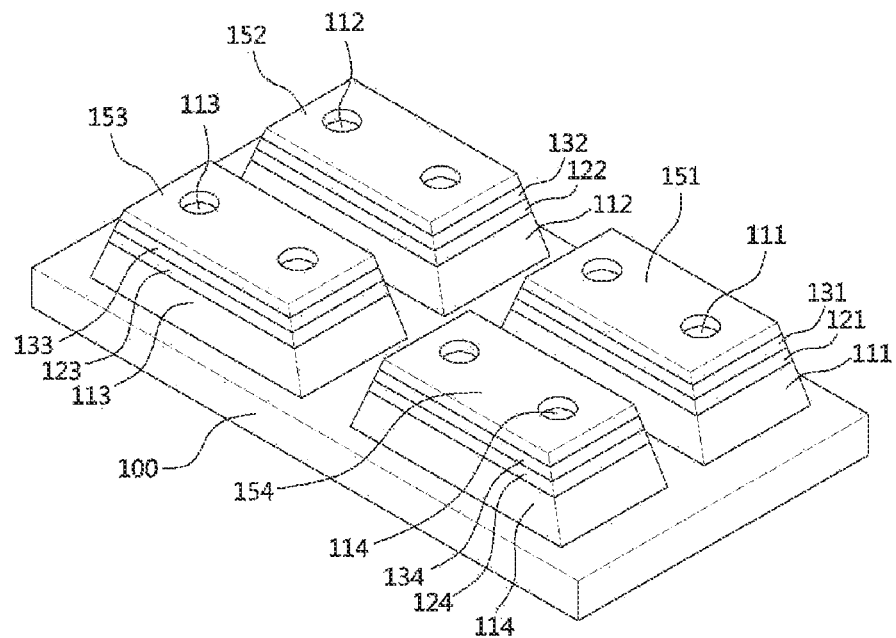
FIG. 7 is a perspective view of the structure in the plan view of FIG. 5.

FIG. 5 is a plan view showing a state where cell regions are separated with respect to the structure of FIG. 3, FIG. 6 is a sectional view taken along line A1-A2 in the plan view of FIG. 5, and FIG. 7 is a perspective view of the structure in the plan view of FIG. 5.

Referring to FIGS. 5, 6 and 7, mesa-etched regions are formed through mesa etching for the spaces among the four cell regions 161, 162, 163 and 164. The substrate 100 is exposed in the mesa-etched regions formed through the mesa etching. Thus, the four cell regions 161, 162, 163 and 164 are electrically completely separated from one another. If a buffer layer is interposed between the substrate 100 and the first semiconductor layer 110 in FIGS. 1 to 4, the buffer layer may remain even in the separation process of the cell regions 161, 162, 163 and 164. However, in order to completely separate the cell regions 161, 162, 163 and 164 from one another, the buffer layer between adjacent ones of the cell regions 161, 162, 163 and 164 may be removed through the mesa etching.

Side surfaces of the first semiconductor layer 110, the active layer 120, the second semiconductor layer 130 and the lower electrodes 151, 152, 153 and 154 are exposed on side surfaces of the mesa regions by means of the mesa etching. The exposed side surfaces may have inclination angles (c) of 10 to 60 degrees with respect to the surface of the substrate 100. The adjustment of the inclination angles (c) of the exposed side surfaces can be achieved by adjusting the angle of the substrate with respect to the advancing direction of an etchant.

If the inclination angles (c) of films exposed by means of the mesa etching are less than 10 degrees, a decrease in light-emitting area is caused due to a low inclination angle, and light efficiency may be lowered. If the inclination angle (c) exceeds 60 degrees, the thickness of a film formed later may be ununiform or cracks may be produced in the film due to a high inclination angle. This becomes a factor in deterioration of the reliability of a device.

The range of the inclination angles (c) of the films exposed through the mesa etching has influence on the reflection of light caused by a metal layer formed in a subsequent process. For example, the metal layer is formed on sidewalls of the films exposed through the mesa etching. If the inclination angle (c) is less than 10 degrees, light formed in the active layer is not reflected in a predetermined range with respect to the substrate but scattered. Even though the inclination angle (c) exceeds 60 degrees, the reflection of light is not progressed toward a predetermined region but scattered.

With the separation process between adjacent ones of the cell regions 161, 162, 163 and 164, first semiconductor layers 111, 112, 113 and 114, active layers 121, 122, 123 and 124, second semiconductor layers 131, 132, 133 and 134 and lower electrodes 151, 152, 153 and 154 are independently formed in the cell regions 161, 162, 163 and 164, respectively. Thus, the first lower electrode 151 is exposed in the first cell region 161, and the first semiconductor layer 111 is exposed through the via hole structures 140. The second lower electrode 152 is exposed in the second cell region 162, and the first semiconductor layer 112 is exposed through the via hole structures 140. Similarly, the third lower electrode 153 and the first semiconductor layer 113 are exposed in the third cell region 163, and the fourth lower electrode 154 and the first semiconductor layer 114 are exposed in the fourth cell region 164.

In some implementations of the disclosed technology, the light emitting diode refers to a structure in which the first semiconductor layer 111, 112, 113 or 114, the active layer 121, 122, 123 or 124 and the second semiconductor layer 131, 132, 133 or 134 are laminated, respectively. Thus, one light emitting diode is formed in one cell region. When the light emitting diode is modeled such that the first semiconductor layer 111, 112, 113 or 114 has n-type conductivity and the second semiconductor layer 131, 132, 133 or 134 has p-type conductivity, the lower electrode 151, 152, 153 or 154 formed on the second semiconductor layer 131, 132, 133 or 134 may be referred to as an anode electrode of the light emitting diode.

Figure 8:
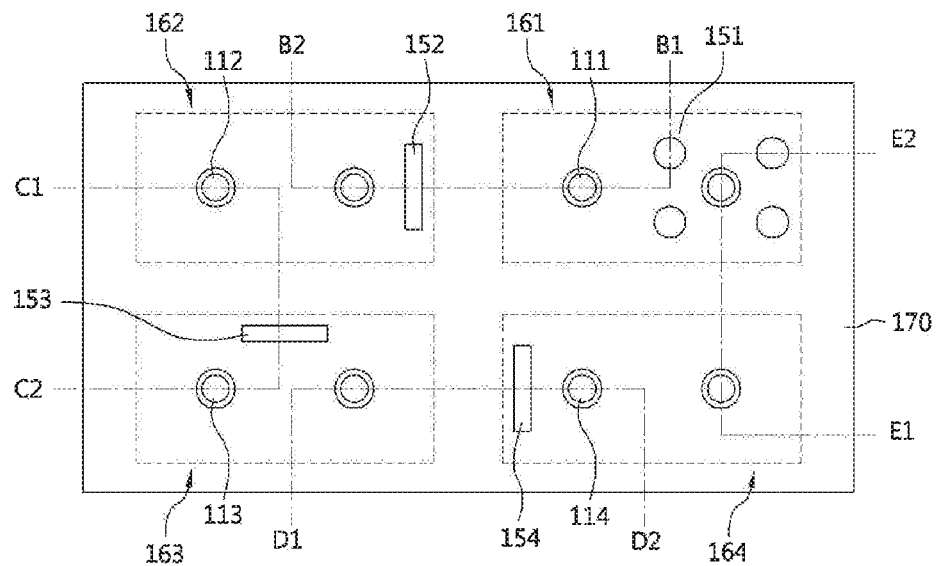
FIG. 8 is a plan view showing that a first interlayer insulating layer is formed on an entire surface of the structure of FIGS. 5 to 7, and portions of a first semiconductor layer and the lower electrodes are exposed in each of the cell regions.

FIG. 8 is a plan view showing that a first interlayer insulating layer is formed on an entire surface of the structure of FIGS. 5 to 7, and portions of a first semiconductor layer and the lower electrodes are exposed in each of the cell regions.

Figure 9:
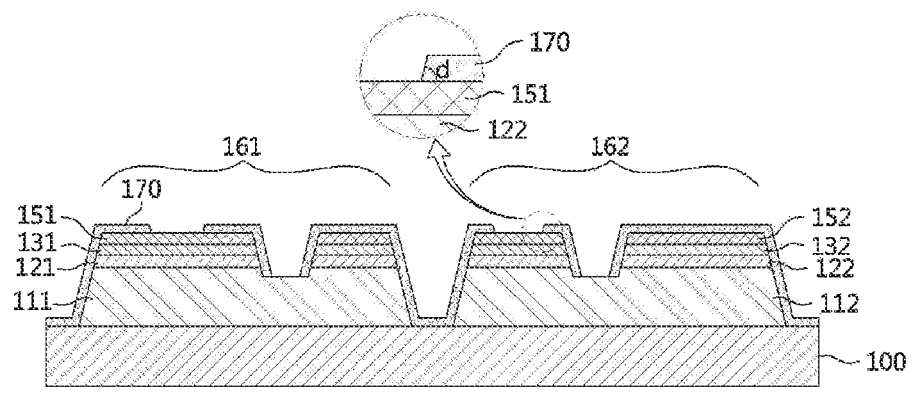
FIGS. 9 to 12 are sectional views taken along specific lines in the plan view of FIG. 8.
Figure 10:
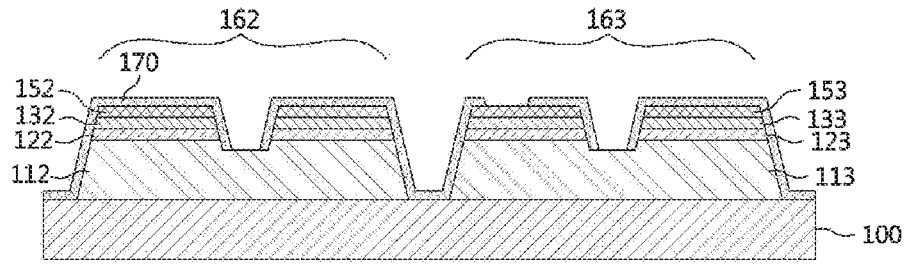
Figure 11:
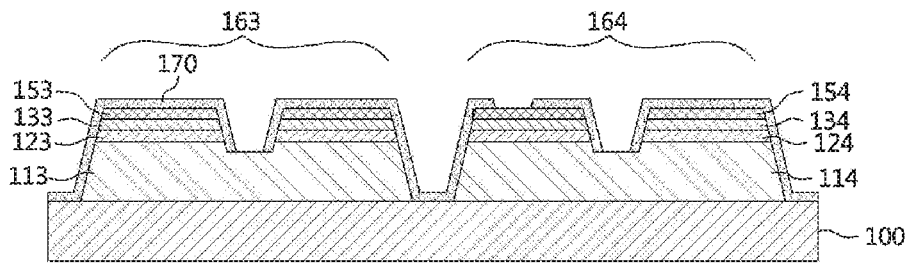
Figure 12:
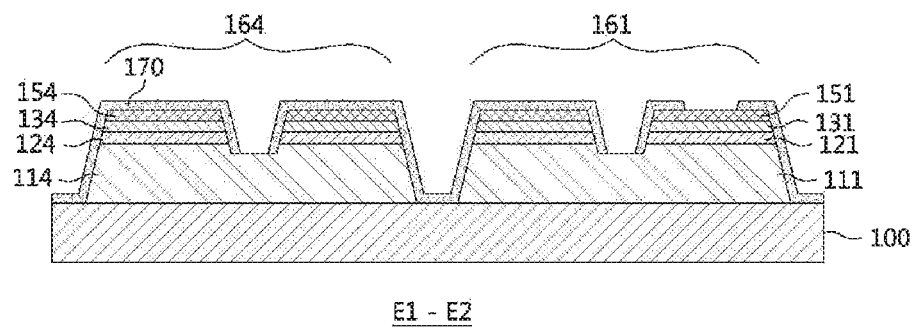

Moreover, FIGS. 9 to 12 are sectional views taken along specific lines in the plan view of FIG. 8. Particularly, FIG. 9 is a sectional view taken along line B1-B2 in the plan view of FIG. 8, FIG. 10 is a sectional view taken along line C1-C2 in the plan view of FIG. 8, FIG. 11 is a sectional view taken along line D1-D2 in the plan view of FIG. 8, and FIG. 12 is a sectional view taken along line E1-E2 in the plan view of FIG. 8.

First, a first interlayer insulating layer 170 is formed with respect to the structure of FIGS. 5 to 7. Moreover, portions of the lower electrodes 151, 152, 153 and 154 and of the first semiconductor layers 111, 112, 113 and 114 under the via hole structures are exposed by means of patterning.

For example, in the first cell region 161, two pre-formed via hole structures are opened so that portions of the first semiconductor layer 111 are exposed, and a portion of the first lower electrode 151 formed on the pre-formed second semiconductor layer 131 is exposed. In the second cell region 162, portions of the first semiconductor layer 112 are exposed through the pre-formed via hole structures, and a portion of the second lower electrode 152 is exposed by means of etching for a portion of the first interlayer insulating layer 170. In the third cell region 163, portions of the first semiconductor layer 113 are exposed through the via hole structures, and a portion of the third lower electrode 153 is exposed by means of etching for a portion of the first interlayer insulating layer 170. In the fourth cell region 164, portions of the first semiconductor layer 114 are exposed through the via hole structures, and a portion of the fourth lower electrode 154 is exposed by means of etching for a portion of the first interlayer insulating layer 170.

As a result, in FIGS. 8 to 12, the first interlayer insulating layer 170 is formed on the entire surface of the substrate, and the portions of the first semiconductor layers 111, 112, 113 and 114 under the via hole structures and the portions of the lower electrodes 151, 152, 153 and 154 on the second semiconductor layers 131, 132, 133 and 134 are exposed in each of the cell regions 161, 162, 163 and 164 by means of selective etching. The remaining region is shielded by the first interlayer insulating layer 170.

The first interlayer insulating layer 170 may be formed of or include an insulating material having a light transmittance. For example, the first interlayer insulating layer may comprise $SiO_2$.

Furthermore, the first interlayer insulating layer 170 may have a thickness of 2000 to 20000 Å.

If the thickness of the first interlayer insulating layer 170 is less than 2000 Å, it is difficult to secure an insulation property due to a small thickness. In particular, if the first interlayer insulating layer 170 is formed on the sidewalls of the mesa-etched regions or the via hole structures 140, the first interlayer insulating layer 170 has a certain slope, so that the insulation of the first interlayer insulating layer 170 may be broken down.

If the thickness of the first interlayer insulating layer 170 exceeds 20000 Å, it is difficult to perform selective etching on the first interlayer insulating layer 170. For example, portions of the lower electrodes and the first semiconductor layer should be exposed in the via hole structures 140. To this end, a process of applying the first interlayer insulating layer 170 to the entire surface and a selective etching process are performed. The application of a photoresist and patterning are performed for the selective etching process. Etching is performed for regions opened by a residual photoresist pattern. If the thickness of the first interlayer insulating layer 170 exceeds 20000 Å, the photoresist pattern to be used as an etching mask may also be removed in the process of selectively etching the first interlayer insulating layer 170. Therefore, the etching may be performed on an undesired portion, resulting in an error in the process.

The first interlayer insulating layer 170 may have an inclination angle (d) of 10 to 60 degrees with respect to the surface of the lower electrode exposed by the selective etching.

If the inclination angle d of the first interlayer insulating layer 170 is less than 10 degrees, the area of the exposed surface of the lower electrode decreases or the substantial thickness of the first interlayer insulating layer 170 decreases. Therefore, there is a problem in that it is difficult to secure an insulation property. That is, the first interlayer insulating layer 170 functions to electrically insulate the lower electrode from another conductive film formed thereon. Therefore, the first interlayer insulating layer 170 should have a sufficient thickness, and the lower electrode should be exposed with a certain area for the purpose of additional electrical connection. If the first interlayer insulating layer 170 has a very low slope, the exposed area of the lower electrode should be decreased to implement the first interlayer insulating layer 170 of a certain thickness. In a case where it is intended to secure the area of the exposed lower electrode beyond a predetermined value, the insulation of the first interlayer insulating layer 170 with the small thickness may be broken down due to a low slope.

If the inclination angle (d) of the first interlayer insulating layer 170 exceeds 60 degrees, there is a problem in that the quality of another film to be formed on the first interlayer insulating layer 170 may be deteriorated due to a large inclination angle.

The adjustment of the inclination angle of the first interlayer insulating layer 170 can be achieved by adjusting the angle of etching in a partial etching process for the first interlayer insulating layer 170 formed on the lower electrode.

Figure 13:
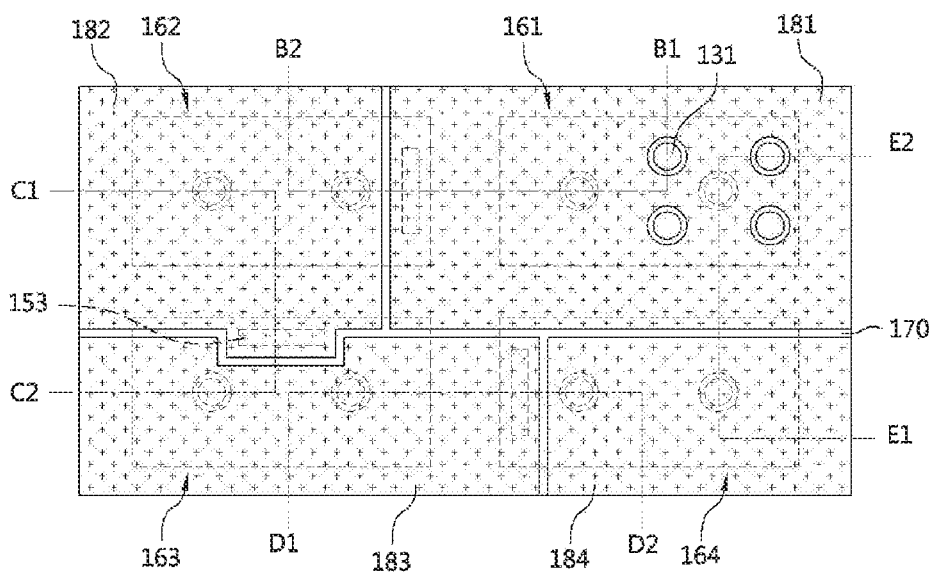
FIG. 13 is a plan view showing that upper electrodes are formed on the structure illustrated in FIGS. 8 to 12.
Figure 14:
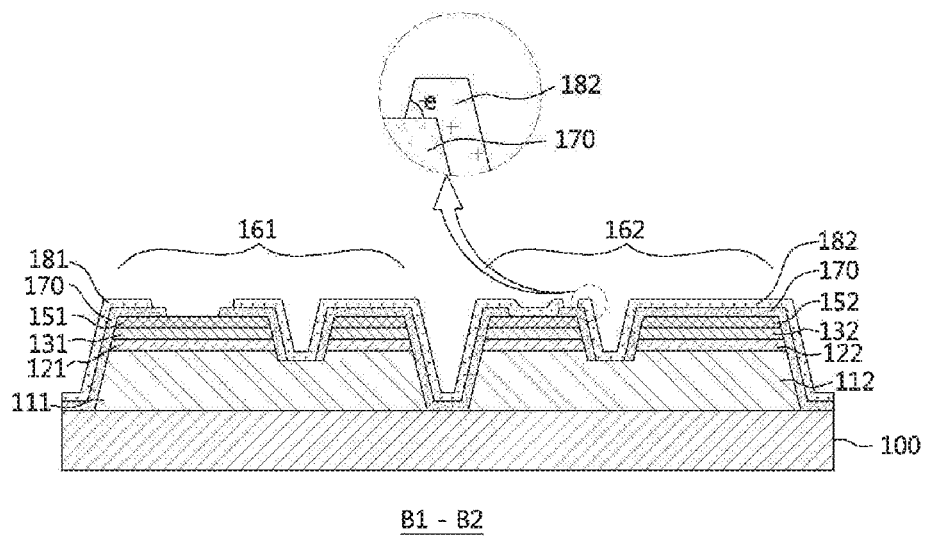
FIGS. 14 to 17 are sectional views taken along specific lines in the plan view of FIG. 13.
Figure 15:
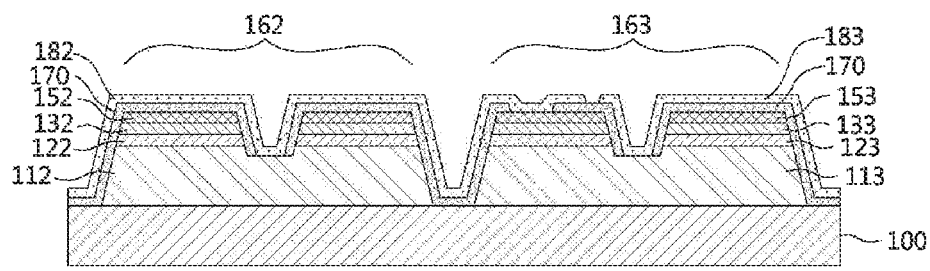
Figure 16:
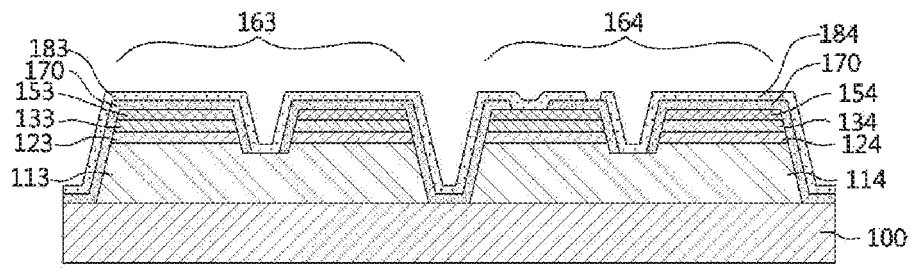
Figure 17:
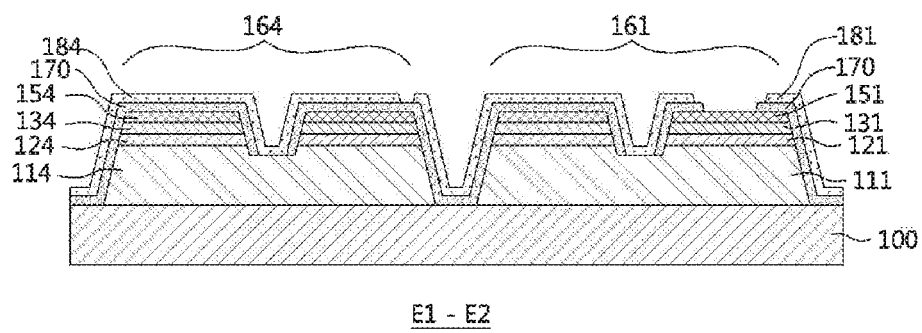

FIG. 13 is a plan view showing that upper electrodes are formed on the structure illustrated in FIGS. 8 to 12, and FIGS. 14 to 17 are sectional views taken along specific lines in the plan view of FIG. 13. Particularly, FIG. 14 is a sectional view taken along line B1-B2 in the plan view of FIG. 13, FIG. 15 is a sectional view taken along line C1-C2 in the plan view of FIG. 13, FIG. 16 is a sectional view taken along line D1-D2 in the plan view of FIG. 13, and FIG. 17 is a sectional view taken along line E1-E2 in the plan view of FIG. 13.

Referring to FIG. 13, upper electrodes 181, 182, 183 and 184 are formed. The upper electrodes 181, 182, 183 and 184 are formed as four discrete regions. For example, the first upper electrode 181 is formed over the first cell region 161 and a portion of the second cell region 162. The second upper electrode 182 is formed over a portion of the second cell region 162 and a portion of the third cell region 163. The third upper electrode 183 is formed over a portion of the third cell region 163 and a portion of the fourth cell region 164. The fourth upper electrode 184 is formed in a portion of the fourth cell region 164. Thus, each of the upper electrodes 181, 182, 183 and 184 is formed while shielding spaces between adjacent ones of the cell regions. The upper electrodes 181, 182, 183 and 184 may cover no less than 30%, even no less than 50%, or no less than 90% of the spaces between the adjacent cell regions. However, since the upper electrodes 181, 182, 183 and 184 are spaced apart from one another, the upper electrodes 181, 182, 183 and 184 cover less than 100% of regions between adjacent ones of light emitting diodes. The entire of the upper electrodes 181, 182, 183 and 184 may occupy no less than 30%, even no less than 50%, or no less than 90% of the entire area of the light emitting diode array. However, since the upper electrodes 181, 182, 183 and 184 are spaced apart from one another, they occupy less than 100% of the entire area of the light emitting diode array. Each of the upper electrodes 181, 182, 183 and 184 has the shape of a plate or sheet having a ratio of length and width ranging from 1:3 to 3:1. Further, at least one of the upper electrodes 181, 182, 183 and 184 has a length or width greater than that of a corresponding light emitting diode (cell region).

Referring to FIG. 14, the first upper electrode 181 is formed on the first interlayer insulating layer 170 in the first cell region 161, and is formed on portions of the first semiconductor layer 111 opened through the via hole structures. In addition, the first upper electrode 181 allows a portion of the first lower electrode 151 to be exposed in the first cell region 161 and is formed on a portion of the second lower electrode 152 exposed in the second cell region 162.

The second upper electrode 182 is formed on portions of the first semiconductor layer 112 exposed through the via hole structures in the second cell region 162 in a state in which the second upper electrode 182 is physically separated from the first upper electrode 181. In addition, the second upper electrode 182 is formed on the first interlayer insulating layer 170.

In FIG. 14, the first upper electrode 181 electrically connects the first semiconductor layer 111 in the first cell region 161 to the second semiconductor layer 132 in the second cell region 162. Despite of the presence of the via hole structures, the second lower electrode 152 in the second cell region 162 is entirely in an electrically short-circuited state in one cell region. Thus, the first semiconductor layer 111 in the first cell region 161 is electrically connected to the second semiconductor layer 132 in the second cell region 162 through the second lower electrode 152.

In FIG. 15, the second upper electrode 182 is formed on portions of the first semiconductor layer 112 exposed through the via hole structures in the second cell region 162, and is formed to extend to the third lower electrode 153 in the third cell region 163.

The third upper electrode 183 physically separated from the second upper electrode 182 is also formed on portions of the first semiconductor layer 113 exposed through the via hole structures in the third cell region 163.

In FIG. 15, the second upper electrode 182 is electrically connected to the portions of the first semiconductor layer 112 through the via hole structures in the second cell region 162, and is electrically connected to the third lower electrode 153 in the third cell region 163. Thus, the first semiconductor layer 112 in the second cell region 162 can maintain the same potential as the second semiconductor layer 133 in the third cell region 163.

Referring to FIG. 16, the third upper electrode 183 is formed on portions of the first semiconductor layer 113 exposed through the via hole structures in the third cell region 163, and is formed to extend to the fourth lower electrode 154 in the fourth cell region 164. Thus, the first semiconductor layer 113 in the third cell region 163 is electrically connected to the second semiconductor layer 134 in the fourth cell region 164.

The fourth upper electrode 184 physically separated from the third upper electrode 183 is electrically connected to the portions of the first semiconductor layer 114 exposed through the via hole structures in the fourth cell region 164.

Referring to FIG. 17, the fourth upper electrode 184 is formed on portions of the first semiconductor layer 114 exposed through the via hole structures in the fourth cell region 164. The first upper electrode 181 physically separated from the fourth upper electrode 184 is formed on portions of the first semiconductor layer 111 exposed through the via hole structures in the first cell region 161, and allows a portion of the first lower electrode 151 to be exposed in the first cell region 161.

The contents disclosed in FIGS. 13 to 17 will be summarized below. The first semiconductor layer 111 in the first cell region 161 and the second semiconductor layer 132 in the second cell region 162 establish the same potential through the first upper electrode 181. The first semiconductor layer 112 in the second cell region 162 and the second semiconductor layer 133 in the third cell region 163 establish the same potential through the second upper electrode 182. The first semiconductor layer 113 in the third cell region 163 establish the same potential as the second semiconductor layer 134 in the fourth cell region 164 through the third upper electrode 183. The first lower electrode 151 electrically connected to the second semiconductor layer 131 in the first cell region 161 is exposed.

Of course, the same potential is established by assuming ideal electrical connection in a state where resistances of the upper electrodes 181, 182, 183 and 184 and contact resistances between the upper electrodes 181, 182, 183 and 184 and the lower electrodes 151, 152, 153 and 154 are neglected. Thus, in the operation of an actual device, a voltage drop may be sometimes caused by resistance components of the upper electrodes 181, 182, 183 and 184 and the lower electrodes 151, 152, 153 and 154, which are kinds of metal wires.

The upper electrodes 181, 182, 183 and 184 may be formed of or include any of materials that can be in ohmic contact with the first semiconductor layers 111, 112, 113 and 114. In addition, any material may be used for the upper electrodes 181, 182, 183 and 184 as long as it is a material that can be in ohmic contact with the lower electrodes 151, 152, 153 and 154 made of or including a metallic material. Thus, the upper electrodes 181, 182, 183 and 184 may include, as an ohmic contact layer, a metal layer comprising Ni, Cr, Ti, Rh or Al; or a conductive oxide layer such as an ITO layer.

The upper electrodes 181, 182, 183 and 184 may include a reflective layer including Al, Ag, Rh or Pt in order to reflect light, which is generated from the active layers 121, 122, 123 and 124 in the respective cell regions 161, 162, 163 and 164, toward the substrate 100. In particular, the light generated from the respective active layers 121, 122, 123 and 124 is reflected from the lower electrodes 151, 152, 153 and 154 toward the substrate 100. In addition, light transmitted through the spaces between the adjacent ones of the cell regions 161, 162, 163 and 164 is reflected by the upper electrodes 181, 182, 183 and 184 shielding the spaces between the adjacent ones of the cell regions 161, 162, 163 and 164.

The thicknesses of the upper electrodes 181, 182, 183 and 184 may be in a range of 2000 to 10000 Å. If the thicknesses of the upper electrode 181, 182, 183 and 184 are less than 2000 Å, the reflection of the light from the upper electrodes 181, 182, 183 and 184 toward the substrate 100 is not smooth, and there is a leakage of light transmitted through the upper electrodes 181, 182, 183 and 184 in the form of thin films. If the thicknesses of the upper electrode 181, 182, 183 and 184 exceed 10000 Å, there is a problem in that it takes an excessive amount of time to form the upper electrodes by means of thermal deposition or the like.

Further, the upper electrodes 181, 182, 183 and 184 may have inclination angles (e) of 10 to 45 degrees with respect to the surface of the first interlayer insulating layer 170. If the inclination angles (e) of the upper electrodes 181, 182, 183 and 184 are less than 10 degrees, the efficiency of the reflection of light is lowered due to a very gentle slope. In addition, there is a problem in that the uniformity of thickness on the surface of the upper electrode cannot be secured due to a small inclination angle. If the inclination angles (e) of the upper electrodes 181, 182, 183 and 184 exceed 45 degrees, cracks may be produced in a subsequent layer due to a large inclination angle.

The adjustment of the inclination angles (e) of the upper electrodes 181, 182, 183 or 184, which are defined with respect to the surface of the first interlayer insulating layer 170, can be achieved by means of changes in disposition of the substrate and the angle of the substrate with respect to the advancing direction of metal atoms in a process such as thermal deposition.

If the first semiconductor layers 111, 112, 113 and 114 have n-type conductivity and the second semiconductor layers 131, 132, 133 and 134 have p-type conductivity, each of the upper electrodes may be modeled as a cathode electrode of the light emitting diode, and simultaneously as wiring for connecting the cathode electrode of the light emitting diode to the lower electrode that is an anode electrode of a light emitting diode formed in an adjacent cell region. That is, in the light emitting diode formed in the cell region, the upper electrode may be modeled to form a cathode electrode and simultaneously to be wiring for electrically connecting the cathode electrode of the light emitting diode to an anode electrode of a light emitting diode in an adjacent cell region.

Figure 18:
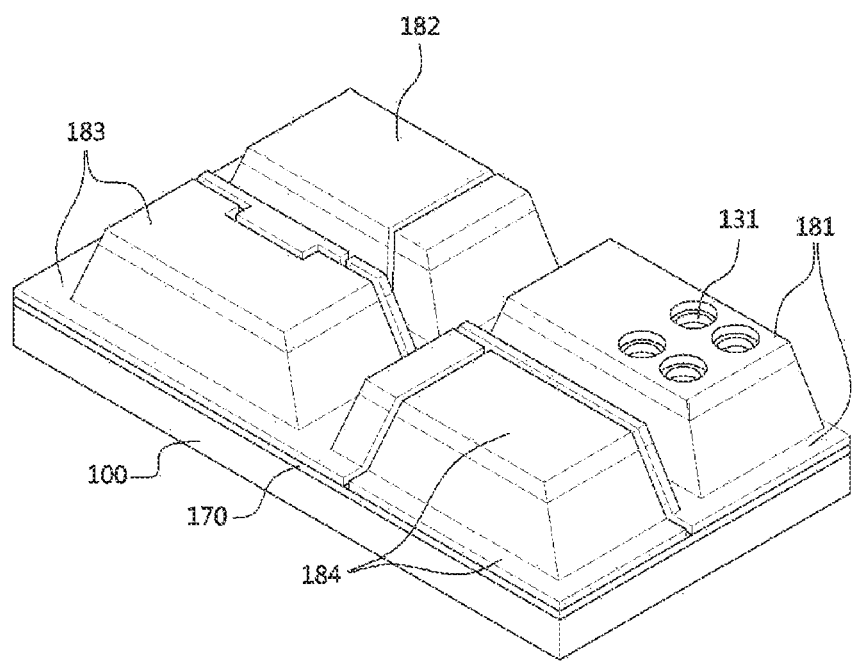
FIG. 18 is a perspective view of the structure in the plan view of FIG. 13.

FIG. 18 is a perspective view of the structure in the plan view of FIG. 13.

Referring to FIG. 18, the first to third upper electrodes 181 to 183 are formed over at least two cell regions. The space between adjacent cell regions is shielded. The upper electrodes allow light, which may be leaked between adjacent cell regions, to be reflected through the substrate, and are electrically connected to the first semiconductor layer in each cell region. The upper electrodes are electrically connected to the second semiconductor layer in an adjacent cell region.

Figure 19:
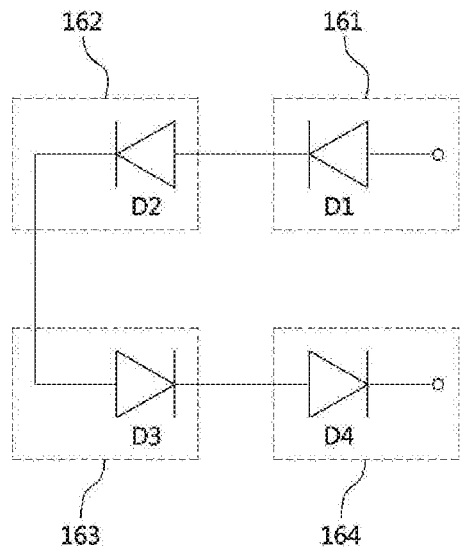
FIG. 19 is an equivalent circuit diagram obtained by modeling the structure of FIGS. 13 to 18 according to one embodiment of the disclosed technology.

FIG. 19 is an equivalent circuit diagram obtained by modeling the structure of FIGS. 13 to 18 according to an embodiment of the disclosed technology.

Referring to FIG. 19, four light emitting diodes D1, D2, D3 and D4 and a wiring relationship among the light emitting diodes are shown.

The first light emitting diode D1 is formed in the first cell region 161, the second light emitting diode D2 is formed in the second cell region 162, the third light emitting diode D3 is formed in the third cell region 163, and the fourth light emitting diode D4 is formed in the fourth cell region 164. The first semiconductor layers 111, 112, 113 and 114 in the cell regions 161, 162, 163 and 164 are modeled as n-type semiconductors, and the second semiconductor layers 131, 132, 133 and 134 are modeled as p-type semiconductors.

The first upper electrode 181 is electrically connected to the first semiconductor layer 111 in the first cell region 161 and extends to the second cell region 162 so as to be electrically connected to the second semiconductor layer 132 in the second cell region 162. Thus, the first upper electrode 181 is modeled as wiring for connecting a cathode terminal of the first light emitting diode D1 to an anode electrode of the second light emitting diode D2.

The second upper electrode 182 is modeled as wiring for connection between a cathode terminal of the second light emitting diode D2 and an anode terminal of the third light emitting diode D3. The third upper electrode 183 is modeled as wiring for connection between a cathode electrode of the third light emitting diode D3 and an anode terminal of the fourth light emitting diode D4. The fourth upper electrode 184 is modeled as wiring for forming a cathode electrode of the fourth light emitting diode D4.

Thus, the anode terminal of the first light emitting diode D1 and the cathode terminal of the fourth light emitting diode D4 are in an electrically opened state with respect to an external power source, and the other light emitting diodes D2 and D3 are electrically connected in series. In order to perform a light-emitting operation, the anode terminal of the first light emitting diode D1 should be connected to a positive power voltage V+, and the cathode terminal of the fourth light emitting diode D4 should be connected to a negative power voltage V−. Thus, the light emitting diode connected to the positive power voltage V+ can be referred to as an input light emitting diode, and the light emitting diode connected to the negative power voltage V− can be referred to as an output light emitting diode.

In the connection relationships among the plurality of light emitting diodes configured as described above, a cell region in which the cathode terminal connected to the negative power voltage V− is formed is provided with an upper electrode for shielding only a portion of the corresponding cell region. A cell region in which another connection relationship is established is provided with an upper electrode for making a shield between cell regions electrically connected to each other.

Figure 20:
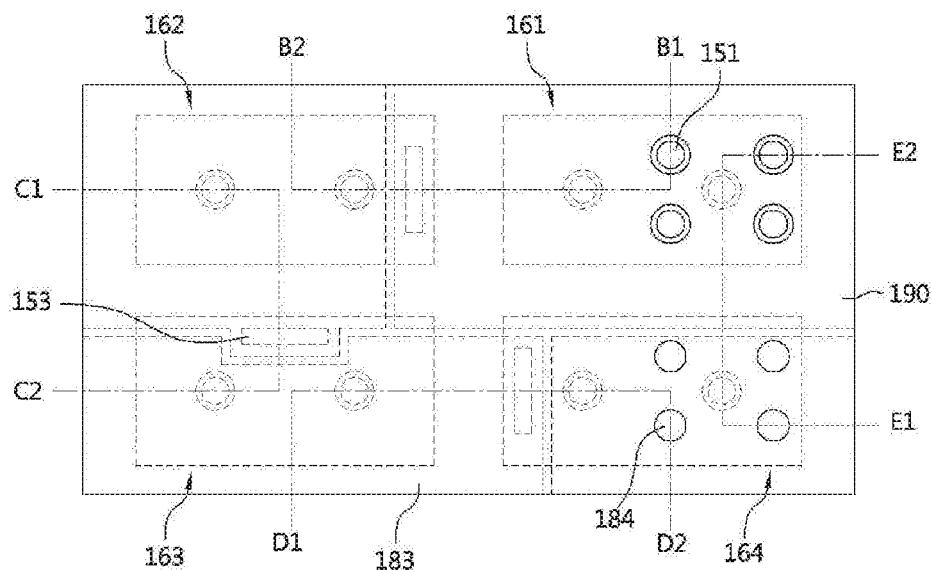
FIG. 20 is a plan view showing that a second interlayer insulating layer is applied on an entire surface of the structure of FIG. 13, a portion of a first electrode in a first cell region is exposed, and a portion of a fourth lower electrode in a fourth cell region is exposed.

FIG. 20 is a plan view showing that a second interlayer insulating layer is applied on an entire surface of the structure of FIG. 13, a portion of the first electrode in the first cell region is exposed, and a portion of the fourth lower electrode in the fourth cell region is exposed.

Referring to FIG. 20, with a second interlayer insulating layer 190, the upper electrodes are shielded, and a portion of the first lower electrode 151 and a portion of the fourth upper electrode 184 are exposed. This means that, in FIG. 19, only the anode terminal of the first light emitting diode D1 is exposed and only the cathode terminal of the fourth light emitting diode D4 is exposed.

Figure 21:
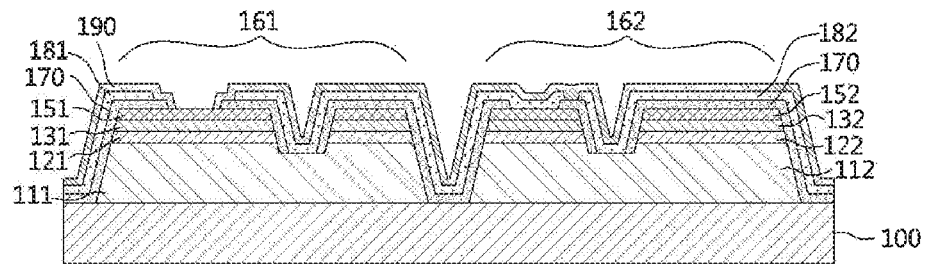
FIGS. 21 to 24 are sectional views taken along specific lines in the plan view of FIG. 20.
Figure 22:
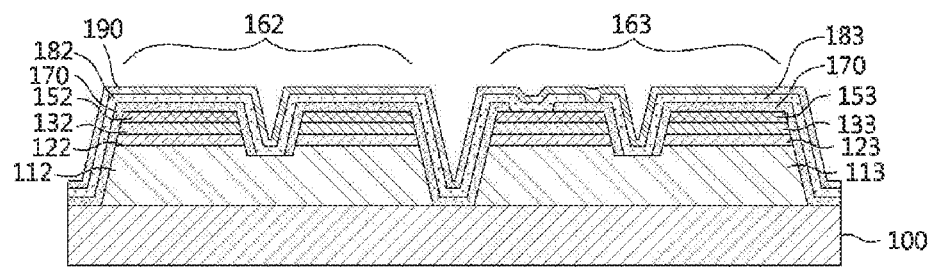
Figure 23:
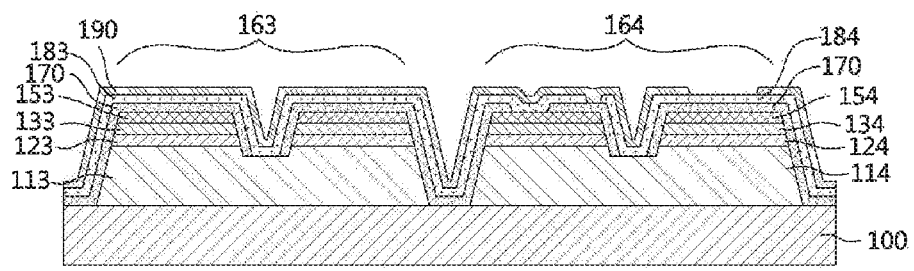
Figure 24:
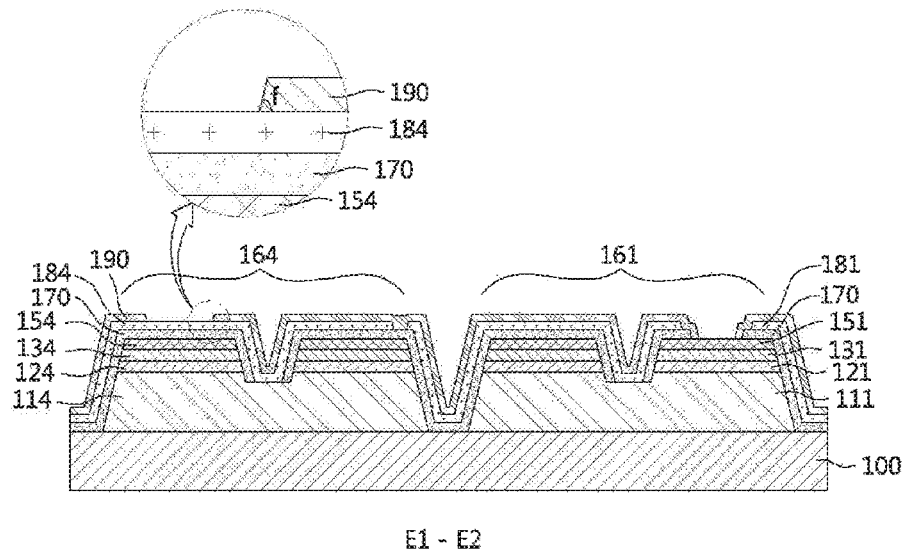

FIG. 21 is a sectional view taken along line B1-B2 in the plan view of FIG. 20, FIG. 22 is a sectional view taken along line C1-C2 in the plan view of FIG. 20, FIG. 23 is a sectional view taken along line D1-D2 in the plan view of FIG. 20, and FIG. 24 is a sectional view taken along line E1-E2 in the plan view of FIG. 20.

Referring to FIG. 21, in the first cell region 161, portions of the first lower electrode 151 electrically connected to the second semiconductor layer 131 are opened. The remaining portions in the first cell region are covered with the second interlayer insulating layer 190 that is also over the second cell region 162.

Referring to FIG. 22, the second and third cell regions 162 and 163 are completely covered with the second interlayer insulating layer 190.

Referring to FIGS. 23 and 24, portions of the fourth upper electrode 184 in the fourth cell region 164 are exposed, and portions of the first lower electrode 151 in the first cell region 161 are exposed.

The exposure of the fourth upper electrode 184 and the first lower electrode 151 is performed by selective etching for the second interlayer insulating layer 190.

The second interlayer insulating layer 190 is selected from an insulation material capable of protecting an underlying film from an external environment. In particular, the second interlayer insulating layer may comprise SiN or the like that has an insulation property and can block a change in temperature or humidity.

The thickness of the second interlayer insulating layer 190 may be in a predetermined range. For example, if the second interlayer insulating layer 190 comprises SiN, the second interlayer insulating layer 190 may have a thickness of 2000 to 20000 Å.

If the thickness of the second interlayer insulating layer 190 is less than 2000 Å, it is difficult to secure an insulation property due to a small thickness. In addition, there is a problem with protection of an underlying layer against penetration of external moisture or chemical due to the small thickness.

If the thickness of the second interlayer insulating layer 190 exceeds 20000 Å, it is difficult to perform selective etching on the second interlayer insulating layer 190 by means of formation of a photoresist pattern. That is, the photoresist pattern serves as an etching mask in the etching process, and the photoresist pattern is also etched along with the selective etching of the second interlayer insulating layer 190 due to the excessive thickness of the second interlayer insulating layer 190. If the thickness of the second interlayer insulating layer 190 is excessive, the photoresist pattern may be removed before the selective etching of the second interlayer insulating layer 190 is completed, resulting in a problem of etching performed at an undesired position.

The second interlayer insulating layer 190 may have an inclination angle (f) of 10 to 60 degrees with respect to the surface of the fourth upper electrode 184 or first lower electrode 151 which is exposed therebelow.

If the inclination angle (f) of the second interlayer insulating layer 190 is less than 10 degrees, the substantial area of the fourth upper electrode 184 or first lower electrode 151 that has been exposed decreases. If the area of the exposed portion is increased to secure the substantial area, there is a problem in that an insulation property cannot be secured due to a small inclination angle.

If the inclination angle (f) of the second interlayer insulating layer 190 exceeds 60 degrees, the quality of another layer to be formed on the second interlayer insulating layer 190 may be deteriorated due to a steep profile or slope, or cracks may be produced in the layer. In addition, in a light-emitting operation according to continuous supply of power, properties of the light emitting diode are deteriorated.

Figure 25:
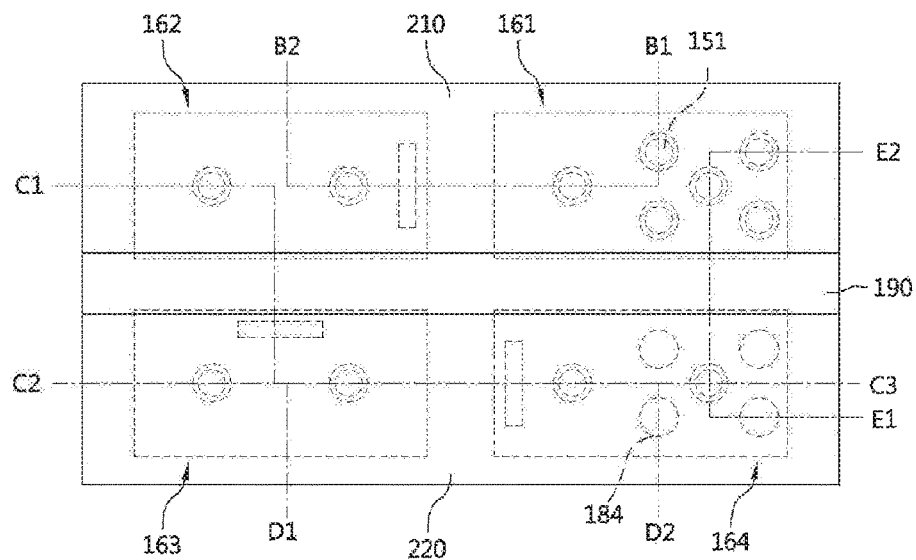
FIG. 25 is a plan view showing that first and second pads are formed in the structure of FIG. 20.

FIG. 25 is a plan view showing that first and second pads are formed in the structure of FIG. 20.

Referring to FIG. 25, the first pad 210 may be formed over the first and second cell regions 161 and 162. Accordingly, the first pad 210 can be electrically connected to the first lower electrode 151 in the first cell region 161, which is exposed in FIG. 20.

Moreover, the second pad 220 is formed to be spaced apart from the first pad 210 at a predetermined distance, and may be formed over the third and fourth cell regions 163 and 164. The second pad 220 is electrically connected to the fourth upper electrode 184 in the fourth cell region 164, which is exposed in FIG. 20.

Figure 26:
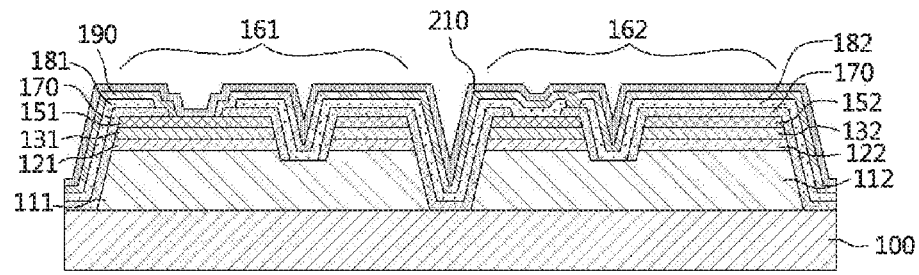
FIGS. 26 to 29 are sectional views taken along specific lines in the plan view of FIG. 25.
Figure 27:
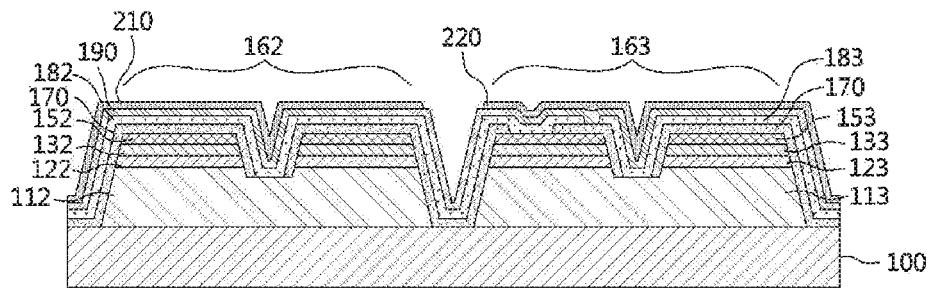
Figure 28:
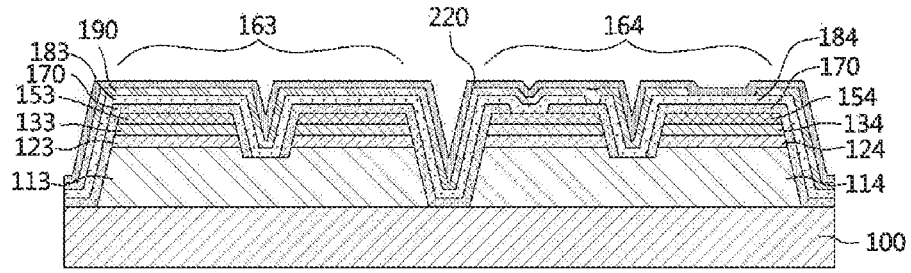
Figure 29:
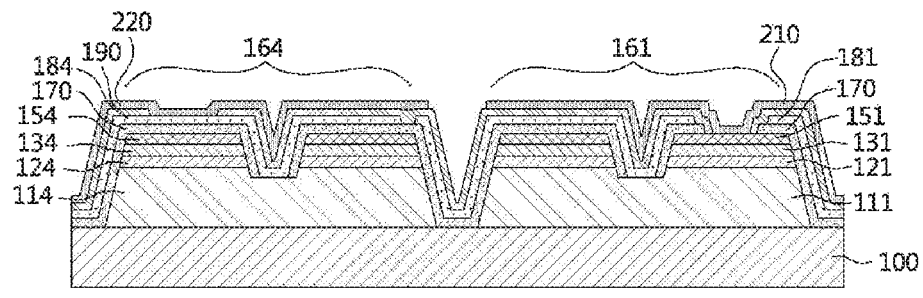

FIG. 26 is a sectional view taken along line B1-B2 in the plan view of FIG. 25, FIG. 27 is a sectional view taken along line C1-C2 in the plan view of FIG. 25, FIG. 28 is a sectional view taken along line D1-D2 in the plan view of FIG. 25, and FIG. 29 is a sectional view taken along line E1-E2 in the plan view of FIG. 25.

Referring to FIG. 26, the first pad 210 is formed over the first and second cell regions 161 and 162. The first pad 210 is formed on the first lower electrode 151 exposed in the first cell region 161, and on the second interlayer insulating layer 190 in the other cell regions. Thus, the first pad 210 is electrically connected to the second semiconductor layer 131 in the first cell region 161 through the first lower electrode 151.

Referring to FIG. 27, the first pad 210 is formed in the second cell region 162, and the second pad 220 is formed to be spaced apart from the first pad 210 in the third cell region 163. The electrical contact of the first or second pad 210 or 220 with the lower or upper electrode is blocked in the second and third cell regions 162 and 163.

Referring to FIG. 28, the second pad 220 is formed over the third and fourth cell regions 163 and 164. In some implementations, the second pad 220 is electrically connected to the fourth upper electrode 184 opened in the fourth cell region 164. Thus, the second pad 220 is electrically connected to the first semiconductor layer 114 in the fourth cell region 164.

Referring to FIG. 29, the second pad 220 is formed in the fourth cell region 164, and the first pad 210 is formed to be spaced apart from the second pad 220 in the first cell region 161. The first pad 210 is formed on the first lower electrode 151 in the first cell region 161 and electrically connected to the second semiconductor layer 131.

Figure 30:
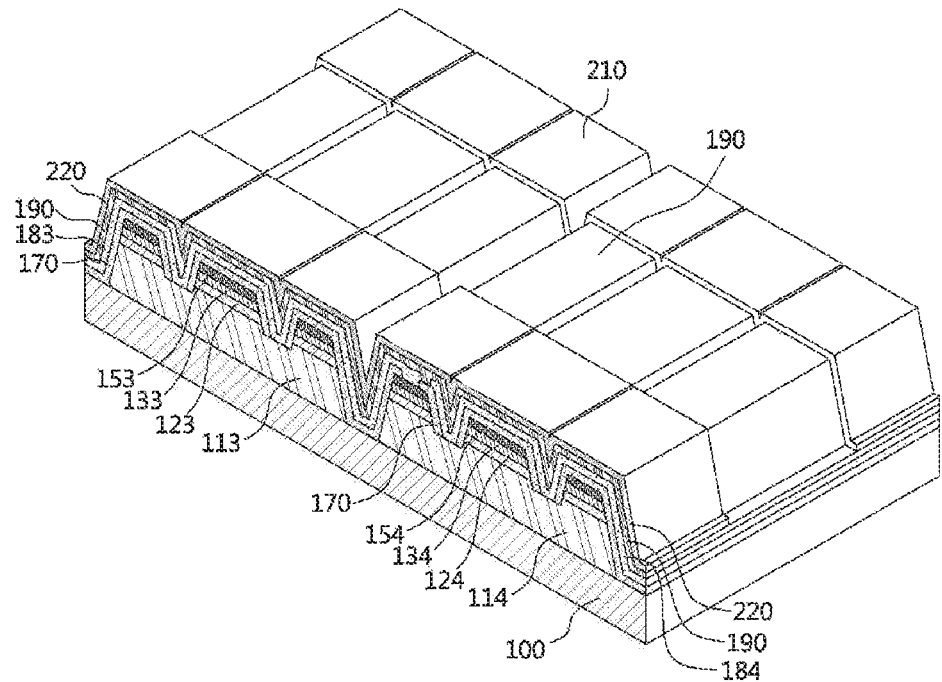
FIG. 30 is a perspective view taken along line C2-C3 in the plan view of FIG. 25.

FIG. 30 is a perspective view taken along line C2-C3 in the plan view of FIG. 25.

Referring to FIG. 30, the first semiconductor layer 113 in the third cell region 163 is electrically connected to the third upper electrode 183. The third upper electrode 183 shields the space between the third and fourth cell regions 163 and 164 and is electrically connected to the fourth lower electrode 154 in the fourth cell region 164. The first and second pads 210 and 220 are spaced apart from each other and formed on the second interlayer insulating layer 190. Of course, as described above, the first pad 210 is electrically connected to the second semiconductor layer 131 in the first cell region 161, and the second pad 220 is electrically connected to the first semiconductor layer 111 in the fourth cell region 164.

Each of the first and second pads 210 and 220 may have a first layer comprising Ti, Cr or Ni and a second layer comprising Al, Cu, Ag or Au formed thereon. The first and second pads 210 and 220 may be formed using a lift-off process. They may be formed by forming a double- or single-layered metal film, forming a pattern through a conventional photolithography process, and then performing dry or wet etching using the pattern as an etching mask. However, an etchant used in the dry or wet etching may vary depending on the material of metal to be etched.

Accordingly, the first and second pads 210 and 220 can be simultaneously formed in one process.

A pad barrier layer (not shown) made of or including a conductive material may be formed on the first pad 210 or second pad 220. The pad barrier layer is provided to prevent diffusion of metal, which may occur in a bonding or soldering process for the pads 210 and 220. For example, in the bonding or soldering process, tin atoms contained in a bonding metal or soldering material are diffused into the pads 210 and 220, thereby preventing an increase in resistivity of the pads. To this end, the pad barrier layer may be configured with a layer of Cr, Ni, Ti, W, TiW, Mo, or Pt or a composite thereof.

Referring to the modeling of FIG. 19, the first semiconductor layers 111, 112, 113 and 114 in the respective cell regions are modeled as n-type semiconductors, and the second semiconductor layers 131, 132, 133 and 134 in the respective cell regions are modeled as p-type semiconductors. The first lower electrode 151 formed on the second semiconductor layer 131 in the first cell region 161 is modeled as the anode electrode of the first light emitting diode D1. Thus, the first pad 210 can be modeled as wiring connected to the anode electrode of the first light emitting diode D1. The fourth upper electrode 184 electrically connected to the first semiconductor layer 114 in the fourth cell region 164 is modeled as the cathode electrode of the fourth light emitting diode D4. Thus, the second pad 220 can be modeled as wiring connected to the cathode electrode of the fourth light emitting diode D4.

Accordingly, an array structure in which the four light emitting diodes D1 to D4 are connected in series formed, and electrical connection thereof to the outside is achieved through the two pads 210 and 220 formed on the single substrate 100.

Referring to FIG. 19, the first lower electrode 152 of the first light emitting diode D1 connected to the positive power voltage V+ is electrically connected to the first pad 210, and the fourth upper electrode 184 of the fourth light emitting diode D4 connected to the negative power voltage V− is electrically connected to the second pad 220.

In some implementations of the disclosed technology, there is shown that four light emitting diodes are formed while being separated from one another and an anode terminal of one of the light emitting diodes is electrically connected to a cathode terminal of another of the light emitting diodes through the lower and upper electrodes. However, the four light emitting diodes in this embodiment are merely an example, and various numbers of light emitting diodes may be formed.

Figure 31:
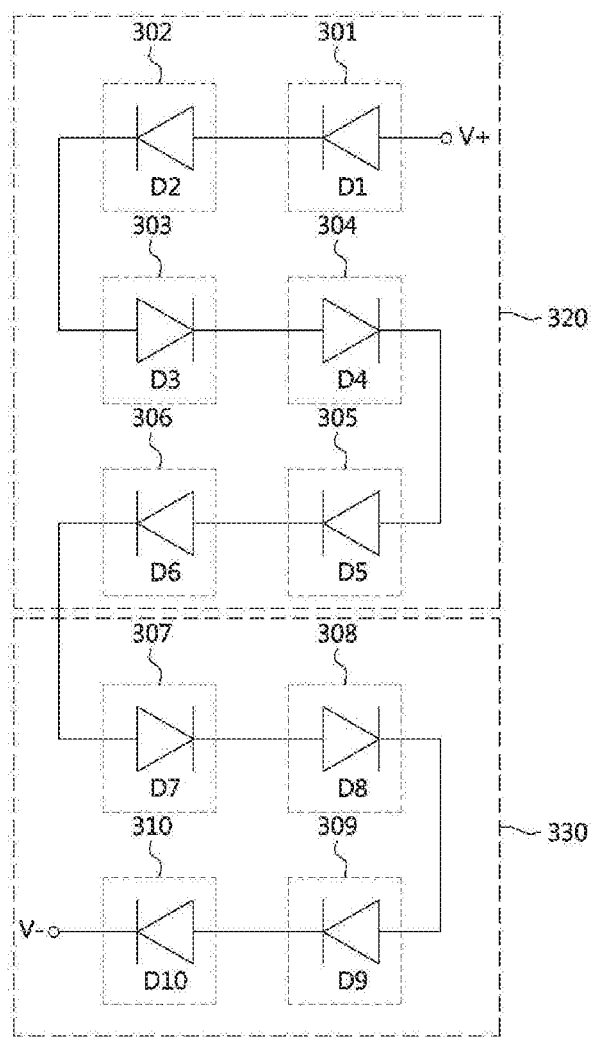
FIG. 31 is a circuit diagram obtained by modeling a connection of ten light emitting diodes in series according to an embodiment of the disclosed technology.

FIG. 31 is a circuit diagram obtained by modeling a connection of ten light emitting diodes in series according to an embodiment of the disclosed technology.

Referring to FIG. 31, ten cell regions 301 to 310 are defined using the process shown in FIG. 5. A first semiconductor layer, an active layer, a second semiconductor layer and a lower electrode in each of the cell regions 301 to 310 are separated from those in other cell regions. The respective lower electrodes are formed on the second semiconductor layers so as to form anode electrodes of light emitting diodes D1 to D10.

Subsequently, a first interlayer insulating layer and upper electrodes are formed using the processes shown in FIGS. 6 to 17. The formed upper electrodes shield the space between adjacent cell regions, and serve as wiring for achieving electrical connection between anode electrodes of adjacent light emitting diodes.

Furthermore, a second interlayer insulating layer is formed using the processes shown in FIGS. 20 to 29. The lower electrode of the first light emitting diode D1 that is the input light emitting diode connected to a positive power voltage V+ on a current path is exposed, and the upper electrode of the tenth light emitting diode D10 that is an output light emitting diode connected to a negative power voltage V− on the current path is opened. Then, a first pad 320 is formed and connected to the anode terminal of the first light emitting diode D1, and a second pad 330 is formed and connected to a cathode terminal of the tenth light emitting diode D10.

The other light emitting diodes are connected in series or parallel so as to form an array.

Figure 32:
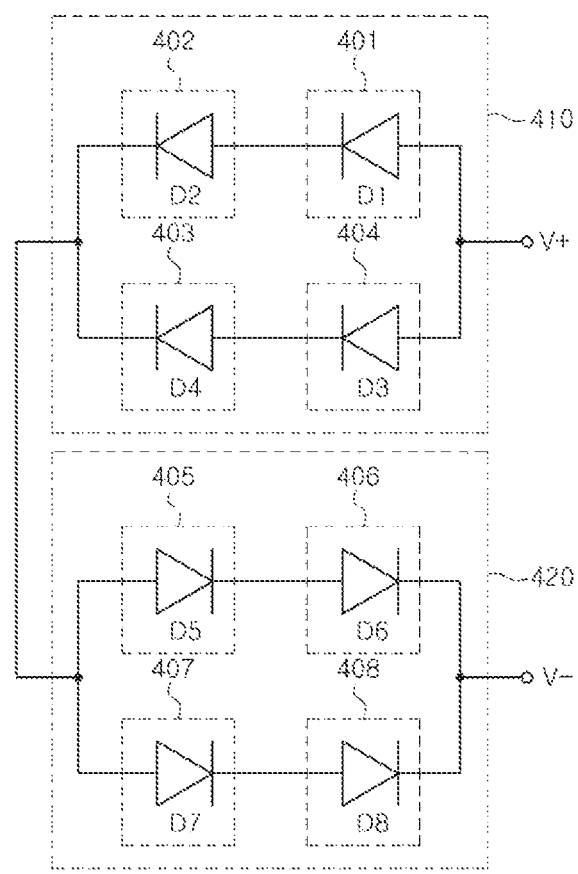
FIG. 32 is a circuit diagram obtained by modeling an array having light emitting diodes connected in series/parallel according to an embodiment of the disclosed technology.

FIG. 32 is a circuit diagram obtained by modeling an array having light emitting diodes connected in series or parallel according to an embodiment of the disclosed technology.

Referring to FIG. 32, a plurality of light emitting diodes D1 to D8 are connected in series and/or in parallel to one another. The light emitting diodes D1 to D8 are formed independently of one another through the definitions of cell regions 401 to 408. As described above, an anode electrode of each of the light emitting diode D1 to D8 is formed through a lower electrode. Wiring between a cathode electrode of each of the light emitting diodes D1 to D8 and the anode electrode of an adjacent light emitting diode is made by forming an upper electrode and performing an appropriate wiring process. However, the lower electrode is formed on a second semiconductor layer, and the upper electrode is formed to shield the space between adjacent cell regions.

Finally, a first pad 410 supplied with a positive power voltage V+ is electrically connected to the lower electrode formed on the second semiconductor layer of the first or third light emitting diode D1 or D3, and a second pad 420 supplied with a negative power voltage V− is electrically connected to the upper electrode that is a cathode electrode of the sixth or eighth light emitting diode D6 or D8.

Thus, in FIG. 32, the input light emitting diode corresponds to the first and third light emitting diodes D1 and D3, and the output light emitting diode corresponds to the sixth and eighth light emitting diodes D6 and D8.

According to some implementations of the disclosed technology described above, light generated in the active layer of each of the light emitting diodes is reflected from the lower and upper electrodes toward the substrate, and the flip-chip type light emitting diodes are electrically connected through wiring of the upper electrodes on a single substrate. The upper electrode is shielded from the outside through the second interlayer insulating layer. The first pad supplied with a positive power voltage is electrically connected to a lower electrode of a light emitting diode connected most closely to the positive power voltage. The second pad supplied with a negative power voltage is electrically connected to an upper electrode of a light emitting diode connected most closely to the negative power voltage.

Thus, it is possible to solve inconvenience in a process of mounting a plurality of flip-chip type light emitting diodes on a submount substrate and implementing two terminals to an external power source through wiring arranged on the submount substrate. In addition, the space between adjacent cell regions can be shielded by the upper electrode, thereby maximizing the reflection of light toward the substrate.

Further, the second interlayer insulating layer protects a laminated structure, which is arranged between the substrate and the second interlayer insulating layer, from external temperature or humidity and the like. Thus, it is possible to implement a structure that can be directly mounted on a substrate without intervention of any separate packaging means.

In particular, since a plurality of flip-chip type light emitting diodes are implemented on a single substrate, there is an advantage in that a commercial power source can be directly used while excluding a voltage drop, a conversion of voltage level or a conversion of waveform for the commercial power source.

Figure 33:
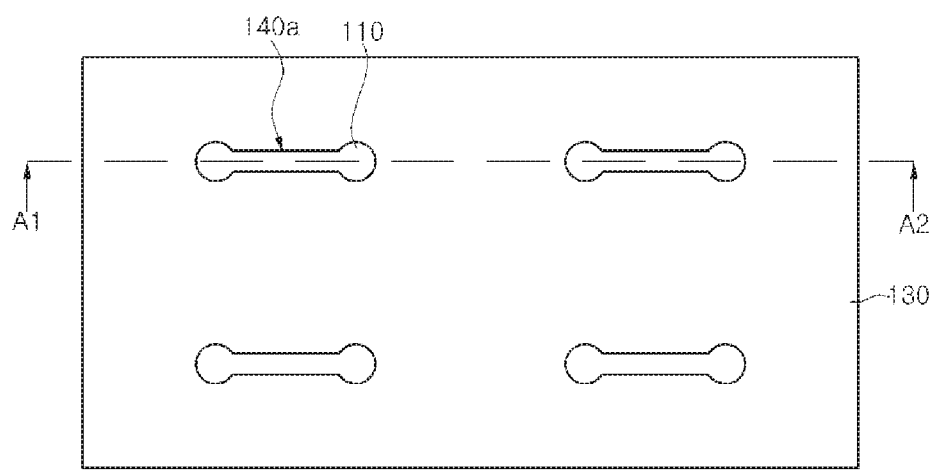
FIGS. 33 and 34 are a plan view and a sectional view showing that first via holes are formed in a plurality of laminated structures according to an embodiment of the present disclosure.
Figure 34:
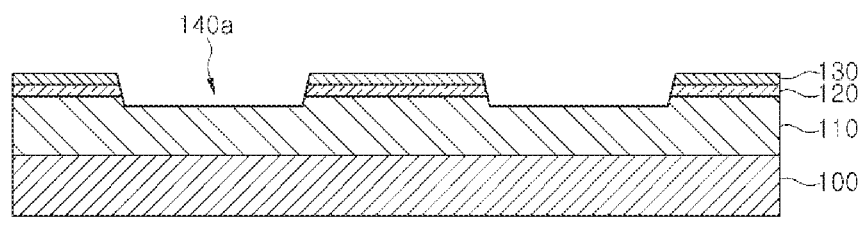

FIGS. 33 and 34 are a plan view and a sectional view showing that first via hole structures are formed in a plurality of laminated structures according to an embodiment of the present disclosure.

In particular, FIG. 34 is a sectional view taken along line A1-A2 in the plan view of FIG. 33.

Referring to FIGS. 33 and 34, the first semiconductor layer 110, the active layer 120 and the second semiconductor layer 130 are formed on the substrate 100, and a first via hole structures 140a are formed to allow the surface of the first semiconductor layer 110 to be exposed therethrough.

The substrate 100 may comprise a material such as sapphire, silicon carbide or GaN. Any material may be used for the substrate 100 as long as it can induce the growth of the thin film. The first semiconductor layer 110 may have the n-type conductivity. Further, the active layer 120 may have a multiple quantum well structure, and the second semiconductor layer 130 is formed on the active layer 120. When the first semiconductor layer 110 has the n-type conductivity, the second semiconductor layer 130 has the p-type conductivity. Further, the buffer layer (not shown) may be further formed between the substrate 100 and the first semiconductor layer 110 so as to facilitate the single crystalline growth of the first semiconductor layer 110.

Subsequently, the selective etching is performed on the structure formed with the second semiconductor layer 130 and the plurality of first via hole structures 140a are formed. Portions of the lower first semiconductor layer 110 are exposed through the first via hole structures 140a. The first via hole structures 140a may be formed by the conventional etching process. For example, the photoresist is applied, and portions of the photoresist on the regions where the first via hole structures will be formed are then removed by the conventional patterning process to form a photoresist pattern. Thereafter, the etching process is performed by using the photoresist pattern as the etching mask. The etching process is performed until the portions of the first semiconductor layer 110 are exposed. After the etching process, the photoresist pattern remaining is removed.

According to the embodiment of the present disclosure, the first via hole structures 140a may have a dumbbell shape which is parallel with one side of the substrate 100, the first semiconductor layer 110, the active layer 120, or the second semiconductor layer 130 and has a length. In some implementations, the first via hole structures 140a may include a pair of via holes disposed at or around distal ends of the corresponding light emitting diodes so as to be formed at both sides of the first via hole structures 140a, and connection parts connecting between the pair of via hole structures.

Referring back to FIG. 33, the first via hole structures 140a may be disposed in parallel with one side, for example, horizontal side, of the rectangular second semiconductor layer 130. In some implementations, the second semiconductor layer 130 may have a shape with a long horizontal side and a short vertial side and a length of the first via holes 140a may be proportional to a length of the long horizontal side of the second semiconductor layer 130.

The shape of the first via hole structures 140a is not limited thereto and the shape and the number of first via hole structures 140a may be variously changed. The shapes and the effects of the first via hole structures 140a will be described in detail below.

Figure 35:
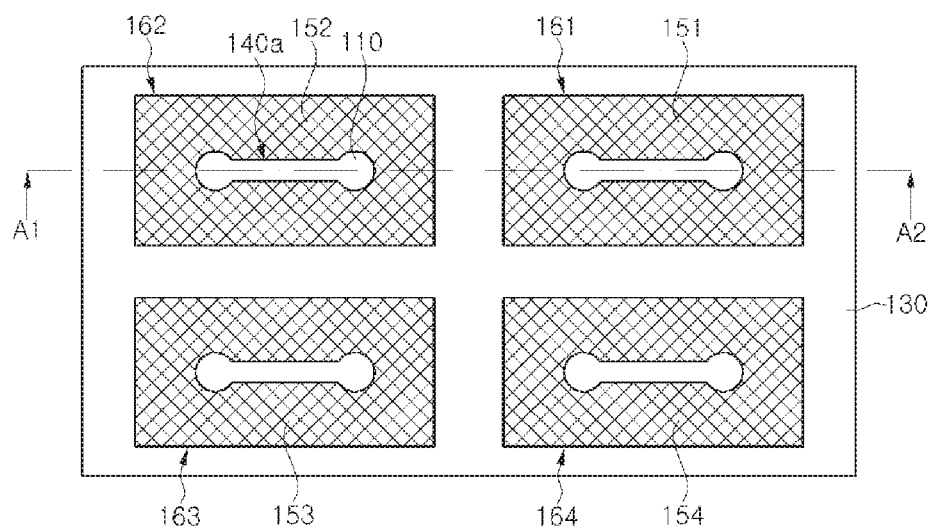
FIGS. 35 and 36 are a plan view and a sectional view showing that lower electrodes are formed on a second semiconductor layer of FIG. 33.
Figure 36:
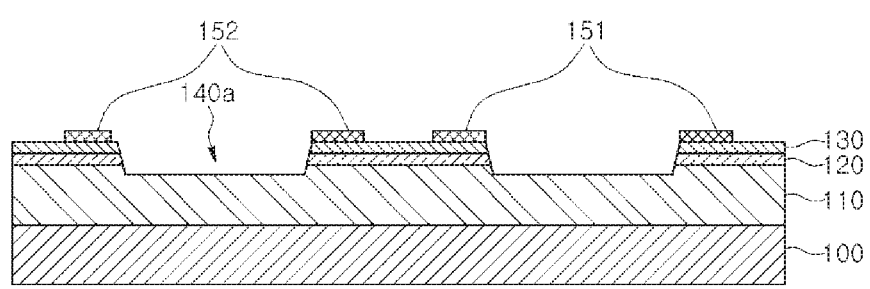

FIGS. 35 and 36 are a plan view and a sectional view showing that lower electrodes are formed on a second semiconductor layer of FIG. 33, in particular, FIG. 36 is a sectional view taken along line A1-A2 in the plan view of FIG. 35.

Referring to FIGS. 35 and 36, the lower electrodes 151, 152, 153 and 154 are disposed to be formed in the regions except the first via hole structures 140a, and the plurality of cell regions 161, 162, 163 and 164 may be defined by the formation of the lower electrodes 151, 152, 153 and 154. Further, The lower electrodes 151, 152, 153 and 154 may be formed by employing the lift-off process used upon formation of a metal electrode. For example, the photoresist is formed in the separating regions excluding the virtual cell regions 161, 162, 163 and 164 and in the regions in which the first via hole structures 140*a* are formed, and the metal layer is formed by conventional thermal deposition or the like. Subsequently, the photoresist is removed, thereby forming the lower electrodes 151, 152, 153 and 154 on the second semiconductor layer 130. Any material may be employed for the lower electrodes 151, 152, 153 and 154 as long as it includes a metallic material capable of being in ohmic contact with the second semiconductor layer 130. Further, the lower electrodes 151, 152, 153 and 154 may comprise the reflective layer made of or including Al, Ag, Rh, or Pt. For example, the lower electrodes 151, 152, 153, and 154 may comprise Ni, Cr or Ti, and may be composed of or include a composite metal layer including, for example, Ti/Al/Ni/Au or a composite metal layer including Ni/Ag/Ni/Au.

In FIGS. 35 and 36, the regions in which the four lower electrodes 151, 152, 153 and 154 are formed define the four cell regions 161, 162, 163 and 164, respectively. The second semiconductor layer 130 is exposed in the spaces among the cell regions 161, 162, 163 and 164. The number of the cell regions 161, 162, 163 and 164 may correspond to that of light emitting diodes included in the array to be formed. Therefore, the number of the cell regions 161, 162, 163 and 164 may be variously changed.

Further, although FIG. 36 shows that the lower electrodes 151, 152, 153 and 154 are discrete in the same cell regions 161, 162, 163 and 164, this is because FIG. 36 shows the sectional view taken along line A1-A2 of FIG. 35, which traverses the first via hole structures 140*a*. As can be seen in FIG. 35, the lower electrodes 151, 152, 153, and 154 formed in the same cell regions 161, 162, 163 and 164 are in the physically connected state. Thus, the lower electrodes 151, 152, 153, and 154 formed in the same cell regions 161, 162, 163, and 164 are in the electrically short-circuited state even though the first via hole structures 140*a* are formed therein.

Figure 37:
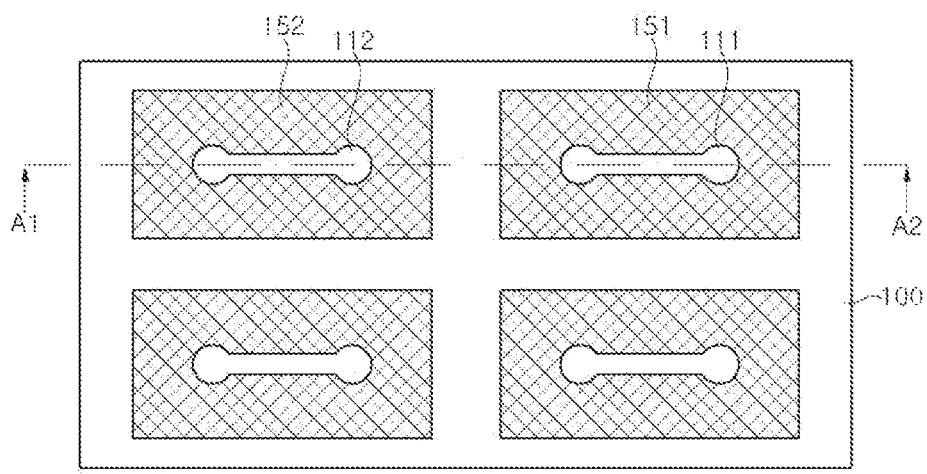
FIG. 37 is a plan view showing a state where cell regions are separated with respect to the structure of FIG. 35.
Figure 38:
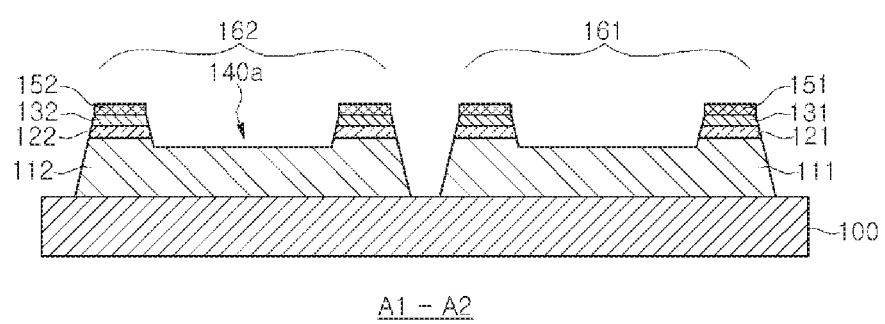
FIG. 38 is a sectional view taken along line A1-A2 in the plan view of FIG. 37.
Figure 39:
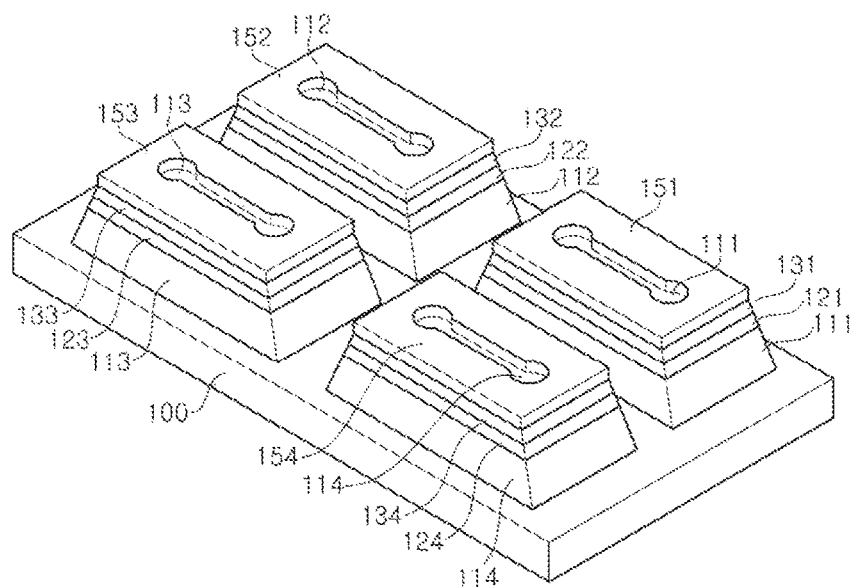
FIG. 39 is a perspective view of the structure in the plan view of FIG. 37.

FIG. 37 is a plan view showing a state of the structure of FIG. 35 where cell regions are separated from one another, FIG. 38 is a sectional view taken along line A1-A2 in the plan view of FIG. 37, and FIG. 39 is a perspective view of the structure of FIG. 37.

Referring to FIGS. 37 to 39, the mesa-etched regions are formed through the mesa etching on the spaces among the four cell regions 161, 162, 163 and 164. The substrate 100 is exposed in the mesa-etched regions formed through the mesa etching. Thus, the four cell regions 161, 162, 163 and 164 are electrically completely separated from one another. If the buffer layer is interposed between the substrate 100 and the first semiconductor layer 110 in FIGS. 33 to 36, the buffer layer may remain even in the separation process of the cell regions 161, 162, 163 and 164. However, in order to completely separate the cell regions 161, 162, 163 and 164 from one another, the buffer layer between adjacent ones of the cell regions 161, 162, 163 and 164 may be removed through the mesa etching.

With the separation process between adjacent ones of the cell regions 161, 162, 163 and 164, the first semiconductor layer 111, 112, 113 or 114, the active layer 121, 122, 123 or 124, the second semiconductor layer 131, 132, 133 or 134, and the lower electrode 151, 152, 153 or 154 are independently formed in each of the cell regions 161, 162, 163 and 164. Thus, the first lower electrode 151 is exposed in the first cell region 161, and the first semiconductor layer 111 is exposed through the first via hole structures 140*a*. Further, the second lower electrode 152 is exposed in the second cell region 162, and the first semiconductor layer 112 is exposed through the first via hole structures 140*a*. Similarly, the third lower electrode 153 and the first semiconductor layer 113 are exposed in the third cell region 163, and the fourth lower electrode 154 and the first semiconductor layer 114 are exposed in the fourth cell region 164.

Further, in the present disclosure, the light emitting diode has a structure in which the first semiconductor layer 111, 112, 113 or 114, the active layer 121, 122, 123 or 124 and the second semiconductor layer 131, 132, 133 or 134 are laminated, respectively. Thus, one light emitting diode is formed in one cell region. Further, when the light emitting diode is configured such that the first semiconductor layer 111, 112, 113 or 114 has the n-type conductivity and the second semiconductor layer 131, 132, 133 or 134 has the p-type conductivity, the lower electrode 151, 152, 153 or 154 formed on the second semiconductor layer 131, 132, 133 or 134 may be referred to as an anode electrode of the light emitting diode.

Further, in the present disclosure, each of the light emitting diodes may include one first via hole structures 140*a* through which the first semiconductor layers 111, 112, 113, and 114 are exposed. The first via hole structures 140*a* may have a length proportional to a length of one side of the second semiconductor layers 131, 132, 133, and 134 in the light emitting diode in which the first via hole structures 140*a* is disposed. The first via hole structures 140*a* may have a length ranging from no less than 30% to less than 100% of the length of the long side of the second semiconductor layer. When the length of the first via hole structure 140*a* is less than 30% of the length of one side of the second semiconductor layer, it may be difficult to effectively diffuse a current.

Referring back to FIG. 37, when the second semiconductor layer 131, 132, 133, or 134 has a generally rectangular shape, the length of one side means the length of the horizontal side or the length of the vertical side of the, second semiconductor layer. In the present embodiment, the length of one side means the length of the horizontal side of the second semiconductor layer but other implementations are also possible. Since the length of the first via hole structures 140*a* is proportional to the length of one side of the second semiconductor layers 131, 132, 133, and 134, an area of the first via hole structures 140*a* may be constantly increased as an area of the second semiconductor layers 131, 132, 133, and 134 is constantly increased. By doing so, the area of the exposed first semiconductor layers 111, 112, 113, and 114 may also be increased. The first via hole structures 140*a* may have a dumbbell shape, a rectangular shape, or a rectangular shape of which the corners are round, but is not limited thereto.

The first via hole structures 140*a* may be disposed in parallel with one side of the second semiconductor layer 131, 132, 133, or 134. For example, the dumbbell-shaped first via hole structures 140*a* may be disposed in parallel with one side of the second semiconductor layer 131, 132, 133, or 134.

The first via hole structures 140*a* may be disposed in a central region of the second semiconductor layer 131, 132, 133, or 134. Further, at least some of the first via hole structures 140*a* may be disposed in the central region of the second semiconductor layer 131, 132, 133, or 134. By doing so, it is possible to easily diffuse the current of the light emitting diode.

Figure 40:
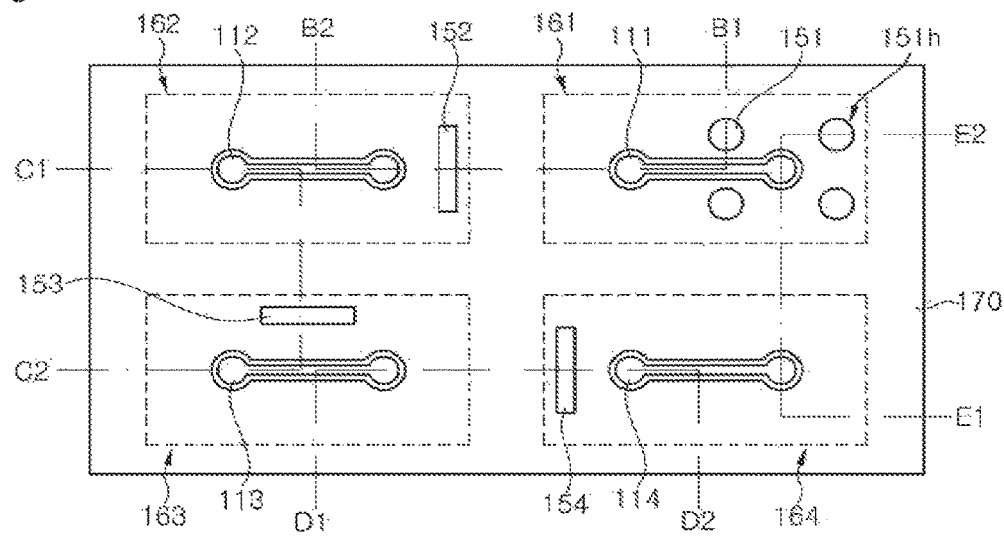
FIG. 40 is a plan view showing that the first interlayer insulating layer is formed on an entire surface of the structure of FIGS. 37 to 39, and portions of the first semiconductor layer and the lower electrodes are exposed in each of the cell regions.

FIG. 40 is a plan view showing that the first interlayer insulating layer is formed on an entire surface of the structure of FIGS. 37 to 39, and portions of the first semiconductor layer and the lower electrodes are exposed in each of the cell regions.

Figure 41:
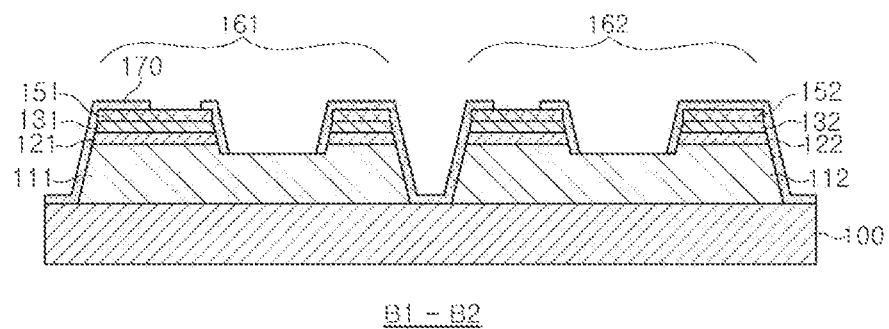
FIGS. 41 to 44 are sectional views taken along specific lines in the plan view of FIG. 40.
Figure 42:
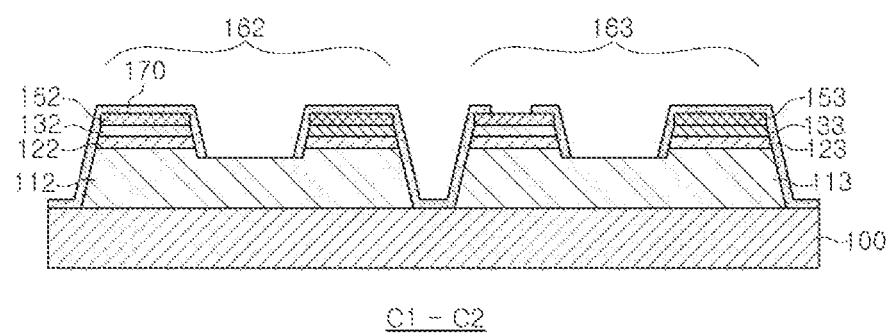
Figure 43:
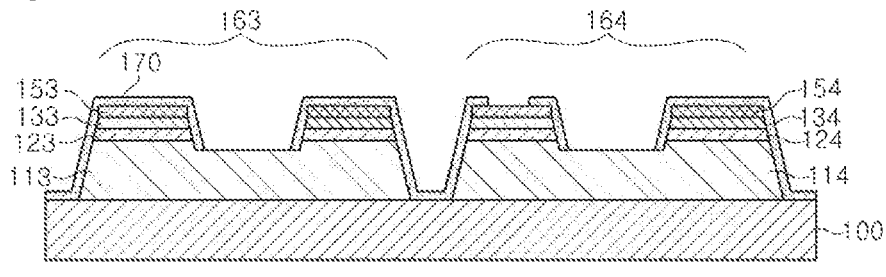
Figure 44:
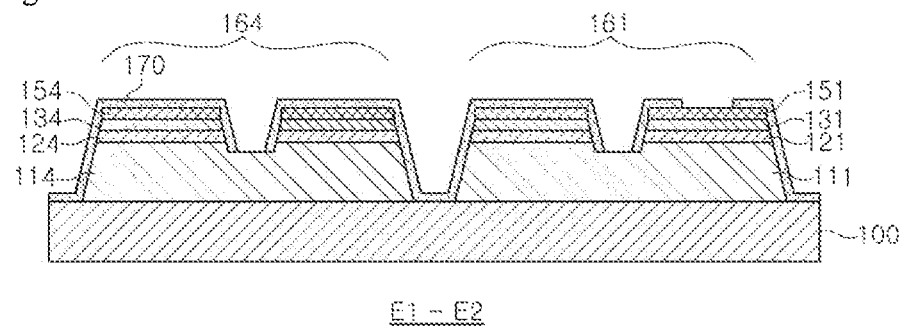

Further, FIGS. 41 to 44 are sectional views taken along specific lines in the plan view of FIG. 40. In particular, FIG. 41 is a sectional view taken along line B1-B2 in the plan view of FIG. 40, FIG. 42 is a sectional view taken along line C1-C2 in the plan view of FIG. 40, FIG. 43 is a sectional view taken along line D1-D2 in the plan view of FIG. 40, and FIG. 44 is a sectional view taken along line E1-E2 in the plan view of FIG. 40.

First, the first interlayer insulating layer 170 is formed over the structure of FIGS. 37 to 39. Moreover, portions of the lower electrodes 151, 152, 153 and 154 and of the first semiconductor layers 111, 112, 113 and 114 under the first via hole structures are exposed by patterning.

For example, in the first cell region 161, the first via hole structures are opened so that the portions of the first semiconductor layer 111 are exposed, and a portion of the first lower electrode 151 formed on the second semiconductor layer 131 is exposed through second via hole structures 151h.

The second via hole structures 151h may be disposed at both sides of the first via hole structures. At least two of the second via hole structures 151h may be disposed to be spaced apart from the first via hole structures at a predetermined distance. For example, when viewing the first cell region 161 from the top, two of the second via hole structures 151h may be disposed to be vertically symmetrical in the first cell region. In some implementations, the second via hole structures 151h may be disposed apart by a predetermined distance from one distal end of the first via hole structures. As described above, the first via hole structures may be formed to include the pair of via holes disposed at distal ends of the first via hole structures and the connection parts connecting between the pair of via holes and one of the pair of via holes may be disposed apart by a predetermined distance from the four second via hole structures 151h as illustrated in FIG. 40.

In the present disclosure, the lower electrodes 151 exposed through the second via hole structures 151h may be electrically connected to the outside through the first pad later. The second via hole structures and the first via hole structures keep a regularly spaced state at a predetermined distance from each other and therefore it is possible to easily diffuse a current in the light emitting diode. Further, the second via hole structures may be disposed in a regular form with a column and row in consideration of the underlying first via hole structures and therefore the flow of current in the light emitting diode may be uniform.

In the second cell region 162, the first semiconductor layer 112 exposed through the first via hole structures is exposed and a portion of the second lower electrode 152 is exposed by etching a portion of the first interlayer insulating layer 170.

In the third cell region 163, the first semiconductor layer 113 is exposed through the first via hole structures and a portion of the third lower electrode 153 is exposed by etching a portion of the first interlayer insulating layer 170.

In the fourth cell region 164, the first semiconductor layer 114 is exposed through the first via hole structures and a portion of the fourth lower electrode 154 is exposed by etching a portion of the first interlayer insulating layer 170.

As a result, in FIGS. 40 to 44, the first interlayer insulating layer 170 is formed on the entire surface of the substrate, and the portions of the first semiconductor layers 111, 112, 113 and 114 under the first via hole structures and the portions of the lower electrodes 151, 152, 153 and 154 on the second semiconductor layers 131, 132, 133 and 134 are exposed in each of the cell regions 161, 162, 163 and 164 by means of the selective etching. That is, the first semiconductor layers 111, 112, 113, and 114 exposed through the first via hole structures pre-formed in the previous step are exposed in each of the cell regions 161, 162, 163, and 164 and the portions of the lower electrodes 151, 152, 153, and 154 are also exposed in each of the cell regions 161, 162, 163, and 164. In the case of the first cell region 161, the first interlayer insulating layer 170 has the second via hole structures 151h and a portion of the lower electrode 151 is exposed through the second via hole structures 151h. The remaining region is shielded by the first interlayer insulating layer 170.

The first interlayer insulating layer 170 may be formed of or include an insulating material having predetermined light transmittance. For example, the first interlayer insulating layer 170 may comprise $SiO_2$. In some implementations, the first interlayer insulating layer 170 may be formed of or include a distributed Bragg reflector in which material layers having different refractive indexes are laminated. For example, $SiO_2/TiO_2$ are repeatedly laminated to form the first interlayer insulating layer 170, thereby reflecting light generated from the active layer.

Figure 45:
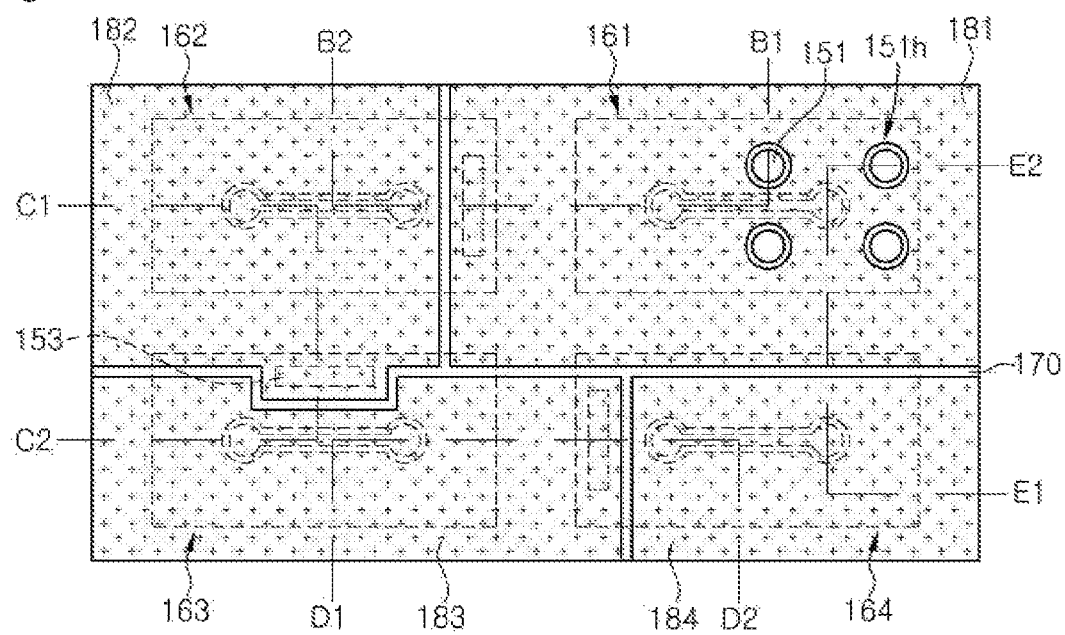
FIG. 45 is a plan view showing that the upper electrodes are formed on the structure illustrated in FIGS. 40 to 44.
Figure 46:
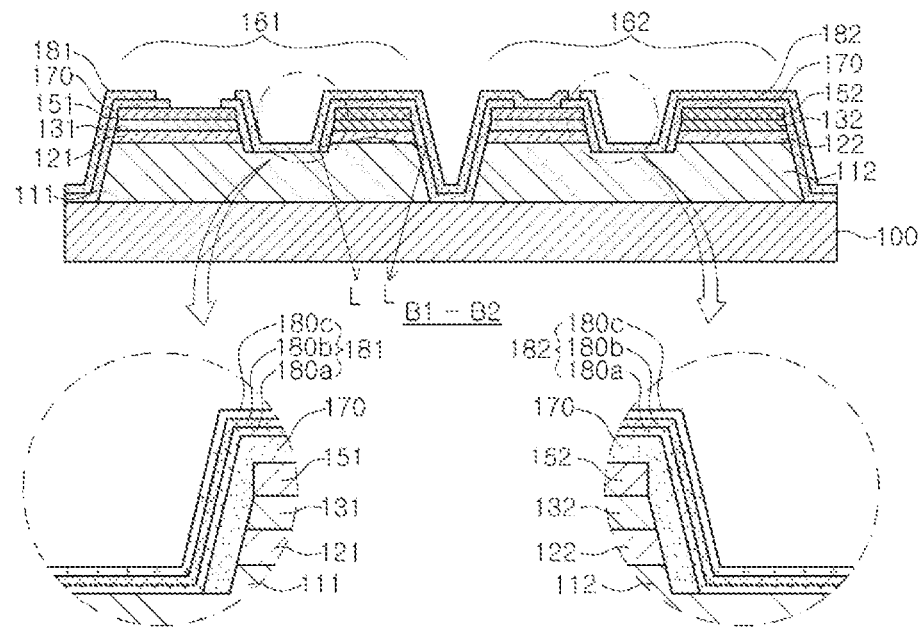
FIGS. 46 to 49 are sectional views taken along specific lines in the plan view of FIG. 45.
Figure 47:
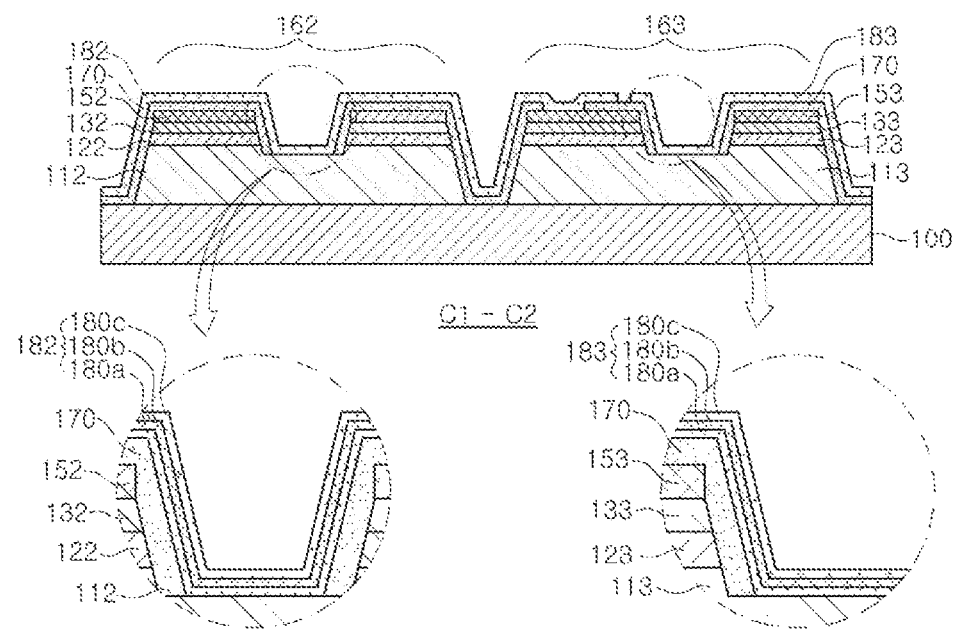
Figure 48:
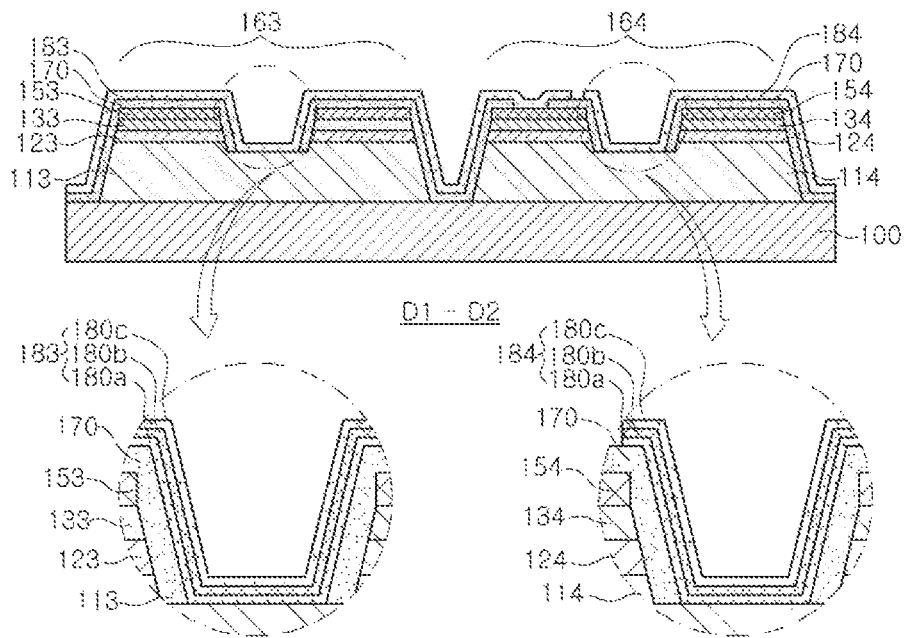
Figure 49:
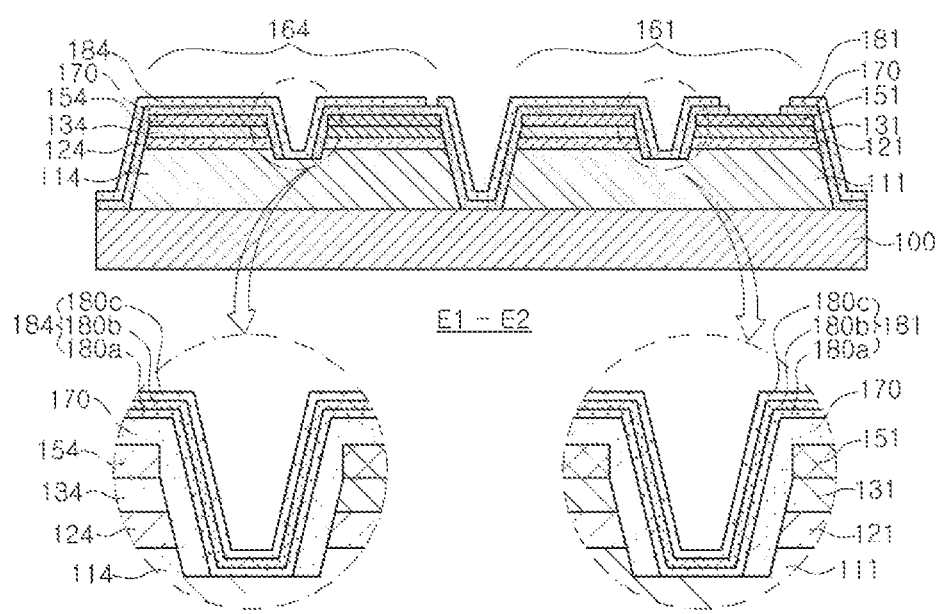

FIG. 45 is a plan view showing that the upper electrodes are formed on the structure illustrated in FIGS. 40 to 44. Further, FIGS. 46 to 49 are sectional views taken along specific lines in the plan view of FIG. 45. In particular, FIG. 46 is a sectional view taken along line B1-B2 in the plan view of FIG. 45, FIG. 47 is a sectional view taken along line C1-C2 in the plan view of FIG. 45, FIG. 48 is a sectional view taken along line D1-D2 in the plan view of FIG. 45, and FIG. 49 is a sectional view taken along line E1-E2 in the plan view of FIG. 45.

Referring to FIG. 45, the upper electrodes 181, 182, 183, and 184 are formed. The upper electrodes 181, 182, 183, and 184 are formed as four discrete regions. For example, the first upper electrode 181 is formed over the first cell region 161 and a portion of the second cell region 162. Further, the second upper electrode 182 is formed over a portion of the second cell region 162 and a portion of the third cell region 163. The third upper electrode 183 is formed over a portion of the third cell region 163 and a portion of the fourth cell region 164 and the fourth upper electrode 184 is formed in a portion of the fourth cell region 164. Thus, each of the upper electrodes 181, 182, 183 and 184 is formed while shielding spaces between adjacent cell regions. The upper electrodes 181, 182, 183 and 184 may cover no less than 30%, even no less than 50%, or no less than 90% of the spaces between the adjacent cell regions. However, since the upper electrodes 181, 182, 183 and 184 are spaced apart from one another, the upper electrodes 181, 182, 183 and 184 cover less than 100% of regions between adjacent light emitting diodes.

The entire of the upper electrodes 181, 182, 183 and 184 may occupy no less than 30%, no less than 50%, no less than 70%, no less than 80%, or no less than 90% of the entire area of the light emitting diode array. However, since the upper electrodes 181, 182, 183 and 184 are spaced apart from one another, they occupy less than 100% of the entire area of the light emitting diode array. Further, the upper electrodes 181, 182, 183, and 184 may have a plate or sheet shape. Further, at least one of the upper electrodes 181, 182, 183 and 184 may have a length or width greater than that of a corresponding light emitting diode (cell region).

Referring to FIG. 46, the first upper electrode 181 is formed on the first interlayer insulating layer 170 in the first cell region 161, and is formed on the first semiconductor layer 111 opened through the first via hole structures. In addition, the first upper electrode 181 allows a portion of the first lower electrode 151 in the first cell region 161 to be exposed through the second via hole structures and is formed on the second lower electrode 152 exposed in the second cell region 162.

Further, the second upper electrode 182 is formed on the first semiconductor layer 112 exposed through the first via hole structures in the second cell region 162 in a state in which the second upper electrode 182 is physically separated from the first upper electrode 181 and is formed on the first interlayer insulating layer 170 in the remaining region.

Referring back to FIG. 46, the first upper electrode 181 electrically connects the first semiconductor layer 111 in the first cell region 161 to the second semiconductor layer 132 in the second cell region 162. Despite the presence of the first via hole structures, the second lower electrode 152 in the second cell region 162 is in an electrically short-circuited state in one cell region. Thus, the first semiconductor layer 111 in the first cell region 161 is electrically connected to the second semiconductor layer 132 in the second cell region 162 through the second lower electrode 152.

In FIG. 47, the second upper electrode 182 is formed on the first semiconductor layer 112 exposed through the first via hole structures in the second cell region 162, and is formed to extend to the third lower electrode 153 in the third cell region 163. Further, the third upper electrode 183 physically separated from the second upper electrode 182 is also formed on the first semiconductor layer 113 exposed through the first via hole structures in the third cell region 163.

In FIG. 47, the second upper electrode 182 is electrically connected to the first semiconductor layer 112 exposed through the first via hole structures in the second cell region 162, and is electrically connected to the third lower electrode 153 in the third cell region 163. Thus, the first semiconductor layer 112 in the second cell region 162 can maintain the same potential as the second semiconductor layer 133 in the third cell region 163.

Referring to FIG. 48, the third upper electrode 183 is formed on the first semiconductor layer 113 exposed through the first via hole structures in the third cell region 163, and is formed to extend to the fourth lower electrode 154 in the fourth cell region 164. Thus, the first semiconductor layer 113 in the third cell region 163 is electrically connected to the second semiconductor layer 134 in the fourth cell region 164. Further, the fourth upper electrode 184 physically separated from the third upper electrode 183 is electrically connected to the first semiconductor layer 114 exposed through the first via hole structures in the fourth cell region 164.

Referring to FIG. 49, the fourth upper electrode 184 is formed on the first semiconductor layer 114 exposed through the first via hole structures in the fourth cell region 164. Further, the first upper electrode 181 physically separated from the fourth upper electrode 184 is formed on the first semiconductor layer 111 exposed through the first via hole structures in the first cell region 161, and allows a portion of the first lower electrode 151 to be exposed in the first cell region 161.

As discussed above, the first semiconductor layer 111 in the first cell region 161 and the second semiconductor layer 132 in the second cell region 162 establish the same potential through the first upper electrode 181. Further, the first semiconductor layer 112 in the second cell region 162 and the second semiconductor layer 133 in the third cell region 163 establish the same potential through the second upper electrode 182. The first semiconductor layer 113 in the third cell region 163 establishes the same potential as the second semiconductor layer 134 in the fourth cell region 164 through the third upper electrode 183. The first lower electrode 151 electrically connected to the second semiconductor layer 131 in the first cell region 161 is exposed.

The upper electrodes 181, 182, and 183 are electrically connected to the first semiconductor layers 111, 112, and 113 through the first via hole structures and establish the same potential as the second semiconductor layers 132, 133, and 134. Thus, the first via hole structures according to the present embodiment have the dumbbell shape or the rectangular shape of which the corners are round. Compared with the case where the shape of a via hole structure is a circle, a contact area between the first semiconductor layer and the upper electrode through the first via hole is relatively wide.

The first via hole structures according to the present embodiment may include two via holes disposed at the distal ends of the first via hole structures and the connection parts connecting between the via holes. Thus, as compared with the case where two via holes are simply disposed without the connection parts, the contact area between the first semiconductor layer and the upper electrode through the first via hole structures may be sufficiently secured. Further, a stress around the contact area is reduced and thus a delamination phenomenon between the first semiconductor layer and the upper electrode may be reduced. Therefore, the reliability of the light emitting diode array according to the embodiment of the present disclosure may be improved.

Further, the area of the first via hole structures is proportional to that of the second semiconductor layer and the length of the first via hole structures is proportional to that of the second semiconductor layer. Thus, the first semiconductor layer having a proper area for efficiently diffusing a current may be exposed. Therefore, the light emitting diode array according to the embodiment of the present disclosure can facilitate the current diffusion between the light emitting diodes.

The establishing of the same potential is based on the assumption of an ideal electrical connection where resistances of the upper electrodes 181, 182, 183 and 184 and contact resistances between the upper electrodes 181, 182, 183 and 184 and the lower electrodes 151, 152, 153 and 154 are neglected. Thus, in the actual operation of a device, a voltage drop may occur due to resistance components of the upper electrodes 181, 182, 183 and 184 and the lower electrodes 151, 152, 153 and 154 that may include metal wires.

The upper electrodes 181, 182, 183 and 184 may comprise a reflective conductive layer 180b. The reflective conductive layer 180b may include Al, Ag, Rh or Pt or a combination thereof. The upper electrodes 181, 182, 183 and 184 including the reflective conductive layer 180b may reflect light which is generated from the active layers 121, 122, 123 and 124 in the respective cell regions 161, 162, 163 and 164 toward the substrate 100. Further, the upper electrodes 181, 182, 183, and 184 may configure an omnidirectional reflector together with the first interlayer insulating layer 170. Meanwhile, even when the first interlayer insulating layer 170 is formed of or includes the distributed Bragg reflector, the upper electrodes 181, 182, 183, and 184 may comprise the reflective conductive layer 180b to improve light reflectivity.

The upper electrodes 181, 182, 183 and 184 may further comprise the ohmic contact layer 180a beneath the reflective conductive layer 180b. The ohmic contact layer 180a may include, for example, Ni, Cr, Ti, Rh, or Al or a combination thereof as a material forming the ohmic contact between the first semiconductor layers 111, 112, 113, and 114 and the lower electrodes 151, 152, 153, and 154. However, the ohmic contact layer 180*a* is not limited thereto and any material may be used for the substrate 100 as long as it may also provide the ohmic-contact with the lower electrodes 151, 152, 153, and 154 of metallic materials while forming the ohmic contact with the first semiconductor layers 111, 112, 113, and 114. For example, a conductive oxide layer like ITO may be used.

The light generated from the active layers 121, 122, 123 and 124 in the respective cell regions 161, 162, 163, and 164 may be reflected from the lower electrodes 151, 152, 153 and 154 toward the substrate 100. Light transmitted through the spaces between the adjacent ones of the cell regions 161, 162, 163 and 164 is reflected by the first interlayer insulating layer 170 and/or the upper electrodes 181, 182, 183 and 184 shielding the spaces between the adjacent ones of the cell regions 161, 162, 163 and 164. Light L which is generated from the active layers 121, 122, 123, and 124 and proceeds toward the first via hole structures or the spaces between the adjacent ones of the cell regions 161, 162, 163, and 164 may be reflected from the upper electrodes 181, 182, 183, and 184 which include the first interlayer insulating layer 170 and/or the reflective conductive layer 180*b* disposed on the side wall of the first via hole structures or the side walls of the spaces and may then be extracted to the outside through the substrate 100. Therefore, the light loss may be reduced and thus the light extraction efficiency may be improved.

In some implementations, the upper electrodes 181, 182, 183, and 184 occupy a wide area of the light emitting diode array. For example, the upper electrodes 181, 182, 183, and 184 may cover no less than 70%, no less than 80%, or even no less than 90% of the entire area of the light emitting diode array. Further, the interval between adjacent ones of the upper electrodes 181, 182, 183, and 184 may range from about 1 μm to 100 μm. In some implementations, the interval between adjacent ones of the upper electrodes 181, 182, 183, and 184 may range from 5 μm to 15 μm. Therefore, it is possible to prevent light leakage in the first via hole structures or the spaces between adjacent ones of the cell regions 161, 162, 163, and 164.

The upper electrodes 181, 182, 183 and 184 may further comprise a barrier layer 180*c* disposed on the reflective conductive layer 180*b*. The barrier layer 180*c* may comprise Ti, Ni, Cr, Pt, TiW, W, or Mo, or a combination thereof. The barrier layer 180*c* may prevent the reflective conductive layer 180*b* from being damaged in the subsequent etching process or cleaning process. The barrier layer 180*c* may be formed of a single layer or a multilayer and may be formed to have a thickness ranging from 300 μm to 5000 μm.

When the first semiconductor layers 111, 112, 113, and 114 have the n-type conductivity and the second semiconductor layers 131, 132, 133, and 134 have the p-type conductivity, each of the upper electrodes may be modeled as the cathode electrode of the light emitting diode and may be simultaneously modeled as wiring for connecting the cathode electrode of the light emitting diode to the lower electrode that is the anode electrode of the light emitting diode formed in the adjacent cell regions. In the light emitting diode formed in the cell region, the upper electrode may be modeled as the wiring for electrically connecting the cathode electrode of the light emitting diode to the anode electrode of the light emitting diode in the adjacent cell regions while forming the cathode electrode.

Figure 50:
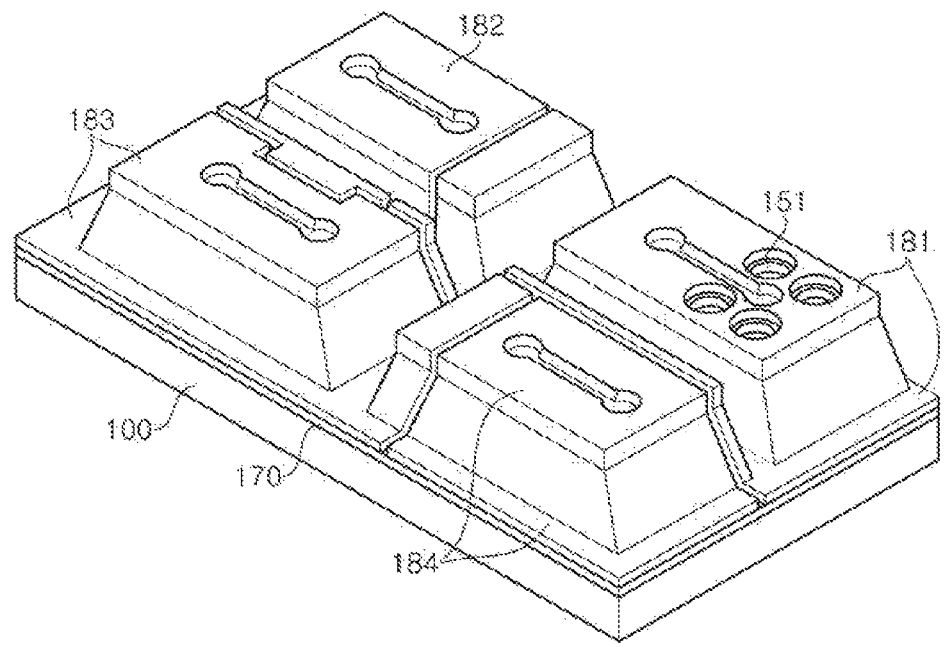
FIG. 50 is a perspective view of the structure in the plan view of FIG. 45.

FIG. 50 is a perspective view of the structure in the plan view of FIG. 45.

Referring to FIG. 50, the first to third upper electrodes 181 to 183 are formed over at least two cell regions. Thus, the space between adjacent cell regions is shielded. The upper electrodes allow light, which may be leaked between the adjacent cell regions, to be reflected through the substrate, and are electrically connected to the first semiconductor layer in each of the cell regions. Further, the upper electrodes are electrically connected to the second semiconductor layer in an adjacent cell region.

Figure 51:
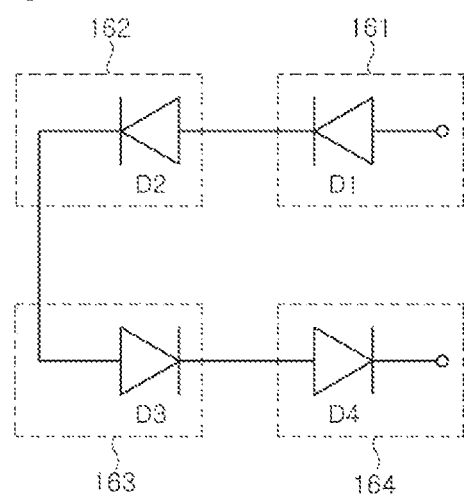
FIG. 51 is an equivalent circuit diagram obtained by modeling the structure of FIGS. 45 to 50 according to a preferred embodiment of the present disclosure.

FIG. 51 is an equivalent circuit diagram obtained by modeling the structure of FIGS. 45 to 50 according to one embodiment of the present disclosure.

Referring to FIG. 51, four light emitting diodes D1, D2, D3 and D4 and a wiring relationship among the light emitting diodes are shown.

The first light emitting diode D1 is formed in the first cell region 161, the second light emitting diode D2 is formed in the second cell region 162, the third light emitting diode D3 is formed in the third cell region 163, and the fourth light emitting diode D4 is formed in the fourth cell region 164. Further, the first semiconductor layers 111, 112, 113 and 114 in the respective cell regions 161, 162, 163 and 164 are modeled as the n-type semiconductors, and the second semiconductor layers 131, 132, 133 and 134 are modeled as the p-type semiconductors.

The first upper electrode 181 is electrically connected to the first semiconductor layer in the first cell region 161 and extends to the second cell region 162 so as to be electrically connected to the second semiconductor layer in the second cell region 162. Thus, the first upper electrode 181 is modeled as wiring for connecting the cathode terminal of the first light emitting diode D1 to the anode terminal of the second light emitting diode D2.

Further, the second upper electrode 182 is modeled as wiring for connection between the cathode terminal of the second light emitting diode D2 and the anode terminal of the third light emitting diode D3 and the third upper electrode 183 is modeled as wiring for connection between the cathode terminal of the third light emitting diode D3 and the anode terminal of the fourth light emitting diode D4. Further, the fourth upper electrode 184 is modeled as wiring for forming the cathode terminal of the fourth light emitting diode D4.

Thus, the anode terminal of the first light emitting diode D1 and the cathode terminal of the fourth light emitting diode D4 are in an electrically opened state with respect to an external power source, and the other light emitting diodes D2 and D3 have a serially connected structure.

Figure 52:
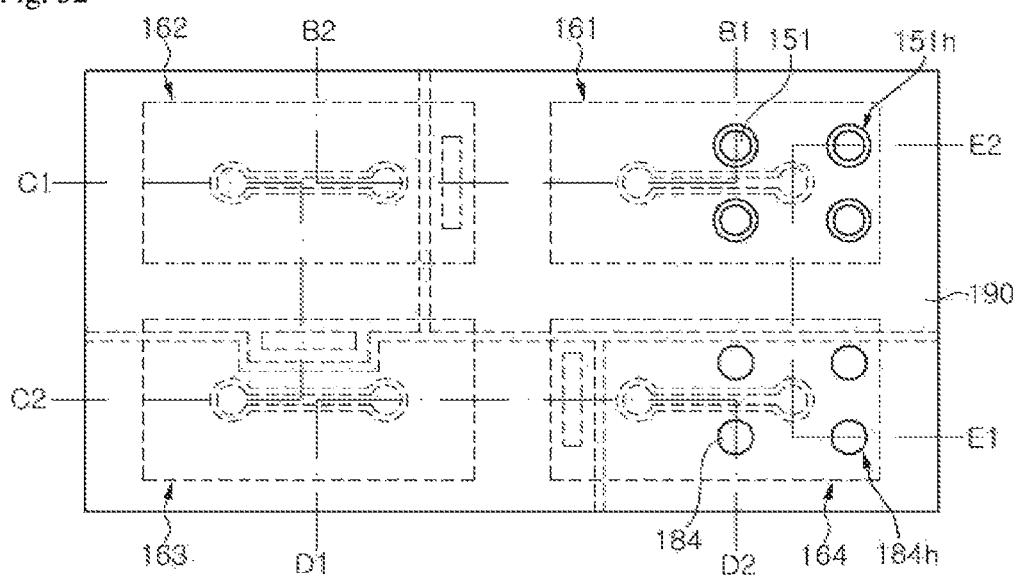
FIG. 52 is a plan view showing that the second interlayer insulating layer is applied on an entire surface of the structure in the plan view of FIG. 45, a portion of the first lower electrode in the first cell region is exposed, and a portion of the fourth lower electrode in the fourth cell region is exposed.

FIG. 52 is a plan view showing that the second interlayer insulating layer is applied on the entire surface of the structure in the plan view of FIG. 45, a portion of the first lower electrode in the first cell region is exposed through the second via hole structures, and a portion of the fourth lower electrode in the fourth cell region is exposed through the third via hole structures.

Figure 53:
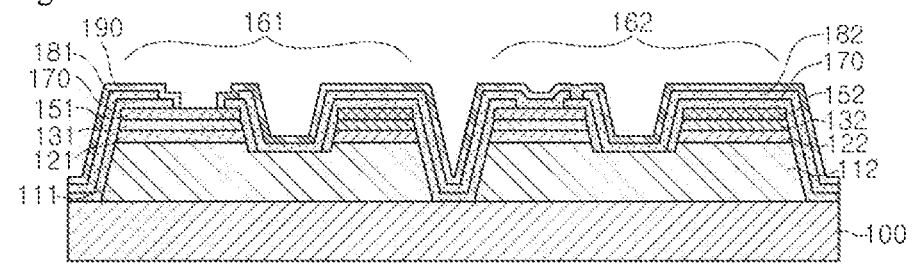
FIGS. 53 through 56 are sectional views taken along specific lines in the plan view of FIG. 52.
Figure 54:
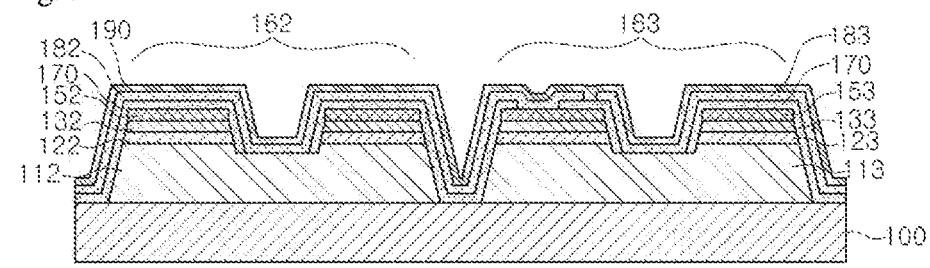
Figure 55:
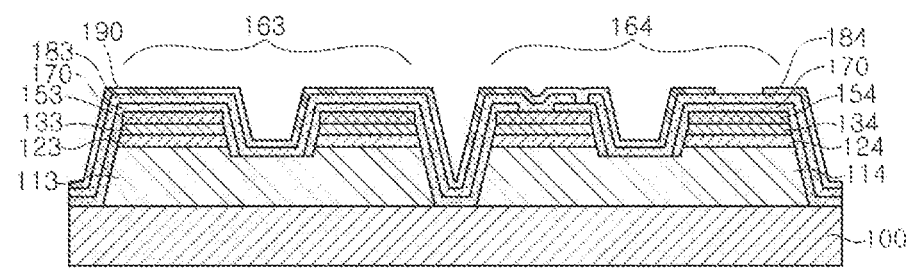
Figure 56:
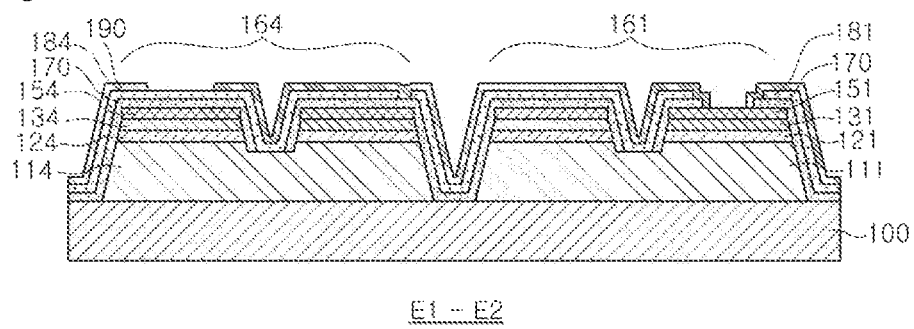

FIG. 53 is a sectional view taken along line B1-B2 in the plan view of FIG. 52, FIG. 54 is a sectional view taken along line C1-C2 in the plan view of FIG. 52, FIG. 55 is a sectional view taken along line D1-D2 in the plan view of FIG. 52, and FIG. 56 is a sectional view taken along line E1-E2 in the plan view of FIG. 52.

Referring to FIG. 53, the first lower electrode 151 electrically connected to the second semiconductor layer 131 in the first cell region 161 is opened. The remaining portions in the first cell region are covered with the second interlayer insulating layer 190 that is also formed over the second cell region 162.

Referring to FIG. 54, the second and third cell regions 162 and 163 are covered with the second interlayer insulating layer 190.

Further, referring to FIGS. 52, 55, and 56, the fourth upper electrode 184 in the fourth cell region 164 is exposed through third via hole structures 184h, and the first lower electrode 151 in the first cell region 161 is exposed through the second via hole structures 151h. The second via hole structures 151h may be formed by reopening the second interlayer insulating layer 190 covered on the second via hole structures through the first interlayer insulating layer 170.

In the present embodiment, similar to the second via hole structures 151h, the third via hole structures 184h may be disposed at both sides of the first via hole structures. At least two of the third via hole structures 184h may be disposed apart by a predetermined distance from the underlying first via hole structures. In some implementations, when viewing the fourth cell region 164 from the top, two of the third via hole structures 184h may be disposed to be vertially symmetrical in the first cell region. In some implementations, the third via hole structures 184h may be disposed apart by a predetermined distance from one distal end of the first via hole structure. As described above, the first via hole structures may be formed to include the pair of via holes disposed at distal ends of the first via hole structures and the connection parts connecting between the pair of via holes and one of the pair of via holes may be disposed apart by a predetermined distance from the four third via hole structures 184h as illustrated in FIG. 52.

In the present disclosure, the fourth upper electrodes 184 exposed through the third via hole structures 184h may be electrically connected to the outside through the second pad later. The third via hole structures and the underlying first via hole structures keep a regularly spaced state at a predetermined distance from each other and therefore it is possible to easily diffuse a current in the light emitting diode. The third via hole structures may be disposed in a regular form with column and row in consideration of the underlying first via hole structures and therefore the flow of current in the light emitting diode may be uniform.

The second interlayer insulating layer 190 is selected from or includes an insulation material capable of protecting an underlying film from an external environment. In some implementations, the second interlayer insulating layer may comprise SiN or the like that has an insulation property and can block a change in temperature or humidity.

In FIGS. 52 to 56, the second interlayer insulating layer 190 is applied over the structure of the substrate. Further, portions of the first lower electrode 151 in the first cell region 161 are exposed through the first via hole structures 151h, and the fourth upper electrode 184 in the fourth cell region 164 is exposed through the third via hole structures 184h.

Figure 57:
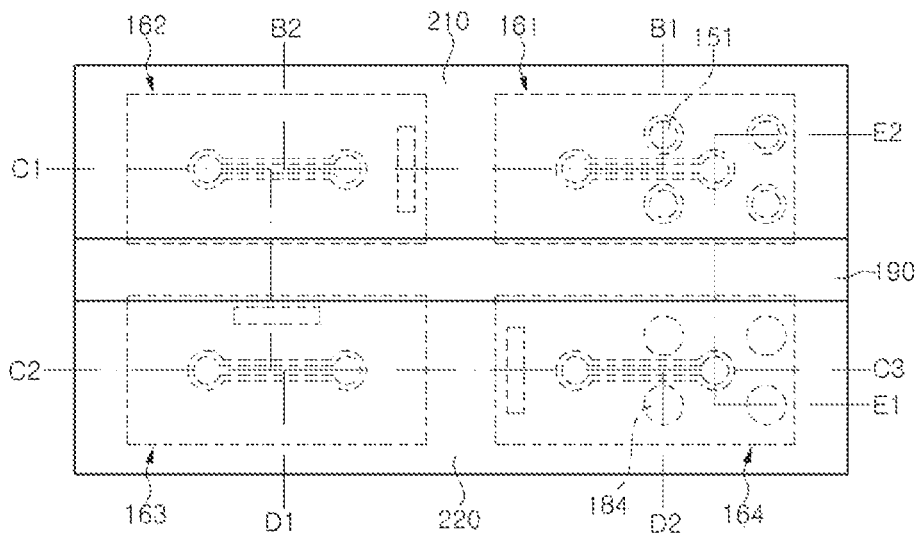
FIG. 57 is a plan view showing that the first and second pads are formed in the structure of FIG. 52.

FIG. 57 is a plan view showing that the first and second pads are formed in the structure of FIG. 52.

Referring to FIG. 57, the first pad 210 may be formed over the first and second cell regions 161 and 162. Accordingly, the first pad 210 can be electrically connected to the first lower electrode 151 in the first cell region 161, which is exposed in FIG. 52.

Moreover, the second pad 220 is formed to be spaced apart from the first pad 210 at a predetermined distance, and may be formed over the third and fourth cell regions 163 and 164. The second pad 220 is electrically connected to the fourth upper electrode 184 in the fourth cell region 164, which is exposed through the third via hole structures 184h in FIG. 52.

Figure 58:
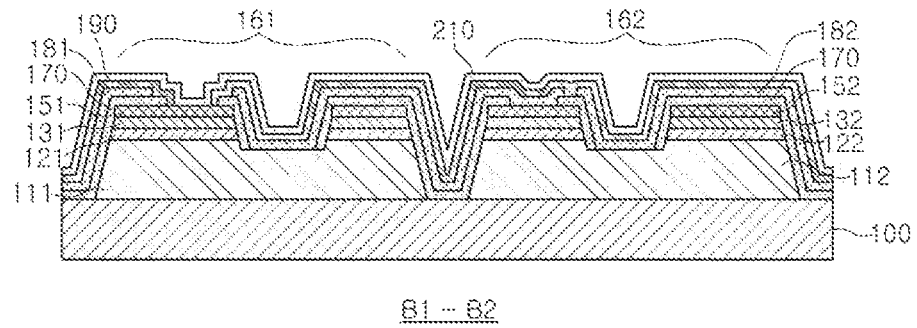
FIGS. 58 to 61 are sectional views taken along specific lines in the plan view of FIG. 57.
Figure 59:
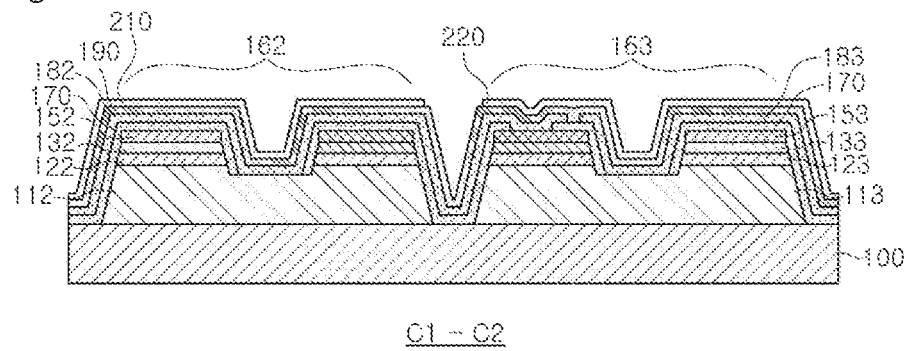
Figure 60:
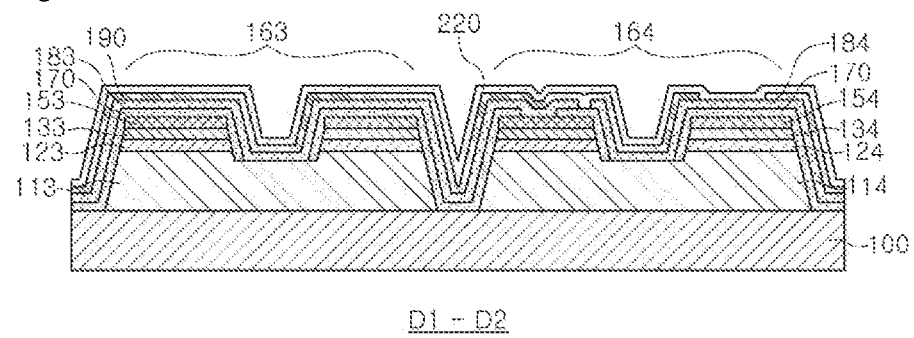
Figure 61:
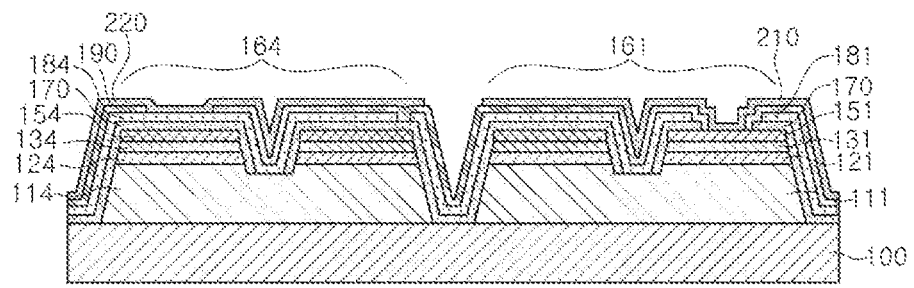

FIG. 58 is a sectional view taken along line B1-B2 in the plan view of FIG. 57, FIG. 59 is a sectional view taken along line C1-C2 in the plan view of FIG. 57, FIG. 60 is a sectional view taken along line D1-D2 in the plan view of FIG. 57, and FIG. 61 is a sectional view taken along line E1-E2 in the plan view of FIG. 57.

Referring to FIG. 58, the first pad 210 may be formed over the first and second cell regions 161 and 162. The first pad 210 is formed on the first lower electrode 151 exposed in the first cell region 161. The first pad 210 is formed on the second interlayer insulating layer 190 in the remaining region. Thus, the first pad 210 is electrically connected to the second semiconductor layer 131 in the first cell region 161 through the first lower electrode 151.

Referring to FIG. 59, the first pad 210 is formed in the second cell region 162, and the second pad 220 is formed to be spaced apart from the first pad 210 in the third cell region 163. The electrical contact of the first or second pad 210 or 220 with the lower or upper electrode is blocked in the second and third cell regions 162 and 163.

Referring to FIG. 60, the second pad 220 may be formed over the third and fourth cell regions 163 and 164. In some implementations, the fourth upper electrode 184 and the second pad 220 which are opened in the fourth cell region 164 are electrically connected to each other. Thus, the second pad 220 is electrically connected to the first semiconductor layer 114 in the fourth cell region 164.

Referring to FIG. 61, the second pad 220 is formed in the fourth cell region 164, and the first pad 210 is formed to be spaced apart from the second pad 220 in the first cell region 161. The first pad 210 is formed on the first lower electrode 151 in the first cell region 161 to be electrically connected to the second semiconductor layer 131.

Figure 62:
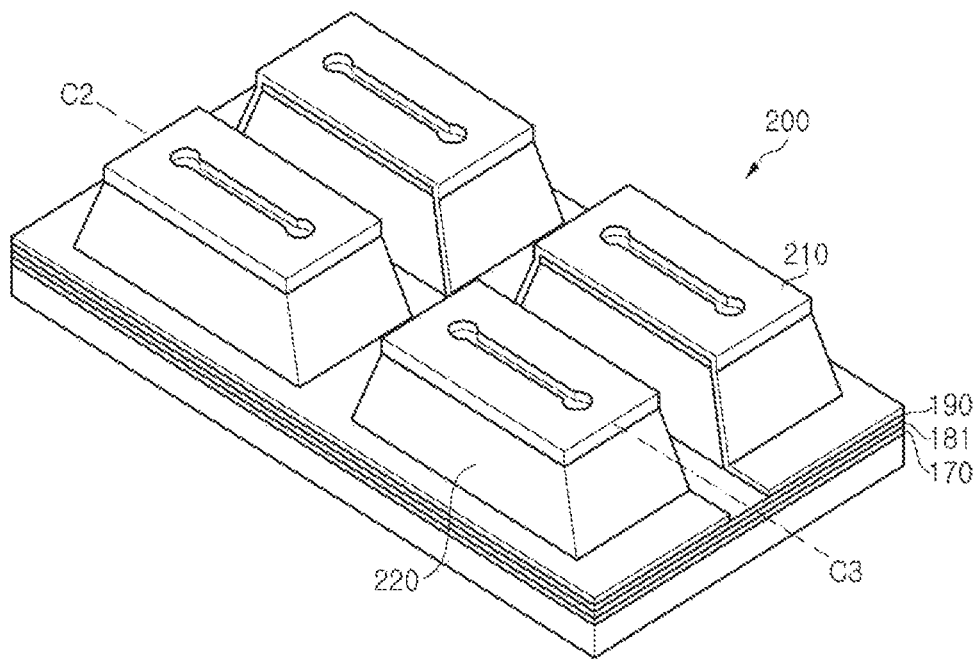
FIG. 62 is a perspective view of the structure in the plan view of FIG. 57.
Figure 63:
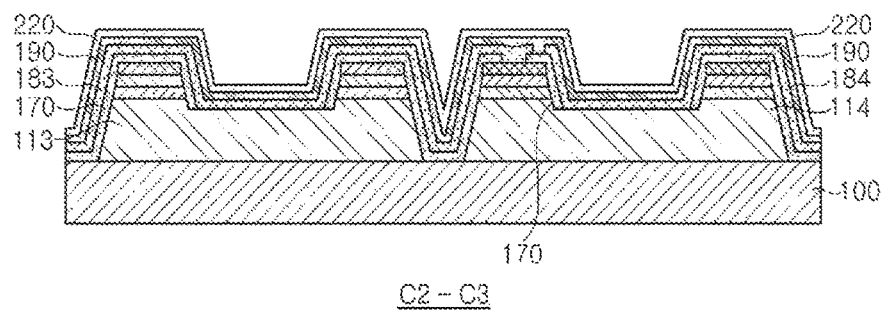
FIG. 63 is a sectional view taken along line C2-C3 in the perspective view of FIG. 62.

FIG. 62 is a perspective view showing the structure in the plan view of FIG. 57 and FIG. 63 is a sectional view taken along line C2-C3 in the perspective view of FIG. 62.

Referring to FIGS. 62 and 63, the first semiconductor layer 113 in the third cell region 163 is electrically connected to the third upper electrode 183. The third upper electrode 183 shields the space between the third and fourth cell regions 163 and 164 and is electrically connected to the fourth lower electrode 154 in the fourth cell region 164. Further, the first and second pads 210 and 220 are spaced apart from each other and formed on the second interlayer insulating layer 190. As described above, the first pad 210 is electrically connected to the second semiconductor layer 131 in the first cell region 161, and the second pad 220 is electrically connected to the first semiconductor layer 114 in the fourth cell region 164.

Referring to the modeling of FIG. 51, the first semiconductor layers 111, 112, 113 and 114 in the respective cell regions are modeled as the n-type semiconductors, and the second semiconductor layers 131, 132, 133 and 134 are modeled as the p-type semiconductors. The first lower electrode 151 formed on the second semiconductor layer 131 in the first cell region 161 is modeled as the anode electrode of the first light emitting diode D1. Therefore, the first pad 210 may be modeled as the wiring connected to the anode electrode of the first light emitting diode D1. Further, the fourth upper electrode 184 electrically connected to the first semiconductor layer 114 in the fourth cell region 164 is modeled as the cathode electrode of the fourth light emitting diode D4. Therefore, the second pad 220 may be understood as the wiring connected to the cathode electrode of the fourth light emitting diode D4.

Accordingly, the array structure in which the four light emitting diodes D1 to D4 are connected in series is formed, and the electrical connection of the array structure to the outside is achieved through the two pads 210 and 220 formed on the single substrate 100.

In the present disclosure, there is shown that the four light emitting diodes are formed while being separated from one another and the anode terminal of one of the light emitting diodes is electrically connected to the cathode terminal of another light emitting diode through the lower and upper electrodes. However, the four light emitting diodes in this embodiment are merely an example, and various numbers of light emitting diodes according to the present disclosure may be formed.

Figure 64:
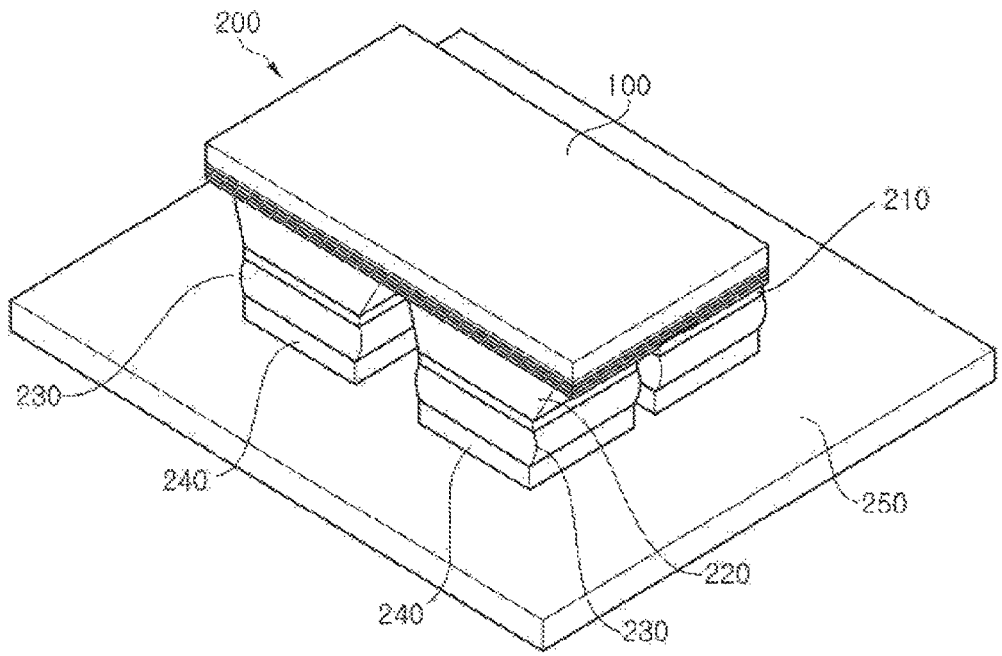
FIG. 64 is a perspective view showing a light emitting diode module including a light emitting diode array according to an embodiment of the present disclosure.

FIG. 64 is a schematic perspective view showing a light emitting diode module including a light emitting diode array according to an embodiment of the present disclosure.

Referring to FIG. 64, the light emitting diode module comprises a printed circuit board 250 having pads 240 and the light emitting diode array 200 bonded to the printed circuit board 250 through a solder paste 230.

The printed circuit board is or includes a substrate on which the printed circuit is formed. Any substrate may be used as long as it provides the light emitting diode module.

The light emitting diode array 200 is mounted on the printed circuit board 250 while being overturned in a flip chip form. The light emitting diode array 200 is mounted on the printed circuit board 250 through the first and second pads 210 and 220. A lower surface of the light emitting diode array 200, for example, a light extraction surface of the substrate 100 may be covered with a wavelength converter (not shown). The wavelength converter may cover the upper surface and a side of the light emitting diode array 200.

Figure 65:
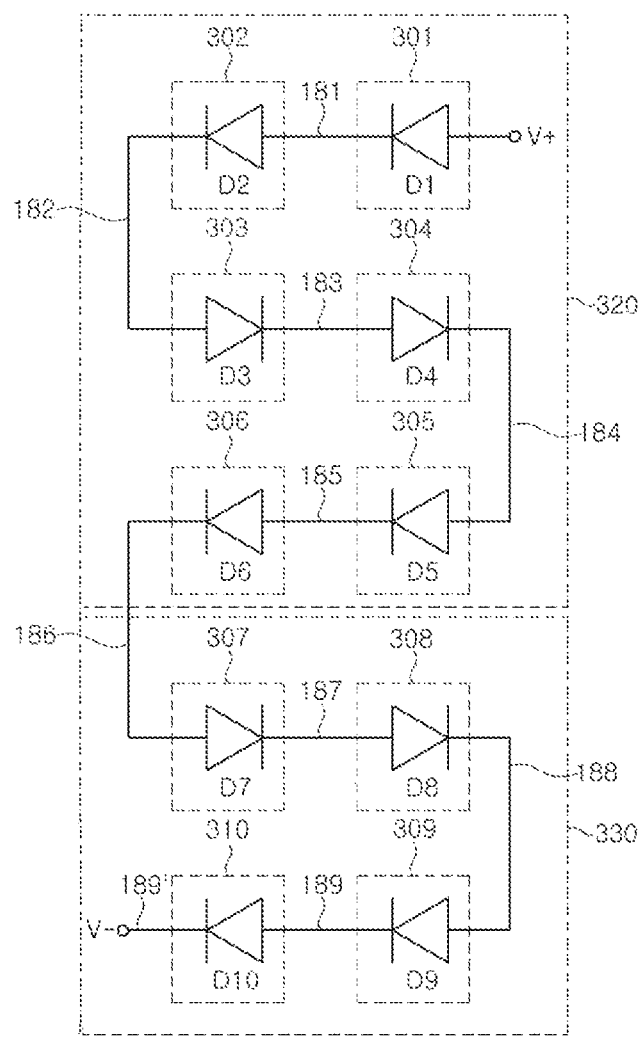
FIG. 65 is a circuit diagram obtained by modeling a connection of ten light emitting diodes in series according to an embodiment of the present disclosure.

FIG. 65 is a circuit diagram obtained by modeling a connection of ten light emitting diodes in series according to an embodiment of the present disclosure.

Referring to FIG. 65, ten cell regions 301 to 310 are defined using the process shown in FIG. 37. The first semiconductor layer, the active layer, the second semiconductor layer and the lower electrode in each of the cell regions 301 to 310 are separated from those in other cell regions. The respective lower electrodes are formed on the second semiconductor layers so as to form the anode electrodes of light emitting diodes D1 to D10.

The first interlayer insulating layer and the first to tenth upper electrodes 181 to 189 and 189' are formed using the processes shown in FIGS. 38 to 49. However, the formed upper electrodes 181 to 189 and 189' shield the space between the adjacent cell regions. The first to ninth upper electrodes 181 to 189 serve as wiring for achieving the electrical connection between the anode electrodes of one side of the pair of adjacent light emitting diodes and the first semiconductor layer of the other side of the pair of adjacent light emitting diodes. Furthermore, the tenth upper electrode 189' is electrically connected to the first semiconductor layer of the light emitting diode D10.

Furthermore, the second interlayer insulating layer is formed using the processes shown in FIGS. 52 to 61. The lower electrode of the first light emitting diode D1 connected to a positive power voltage V+ on a current path is exposed, and the upper electrode of the tenth light emitting diode D10 connected to a negative power voltage V− on the current path is opened. Then, a first pad 320 is formed and connected to the anode terminal of the first light emitting diode D1. Further, a second pad 330 is formed and connected to the cathode terminal of the tenth light emitting diode D10.

In some implementations, other light emitting diodes are connected in series/parallel so as to form an array.

Figure 66:
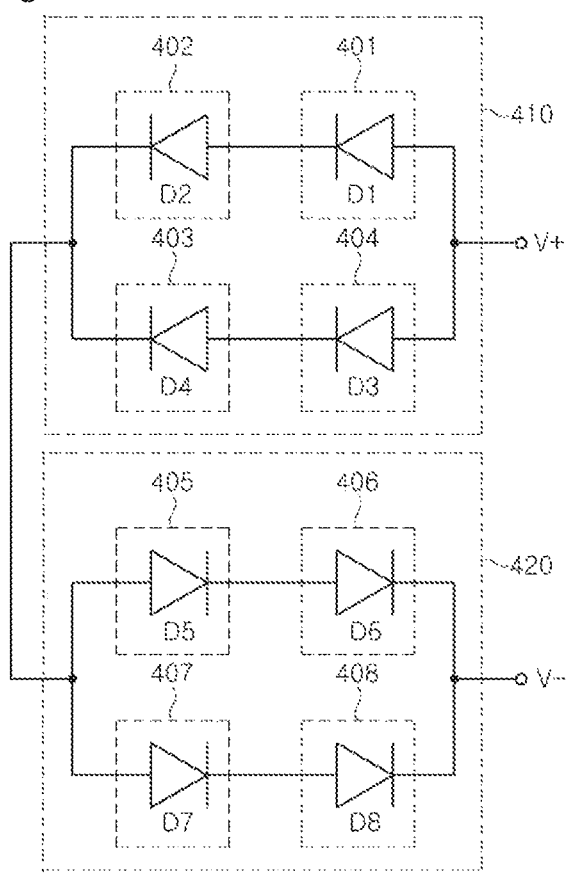
FIG. 66 is a circuit diagram obtained by modeling the array having light emitting diodes connected in series/parallel according to an embodiment of the present disclosure.

FIG. 66 is a circuit diagram obtained by modeling the array having light emitting diodes connected in series/parallel according to an embodiment of the present disclosure.

Referring to FIG. 66, the plurality of light emitting diodes D1 to D8 are connected in parallel to the adjacent light emitting diodes while having the serial connection. Each of the light emitting diodes D1 to D8 is formed independently through the definitions of cell regions 401 to 408. As described above, the anode electrodes of each of the light emitting diodes D1 to D8 are formed through the lower electrode. The wirings between the cathode electrodes of the light emitting diodes D1 to D8 and the anode electrodes of the adjacent light emitting diodes are made by forming the upper electrodes and performing an appropriate wiring process. However, the lower electrode is formed on the second semiconductor layer, and the upper electrode is formed to shield the space between the adjacent cell regions.

A first pad 410 supplied with a positive power voltage V+ is electrically connected to the lower electrode formed on the second semiconductor layer of the first or third light emitting diode D1 or D3, and a second pad 420 supplied with a negative power voltage V− is electrically connected to the upper electrode that is the cathode electrode of the sixth or eighth light emitting diode D6 or D8.

According to the present disclosure described above, the light generated in the active layer of each of the light emitting diodes is reflected from the lower and upper electrodes toward the substrate, and the flip-chip type light emitting diodes are electrically connected through wiring of the upper electrodes on the single substrate. The upper electrode serves as the wiring for achieving the electrical connection between the first semiconductor layer of one side of the pair of adjacent light emitting diodes and the second semiconductor layer of the other side of the pair of adjacent light emitting diodes. In this case, the upper electrode includes the reflective conductive layer to reflect the light emitted from the light emitting layer, thereby increasing the light extraction efficiency.

The upper electrode is shielded from the outside through the second interlayer insulating layer. The first pad supplied with a positive power voltage is electrically connected to the lower electrode of the light emitting diode connected most closely to the positive power voltage. Further, the second pad supplied with a negative power voltage is electrically connected to the upper electrode of the light emitting diode connected most closely to the negative power voltage.

Thus, it is possible to avoid inconvenience in a process of mounting a plurality of flip-chip type light emitting diodes on a submount substrate and implementing two terminals to an external power source through wiring arranged on the submount substrate. In addition, the space between adjacent cell regions can be shielded by the upper electrode, thereby maximizing the reflection of light toward the substrate.

Further, the second interlayer insulating layer protects the plurality of laminated structures, which are arranged between the substrate and the second interlayer insulating layer, from external temperature or humidity and the like. Thus, it is possible to implement a structure that can be directly mounted on a substrate without intervention of any separate packaging means.

In particular, since the plurality of flip-chip type light emitting diodes are implemented on the single substrate, there is an advantage in that the commercial power source can be directly used while excluding the voltage drop, the conversion of the voltage level or the conversion of waveform for the commercial power source supplied.

Further, it is possible to effectively diffuse a current by providing the suitable form of the first via hole structures included in the light emitting diode array, the suitable mutual disposition form between the first via hole structures and the second via hole structures, and the suitable mutual disposition form between the first via holes and the third via holes.

Figure 67:
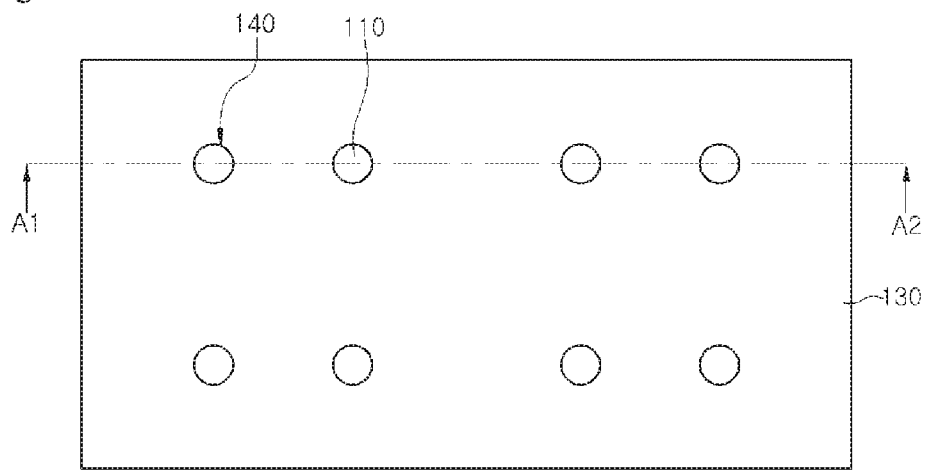
FIGS. 67 and 68 are plan and sectional views showing that a plurality of via holes are formed in a laminated structure according to an embodiment of the present disclosure.
Figure 68:
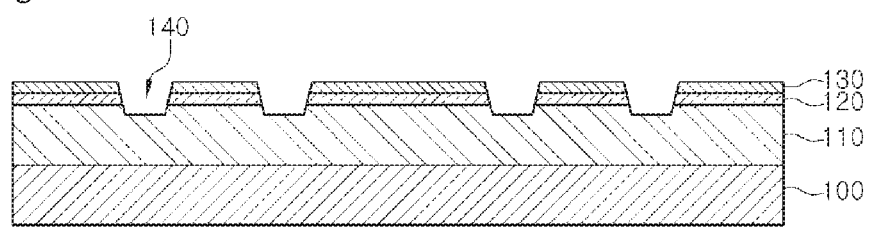

FIGS. 67 and 68 are plan and sectional views showing that a plurality of via holes are formed in a laminated structure according to an embodiment of the present disclosure.

In particular, FIG. 68 is a sectional view taken along line A1-A2 in the plan view of FIG. 67.

Referring to FIGS. 67 and 68, a first semiconductor layer 110, an active layer 120 and a second semiconductor layer 130 are formed on a substrate 100, and via holes 140 are formed to allow a surface of the semiconductor layer 110 to be exposed therethrough.

The substrate 100 comprises a material such as sapphire, silicon carbide or GaN. Any material may be used for the substrate 100 as long as it can induce the growth of a thin film to be formed on the substrate 100. The first semiconductor layer 110 may have n-type conductivity. The active layer 120 may have a multiple quantum well structure, and the second semiconductor layer 130 is formed on the active layer 120. When the first semiconductor layer 110 has the n-type conductivity, the second semiconductor layer 130 has p-type conductivity. A buffer layer (not shown) may be further formed between the substrate 100 and the first semiconductor layer 110 so as to facilitate single crystalline growth of the first semiconductor layer 110.

Subsequently, selective etching is performed on the structure formed with up to the second semiconductor layer 130, and a plurality of via holes 140 are formed. Portions of the lower first semiconductor layer 110 are exposed through the via holes 140. The via holes 140 may be formed through a conventional etching process. For example, a photoresist is applied, and portions of the photoresist on regions where the via holes will be formed are then removed through a conventional patterning process to form a photoresist pattern. Thereafter, an etching process is performed by using the photoresist pattern as an etching mask. The etching process is performed until the portions of the first semiconductor layer 110 are exposed. After the etching process, the remaining photoresist pattern is removed.

The shape and number of the via holes 140 may be variously changed.

Figure 69:
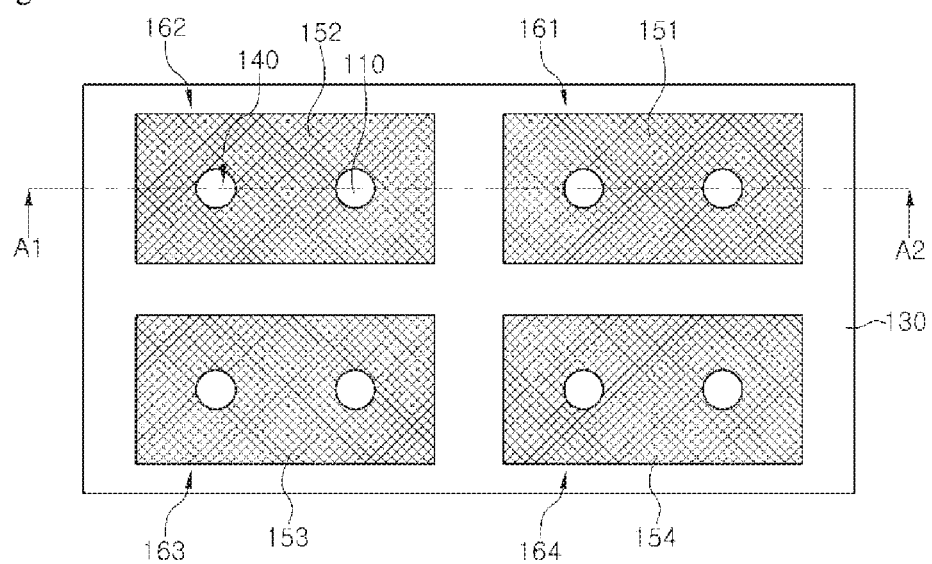
FIGS. 69 and 70 are plan and sectional views showing that lower electrodes are formed on a second semiconductor layer of FIG. 67.
Figure 70:
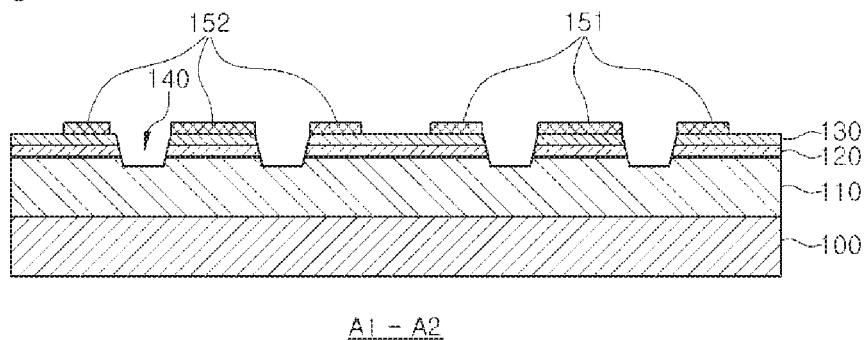

FIGS. 69 and 70 are plan and sectional views showing that lower electrodes are formed on the second semiconductor layer 130 of FIG. 67. Particularly, FIG. 70 is a sectional view taken along line A1-A2 in the plan view of FIG. 69.

Referring to FIGS. 69 and 70, the lower electrodes 151, 152, 153 and 154 are formed in regions except the via holes 140, and a plurality of cell regions 161, 162, 163 and 164 may be defined by the formation of the lower electrodes 151, 152, 153 and 154. The lower electrodes 151, 152, 153 and 154 may be formed by employing a lift-off process used upon formation of a metal electrode. For example, a photoresist is formed in separating regions excluding the virtual cell regions 161, 162, 163 and 164 and in the regions in which the via holes 140 are formed, and a metal layer is formed through conventional thermal deposition or the like.

Subsequently, the photoresist is removed, thereby forming the lower electrodes 151, 152, 153 and 154 on the second semiconductor layer 130. Any material may be employed for the lower electrodes 151, 152, 153 and 154 as long as it is a metallic material capable of being in ohmic contact with the second semiconductor layer 130. The lower electrodes 151, 152, 153 and 154 may include a reflective layer of a material such as Al, Ag, Rh or Pt. For example, the lower electrodes 151, 152, 153 and 154 may comprise Ni, Cr or Ti, and may be composed of a composite metal layer of Ti/Al/Ni/Au.

In FIGS. 69 and 70, the regions in which the four lower electrodes 151, 152, 153 and 154 are formed define four cell regions 161, 162, 163 and 164, respectively. The second semiconductor layer 130 is exposed in spaces among the cell regions 161, 162, 163 and 164. The number of the cell regions 161, 162, 163 and 164 may correspond to that of light emitting diodes included in an array to be formed. Therefore, the number of the cell regions 161, 162, 163 and 164 may be variously changed.

Although FIG. 70 shows that the lower electrode 151, 152, 153 or 154 is separated in the same cell region 161, 162, 163 or 164, this is a phenomenon occurring as line A1-A2 transverses the via holes 140. As can be seen in FIG. 69, the lower electrode 151, 152, 153 or 154 formed in the same cell region 161, 162, 163 or 164 is physically continuous. Thus, the lower electrode 151, 152, 153 or 154 formed in the same cell region is in an electrically short-circuited state even though the via holes 140 are formed therein.

Figure 71:
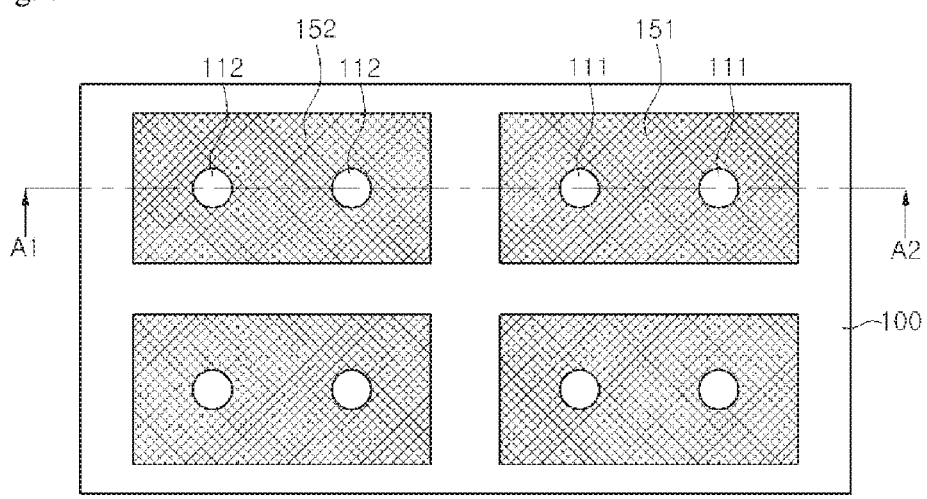
FIG. 71 is a plan view showing a state where cell regions are separated with respect to the structure of FIG. 69.
Figure 72:
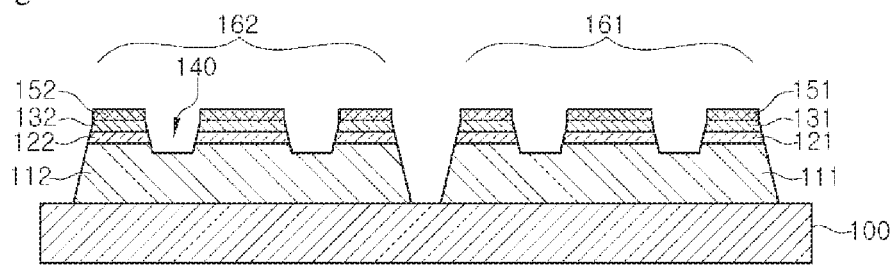
FIG. 72 is a sectional view taken along line A1-A2 in the plan view of FIG. 71.
Figure 73:
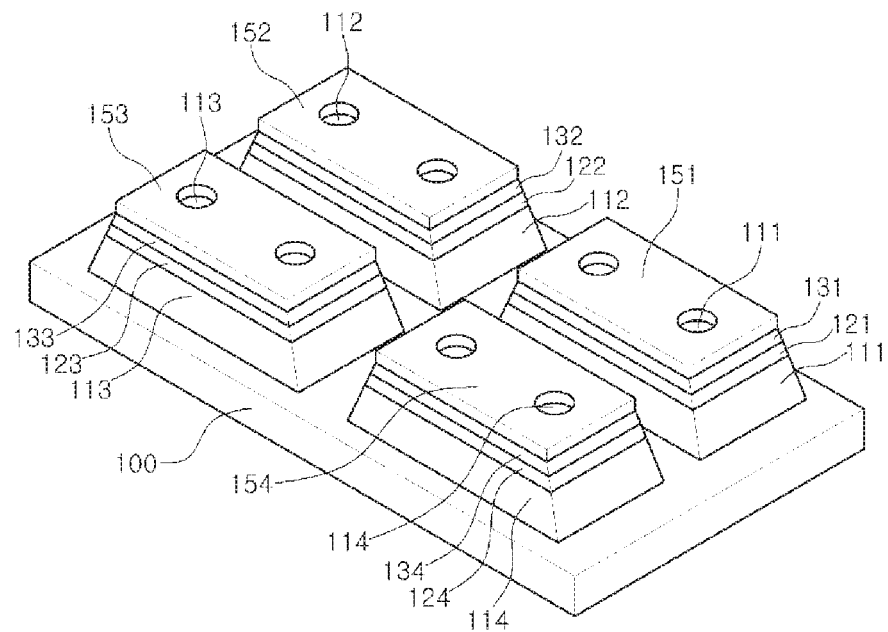
FIG. 73 is a perspective view of the structure in the plan view of FIG. 71.

FIG. 71 is a plan view showing a state where cell regions are separated with respect to the structure of FIG. 69, FIG. 72 is a sectional view taken along line A1-A2 in the plan view of FIG. 71, and FIG. 73 is a perspective view of the structure in the plan view of FIG. 71.

Referring to FIGS. 71, 72 and 73, mesa-etched regions are formed through mesa etching for the spaces among the four cell regions 161, 162, 163 and 164. The substrate 100 is exposed in the mesa-etched regions formed through the mesa etching. Thus, the four cell regions 161, 162, 163 and 164 are electrically isolated, or completely separated, from one another. If a buffer layer is interposed between the substrate 100 and the first semiconductor layer 110 in FIGS. 67 to 70, the buffer layer may remain even in the separation process of the cell regions 161, 162, 163 and 164. However, in order to completely separate the cell regions 161, 162, 163 and 164 from one another, the buffer layer between adjacent ones of the cell regions 161, 162, 163 and 164 may be removed through the mesa etching.

With the separation process between adjacent ones of the cell regions 161, 162, 163 and 164, first semiconductor layers 111, 112, 113 and 114, active layers 121, 122, 123 and 124, second semiconductor layers 131, 132, 133 and 134 and lower electrodes 151, 152, 153 and 154 are independently formed in the cell regions 161, 162, 163 and 164, respectively. Thus, the first lower electrode 151 is exposed in the first cell region 161, and the first semiconductor layer 111 is exposed through the via holes 140. The second lower electrode 152 is exposed in the second cell region 162, and the first semiconductor layer 112 is exposed through the via holes 140. Similarly, the third lower electrode 153 and the first semiconductor layer 113 are exposed in the third cell region 163, and the fourth lower electrode 154 and the first semiconductor layer 114 are exposed in the fourth cell region 164.

In some embodiments, the light emitting diode may correspond to a structure in which the first semiconductor layer 111, 112, 113 or 114, the active layer 121, 122, 123 or 124 and the second semiconductor layer 131, 132, 133 or 134 are laminated, respectively. Thus, one light emitting diode is formed in one cell region. When the light emitting diode is modeled such that the first semiconductor layer 111, 112, 113 or 114 has n-type conductivity and the second semiconductor layer 131, 132, 133 or 134 has p-type conductivity, the lower electrode 151, 152, 153 or 154 formed on the second semiconductor layer 131, 132, 133 or 134 may be referred to as an anode electrode of the light emitting diode.

Figure 74:
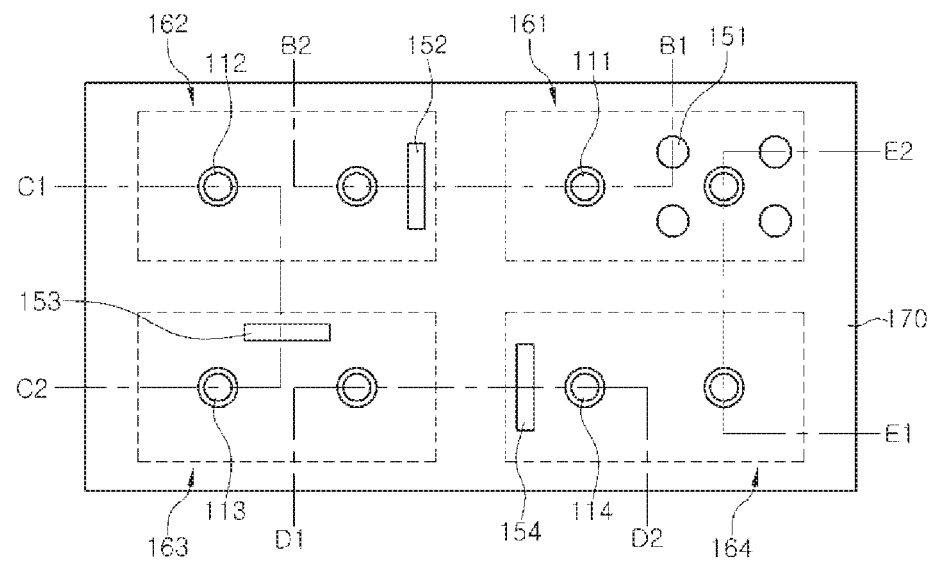
FIG. 74 is a plan view showing that a first interlayer insulating layer is formed on an entire surface of the structure of FIGS. 71 to 73, and portions of a first semiconductor layer and the lower electrodes are exposed in each of the cell regions.

FIG. 74 is a plan view showing that a first interlayer insulating layer is formed on an entire surface of the structure of FIGS. 71 to 73, and portions of a first semiconductor layer and the lower electrodes are exposed in each of the cell regions.

Figure 75:
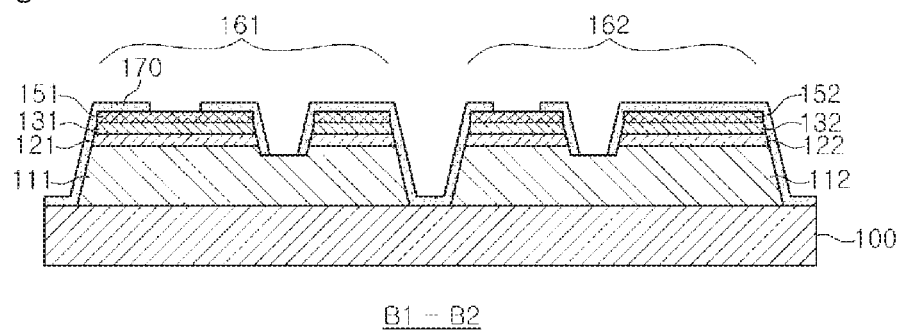
FIGS. 75 to 78 are sectional views taken along specific lines in the plan view of FIG. 74.
Figure 76:
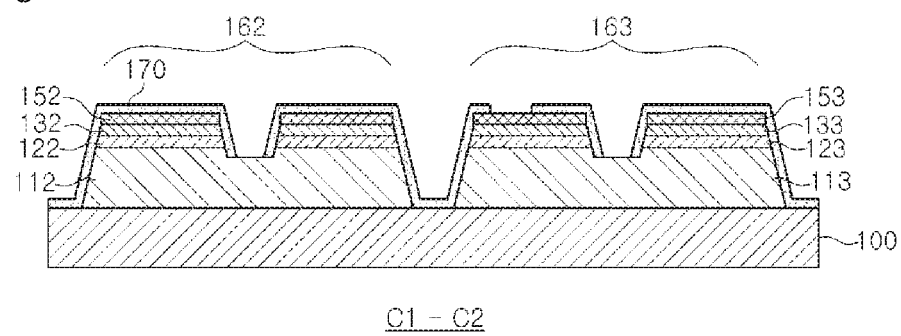
Figure 77:
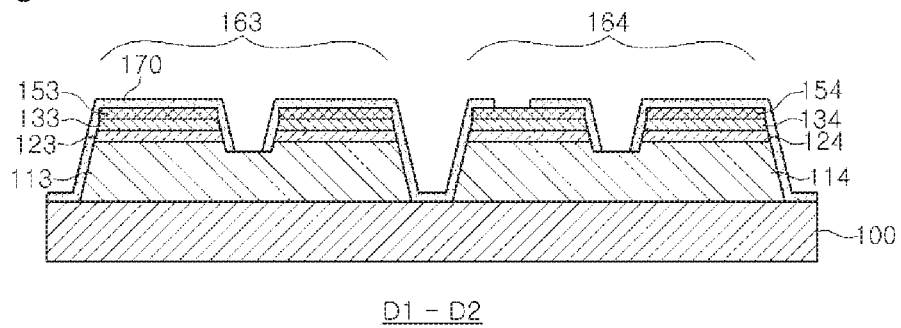
Figure 78:
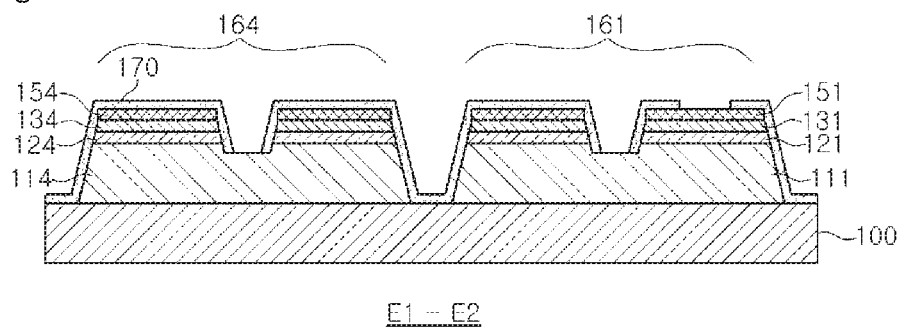

Moreover, FIGS. 75 to 78 are sectional views taken along specific lines in the plan view of FIG. 74. Particularly, FIG. 75 is a sectional view taken along line B1-B2 in the plan view of FIG. 74, FIG. 76 is a sectional view taken along line C1-C2 in the plan view of FIG. 74, FIG. 77 is a sectional view taken along line D1-D2 in the plan view of FIG. 74, and FIG. 78 is a sectional view taken along line E1-E2 in the plan view of FIG. 74.

First, a first interlayer insulating layer 170 is formed with respect to the structure of FIGS. 71 to 73. Moreover, portions of the lower electrodes 151, 152, 153 and 154 and of the first semiconductor layers 111, 112, 113 and 114 under the via holes are exposed by means of patterning.

For example, in the first cell region 161, two pre-formed via holes are opened so that portions of the first semiconductor layer 111 are exposed, and a portion of the first lower electrode 151 formed on the pre-formed second semiconductor layer 131 is exposed. In the second cell region 162, portions of the first semiconductor layer 112 are exposed through the pre-formed via holes, and a portion of the second lower electrode 152 is exposed by means of etching for a portion of the first interlayer insulating layer 170. In the third cell region 163, portions of the first semiconductor layer 113 are exposed through the via holes, and a portion of the third lower electrode 153 is exposed by means of etching for a portion of the first interlayer insulating layer 170. In the fourth cell region 164, portions of the first semiconductor layer 114 are exposed through the via holes, and a portion of the fourth lower electrode 154 is exposed by means of etching for a portion of the first interlayer insulating layer 170.

As a result, in FIGS. 74 to 78, the first interlayer insulating layer 170 is formed on the entire surface of the substrate, and the portions of the first semiconductor layers 111, 112, 113 and 114 under the via holes and the portions of the lower electrodes 151, 152, 153 and 154 on the second semiconductor layers 131, 132, 133 and 134 are exposed in each of the cell regions 161, 162, 163 and 164 by means of selective etching. That is, in the respective cell regions 161, 162, 163 and 164, the portions of the first semiconductor layers 111, 112, 113 and 114 are exposed through the via holes previously formed in the preceding process, and the portions of the lower electrodes 151, 152, 153 and 154 are also exposed. The remaining region is shielded by the first interlayer insulating layer 170. The first interlayer insulating layer 170 may be formed of an insulating material having a light transmittance. For example, the first interlayer insulating layer may comprise $SiO_2$. Alternatively, the first interlayer insulating layer 170 may be formed as a distributed Bragg reflector in which material layers having different refractive indices are laminated. For example, the first interlayer insulating layer 170 can be formed by repetitively laminating $SiO_2/TiO_2$, thereby reflecting light generated from the active layer.

Figure 79:
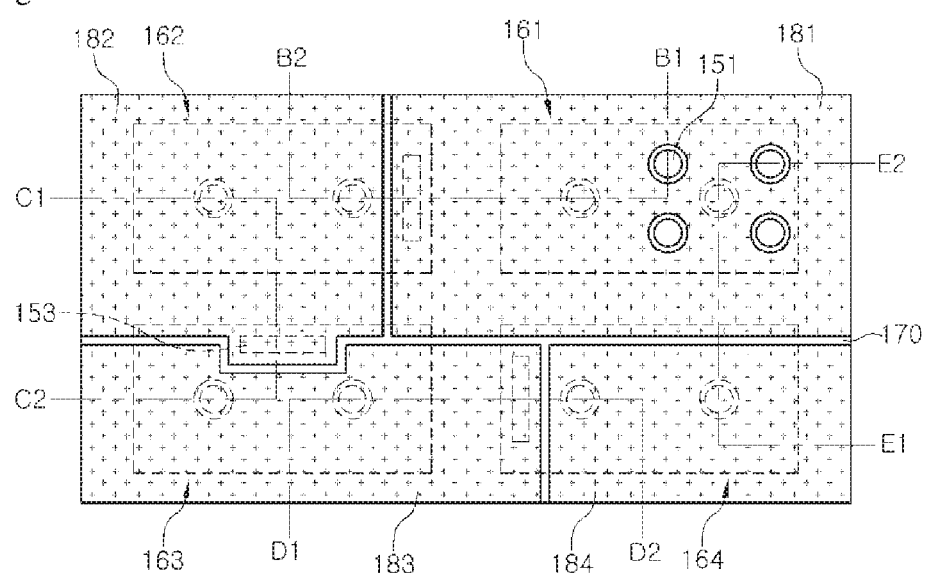
FIG. 79 is a plan view showing that upper electrodes are formed on the structure illustrated in FIGS. 74 to 78.
Figure 80:
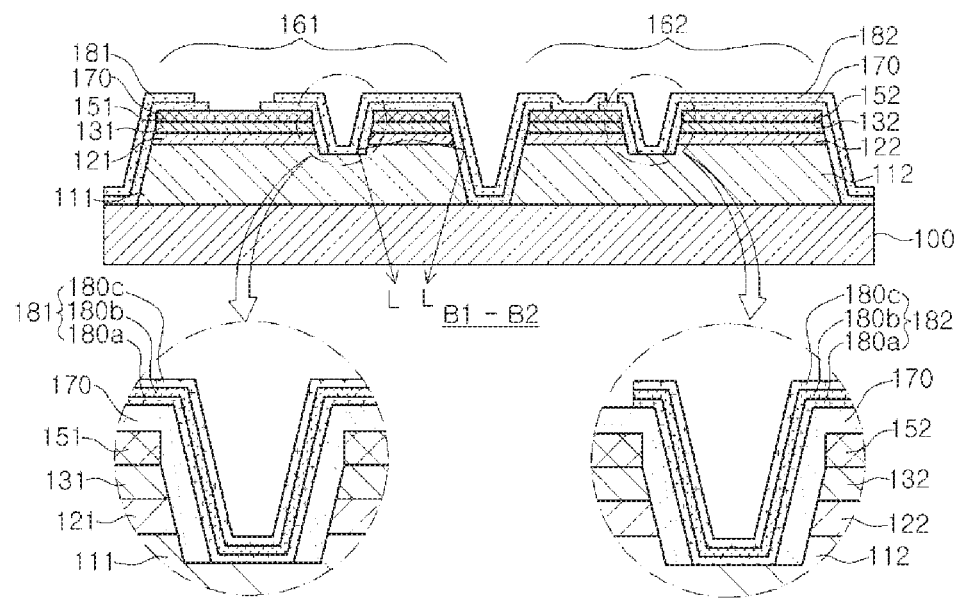
FIGS. 80 to 83 are sectional views taken along specific lines in the plan view of FIG. 79.
Figure 81:
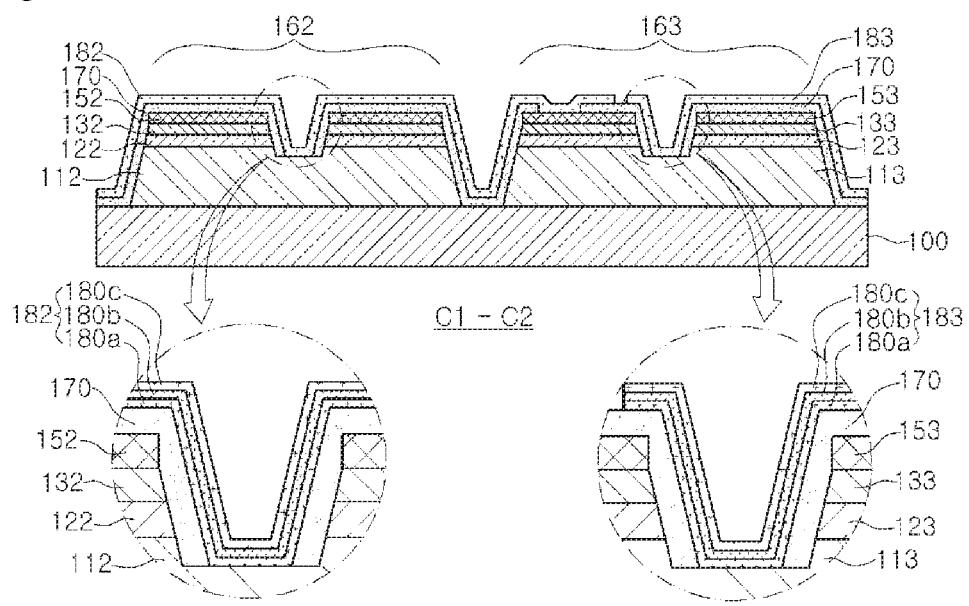
Figure 82:
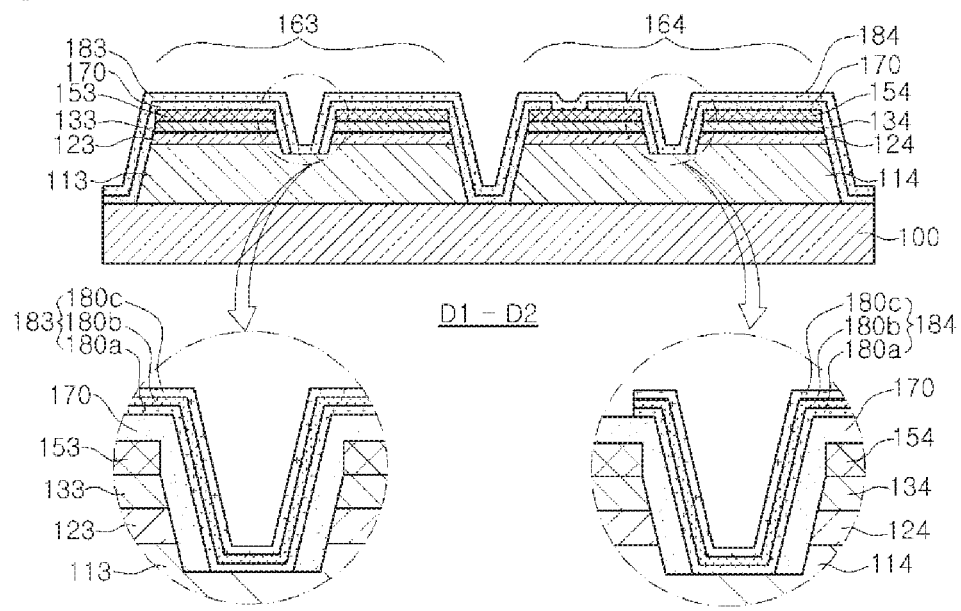
Figure 83:
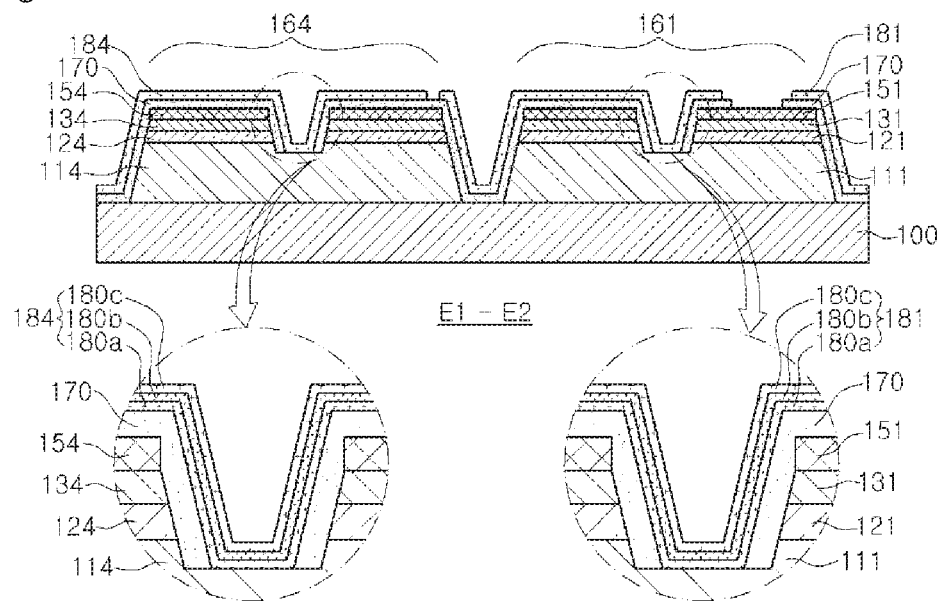

FIG. 79 is a plan view showing an embodiment in which upper electrodes are formed on the structure illustrated in FIGS. 74 to 78. FIGS. 80 to 83 are sectional views taken along specific lines in the plan view of FIG. 79. Particularly, FIG. 80 is a sectional view taken along line B1-B2 in the plan view of FIG. 79, FIG. 81 is a sectional view taken along line C1-C2 in the plan view of FIG. 79, FIG. 82 is a sectional view taken along line D1-D2 in the plan view of FIG. 79, and FIG. 83 is a sectional view taken along line E1-E2 in the plan view of FIG. 79.

Referring to FIG. 79, upper electrodes 181, 182, 183 and 184 are illustrated. The upper electrodes 181, 182, 183 and 184 are formed as four discrete regions. For example, the first upper electrode 181 is formed over the first cell region 161 and a portion of the second cell region 162. The second upper electrode 182 is formed over a portion of the second cell region 162 and a portion of the third cell region 163. The third upper electrode 183 is formed over a portion of the third cell region 163 and a portion of the fourth cell region 164. The fourth upper electrode 184 is formed in a portion of the fourth cell region 164. Thus, each of the upper electrodes 181, 182, 183 and 184 is formed while shielding spaces between adjacent ones of the cell regions. The upper electrodes 181, 182, 183 and 184 may cover no less than 30%, even no less than 50%, or no less than 90% of the spaces between the adjacent cell regions. However, since the upper electrodes 181, 182, 183 and 184 are spaced apart from one another, the upper electrodes 181, 182, 183 and 184 cover less than 100% of regions between adjacent ones of light emitting diodes.

The entirety of the upper electrodes 181, 182, 183 and 184 may occupy no less than 30%, no less than 50%, no less than 70%, no less than 80% or no less than 90% of the entire area of the light emitting diode array. However, since the upper electrodes 181, 182, 183 and 184 are spaced apart from one another, they occupy less than 100% of the entire area of the light emitting diode array. Each of the upper electrodes 181, 182, 183 and 184 may have the shape of a plate or sheet having a ratio of length and width ranging from 1:3 to 3:1. Further, at least one of the upper electrodes 181, 182, 183 and 184 has a length or width greater than that of a corresponding light emitting diode (cell region).

Referring to FIG. 80, the first upper electrode 181 is formed on the first interlayer insulating layer 170 in the first cell region 161, and is formed on portions of the first semiconductor layer 111 opened through the via holes. In addition, the first upper electrode 181 allows a portion of the first lower electrode 151 to be opened in the first cell region 161 and is formed on a portion of the second lower electrode 152 exposed in the second cell region 162.

The second upper electrode 182 is formed on portions of the first semiconductor layer 112 exposed through the via holes in the second cell region 162 in a state in which the second upper electrode 182 is physically separated from the first upper electrode 181. In addition, the second upper electrode 182 is formed on the first interlayer insulating layer 170.

In FIG. 80, the first upper electrode 181 electrically connects the first semiconductor layer 111 in the first cell region 161 to the second semiconductor layer 132 in the second cell region 162. Despite of the presence of the via holes, the second lower electrode 152 in the second cell region 162 is entirely in an electrically short-circuited state in one cell region. Thus, the first semiconductor layer 111 in the first cell region 161 is electrically connected to the second semiconductor layer 132 in the second cell region 162 through the second lower electrode 152.

In FIG. 81, the second upper electrode 182 is formed on portions of the first semiconductor layer 112 exposed through the via holes in the second cell region 162, and is formed to extend to the third lower electrode 153 in the third cell region 163. The third upper electrode 183, physically separated from the second upper electrode 182, is also formed on portions of the first semiconductor layer 113 exposed through the via holes in the third cell region 163.

In FIG. 81, the second upper electrode 182 is electrically connected to the portions of the first semiconductor layer 112 through the via holes in the second cell region 162, and is electrically connected to the third lower electrode 153 in the third cell region 163. Thus, the first semiconductor layer 112 in the second cell region 162 can maintain the same potential as the second semiconductor layer 133 in the third cell region 163.

Referring to FIG. 82, the third upper electrode 183 is formed on portions of the first semiconductor layer 113 exposed through the via holes in the third cell region 163, and is formed to extend to the fourth lower electrode 154 in the fourth cell region 164. Thus, the first semiconductor layer 113 in the third cell region 163 is electrically connected to the second semiconductor layer 134 in the fourth cell region 164. The fourth upper electrode 184 physically separated from the third upper electrode 183 is electrically connected to the portions of the first semiconductor layer 114 exposed through the via holes in the fourth cell region 164.

Referring to FIG. 83, the fourth upper electrode 184 is formed on portions of the first semiconductor layer 114 exposed through the via holes in the fourth cell region 164. The first upper electrode 181, physically separated from the fourth upper electrode 184, is formed on portions of the first semiconductor layer 111 exposed through the via holes in the first cell region 161, and allows a portion of the first lower electrode 151 to be exposed in the first cell region 161.

Some features illustrated in FIGS. 79 to 83 will be summarized below. The first semiconductor layer 111 in the first cell region 161 and the second semiconductor layer 132 in the second cell region 162 establish the same potential through the first upper electrode 181. The first semiconductor layer 112 in the second cell region 162 and the second semiconductor layer 133 in the third cell region 163 establish the same potential through the second upper electrode 182. The first semiconductor layer 113 in the third cell region 163 establish the same potential as the second semiconductor layer 134 in the fourth cell region 164 through the third upper electrode 183. The first lower electrode 151 electrically connected to the second semiconductor layer 131 in the first cell region 161 is exposed.

Of course, the same potential is established by assuming ideal electrical connection in a state where resistances of the upper electrodes 181, 182, 183 and 184 and contact resistances between the upper electrodes 181, 182, 183 and 184 and the lower electrodes 151, 152, 153 and 154 are neglected. Thus, in the operation of an actual device, a voltage drop may be sometimes caused by resistance components of the upper electrodes 181, 182, 183 and 184 and the lower electrodes 151, 152, 153 and 154, which are kinds of metal wires.

Meanwhile, the upper electrodes 181, 182, 183 and 184 may include a reflective conductive layer 180b. The reflective conductive layer 180b may comprise Al, Ag, Rh, Pt or a combination thereof. The upper electrodes 181, 182, 183 and 184 including the reflective conductive layer 180b may reflect light, which is generated from the active layers 121, 122, 123 and 124 in the respective cell regions 161, 162, 163 and 164, toward the substrate 100. Further, the upper electrodes 181, 182, 183 and 184 may construct, together with the first interlayer insulating layer 170, omni-directional reflectors. Meanwhile, even when the first interlayer insulating layer 170 is formed as the distributed Bragg reflector, the upper electrodes 181, 182, 183 and 184 including the reflective conductive layer 180b can also improve light reflectivity.

The upper electrodes 181, 182, 183 and 184 may also include an ohmic contact layer 180a. The reflective conductive layer 180b may be positioned on the ohmic contact layer 180a. The ohmic contact layer 180a comprises a material, such as Ni, Cr, Ti, Rh, Al or combination thereof, that can be in ohmic contact with the first semiconductor layers 111, 112, 113 and 114 and the lower electrodes 151, 152, 153 and 154. However, the ohmic contact layer 180a is not limited thereto, and any material may be used for the ohmic contact layer 180a as long as it is a material that can be in ohmic contact with the lower electrodes 151, 152, 153 and 154 made of a metallic material while being in ohmic contact with the first semiconductor layers 111, 112, 113 and 114. A layer of conductive oxide such as ITO may be used.

The light generated from the active layers 121, 122, 123 and 124 in the respective cell regions 161, 162, 163 and 164 may be reflected from the lower electrodes 151, 152, 153 and 154 toward the substrate 100. In addition, light transmitted through the spaces between the adjacent ones of the cell regions 161, 162, 163 and 164 is reflected by the first interlayer insulating layer 170 shielding the spaces between the adjacent ones of the cell regions 161, 162, 163 and 164 and/or the upper electrodes 181, 182, 183 and 184. The light L generated from the active layers 121, 122, 123 and 124 and directed to the via holes or the spaces between the adjacent ones of the cell regions 161, 162, 163 and 164 is reflected by the first interlayer insulating layer 170 disposed on sidewalls of the via holes or spaces and/or by the upper electrodes 181, 182, 183 and 184 having the reflective conductive layer 180b, so that the light can be extracted to the outside through the substrate 100. Accordingly, it is possible to reduce light loss, thereby improving light extraction efficiency.

To this end, it is preferable that the upper electrodes 181, 182, 183 and 184 occupy a large area in the light emitting diode array. For example, the upper electrodes 181, 182, 183 and 184 may cover no less than 70%, no less than 80% or even no less than 90% of the entire area of the light emitting diode array. An interval between the upper electrodes 181, 182, 183 and 184 may be in a range of about 1 to 100 μm. More preferably, the interval between the upper electrodes 181, 182, 183 and 184 may be 5 to 15 μm. Accordingly, it is possible to prevent light leakage in the via holes or the spaces between the adjacent ones of the cell regions 161, 162, 163 and 164.

The upper electrodes 181, 182, 183 and 184 may further include a barrier layer 180c disposed on the reflective conductive layer 180b. The barrier layer 180c may comprise Ti, Ni, Cr, Pt, TiW, W, Mo or a combination thereof. The barrier layer 180c can prevent the reflective conductive layer 180b from being damaged during a subsequent etching or cleaning process. The barrier layer 180c may be formed as a single- or multi-layered structure and to have a thickness ranging from 300 to 5000 μm.

If the first semiconductor layers 111, 112, 113 and 114 have n-type conductivity and the second semiconductor layers 131, 132, 133 and 134 have p-type conductivity, each of the upper electrodes may be modeled as a cathode electrode of the light emitting diode, and simultaneously as wiring for connecting the cathode electrode of the light emitting diode to the lower electrode that is an anode electrode of a light emitting diode formed in an adjacent cell region. That is, in the light emitting diode formed in the cell region, the upper electrode may be modeled to form a cathode electrode and simultaneously to be wiring for electrically connecting the cathode electrode of the light emitting diode to an anode electrode of a light emitting diode in an adjacent cell region.

Figure 84:
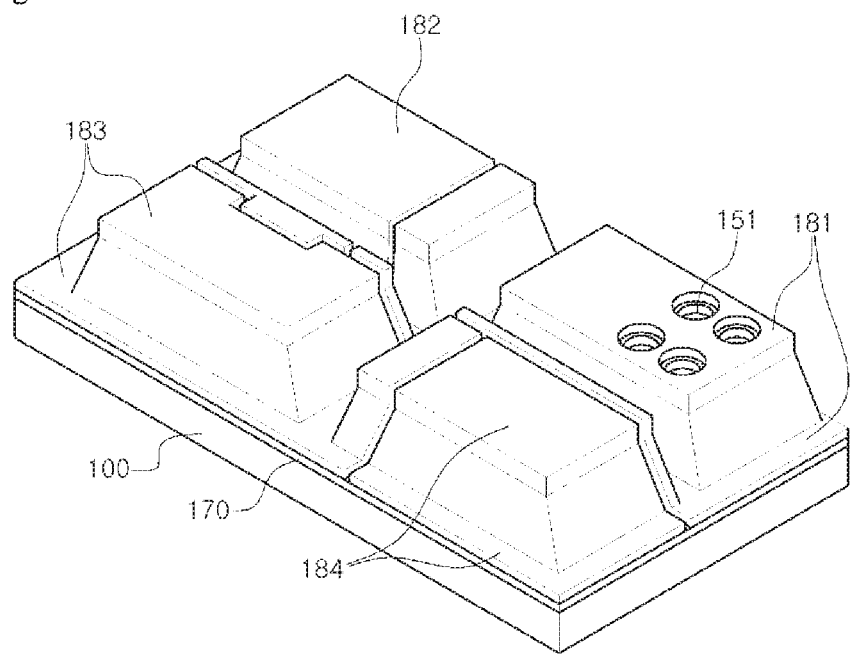
FIG. 84 is a perspective view of the structure in the plan view of FIG. 79.

FIG. 84 is a perspective view of the structure in the plan view of FIG. 79.

Referring to FIG. 84, the first to third upper electrodes 181 to 183 are formed over at least two cell regions. The space between adjacent cell regions is shielded. The upper electrodes allow light, which may be leaked between adjacent cell regions, to be reflected through the substrate, and are electrically connected to the first semiconductor layer in each cell region. The upper electrodes are electrically connected to the second semiconductor layer in an adjacent cell region.

Figure 85:
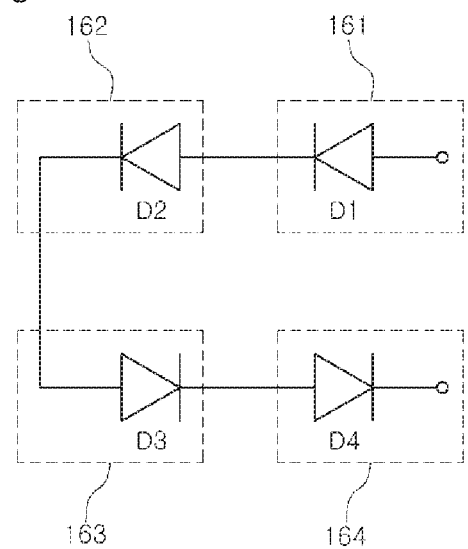
FIG. 85 is an equivalent circuit diagram obtained by modeling the structure of FIGS. 79 to 84 according to an embodiment of the present disclosure.

FIG. 85 is an equivalent circuit diagram obtained by modeling the structure of FIGS. 79 to 84 according to an embodiment of the present disclosure.

Referring to FIG. 85, four light emitting diodes D1, D2, D3 and D4 and a wiring relationship among the light emitting diodes are shown.

The first light emitting diode D1 is formed in the first cell region 161, the second light emitting diode D2 is formed in the second cell region 162, the third light emitting diode D3 is formed in the third cell region 163, and the fourth light emitting diode D4 is formed in the fourth cell region 164. The first semiconductor layers 111, 112, 113 and 114 in the cell regions 161, 162, 163 and 164 are modeled as n-type semiconductors, and the second semiconductor layers 131, 132, 133 and 134 are modeled as p-type semiconductors.

The first upper electrode 181 is electrically connected to the first semiconductor layer 111 in the first cell region 161 and extends to the second cell region 162 so as to be electrically connected to the second semiconductor layer 132 in the second cell region 162. Thus, the first upper electrode 181 is modeled as wiring for connecting a cathode terminal of the first light emitting diode D1 to an anode electrode of the second light emitting diode D2.

The second upper electrode 182 is modeled as wiring for connection between a cathode terminal of the second light emitting diode D2 and an anode terminal of the third light emitting diode D3. The third upper electrode 183 is modeled as wiring for connection between a cathode electrode of the third light emitting diode D3 and an anode terminal of the fourth light emitting diode D4. The fourth upper electrode 184 is modeled as wiring for forming a cathode electrode of the fourth light emitting diode D4.

Thus, the anode terminal of the first light emitting diode D1 and the cathode terminal of the fourth light emitting diode D4 are in an electrically opened state with respect to an external power source, and the other light emitting diodes D2 and D3 are electrically connected in series.

Figure 86:
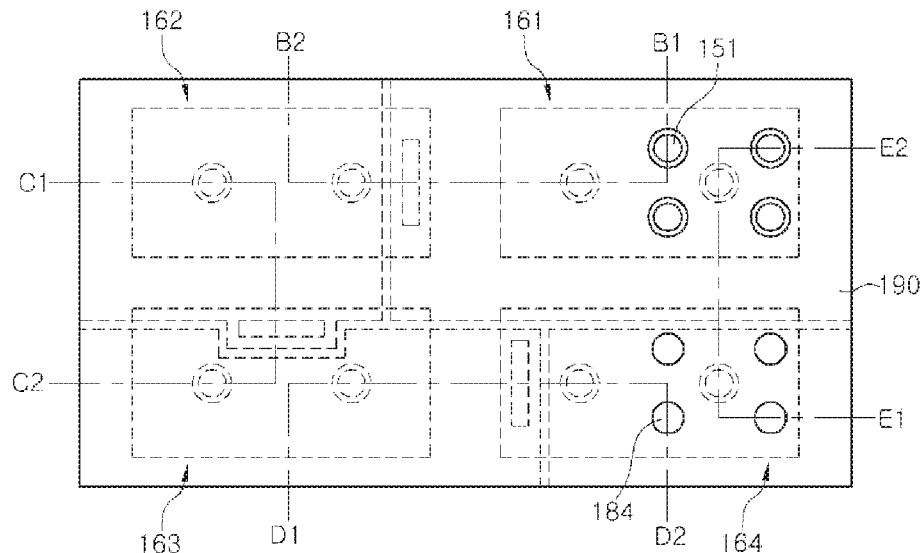
FIG. 86 is a plan view showing that a second interlayer insulating layer is applied on an entire surface of the structure of FIG. 79, a portion of a first electrode in a first cell region is exposed, and a portion of a fourth lower electrode in a fourth cell region is exposed.

FIG. 86 is a plan view showing that a second interlayer insulating layer is applied on an entire surface of the structure of FIG. 79, a portion of the first electrode in the first cell region is exposed, and a portion of the fourth lower electrode in the fourth cell region is exposed.

Figure 87:
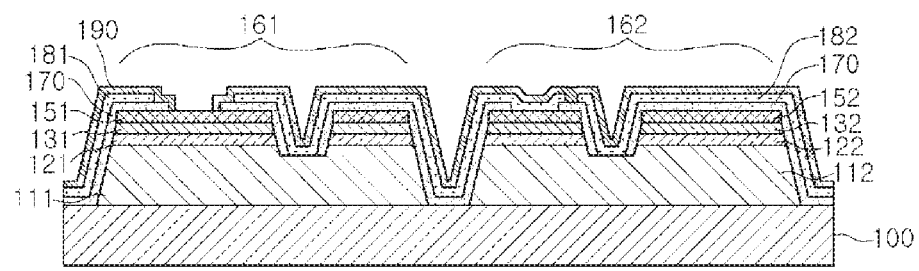
FIGS. 87 to 90 are sectional views taken along specific lines in the plan view of FIG. 86.
Figure 88:
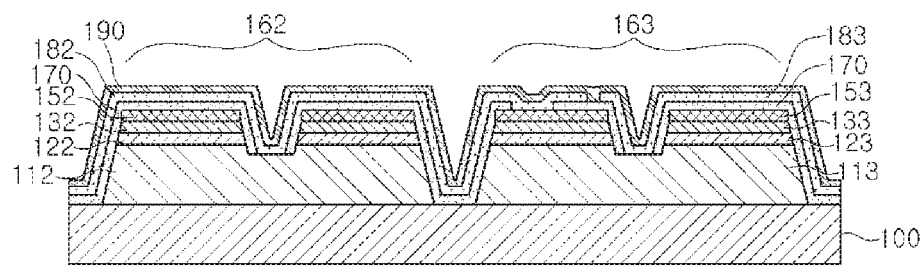
Figure 89:
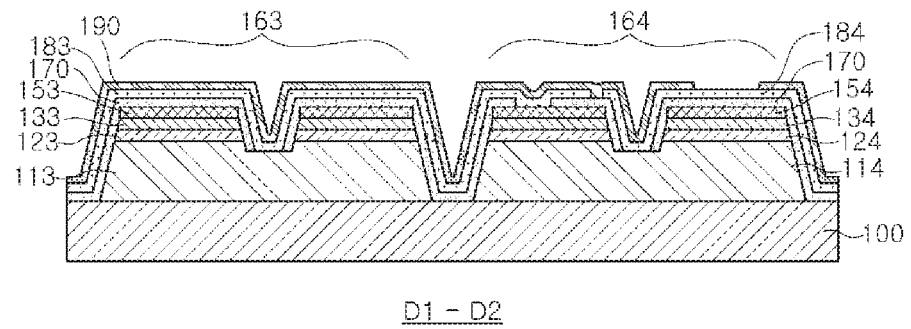
Figure 90:
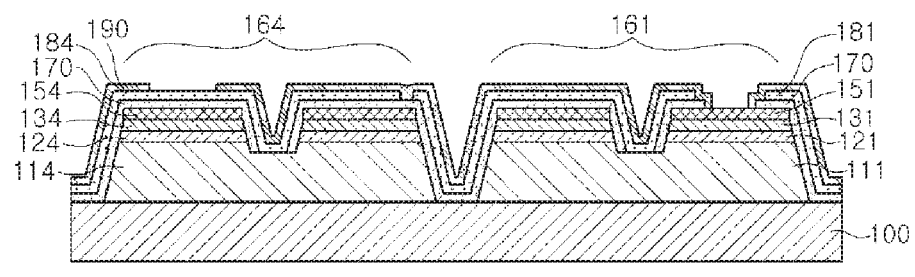

FIG. 87 is a sectional view taken along line B1-B2 in the plan view of FIG. 86, FIG. 88 is a sectional view taken along line C1-C2 in the plan view of FIG. 86, FIG. 89 is a sectional view taken along line D1-D2 in the plan view of FIG. 86, and FIG. 90 is a sectional view taken along line E1-E2 in the plan view of FIG. 86.

Referring to FIG. 87, in the first cell region 161, portions of the first lower electrode 151 electrically connected to the second semiconductor layer 131 are opened. The remaining portions in the first cell region are covered with the second interlayer insulating layer 190 that is also over the second cell region 162.

Referring to FIG. 88, the second and third cell regions 162 and 163 are completely covered with the second interlayer insulating layer 190.

Referring to FIGS. 89 and 90, portions of the fourth upper electrode 184 in the fourth cell region 164 are exposed, and portions of the first lower electrode 151 in the first cell region 161 are exposed.

The second interlayer insulating layer 190 is selected from an insulation material capable of protecting an underlying film from an external environment. In particular, the second interlayer insulating layer may comprise SiN or the like that has an insulation property and can block a change in temperature or humidity.

In FIGS. 86 to 90, the second interlayer insulating layer 190 is applied to the entire structure formed on the substrate, and also exposes a portion of the first lower electrode 151 in the first cell region 161 and exposes the fourth upper electrode 184 in the fourth cell region 164.

Figure 91:
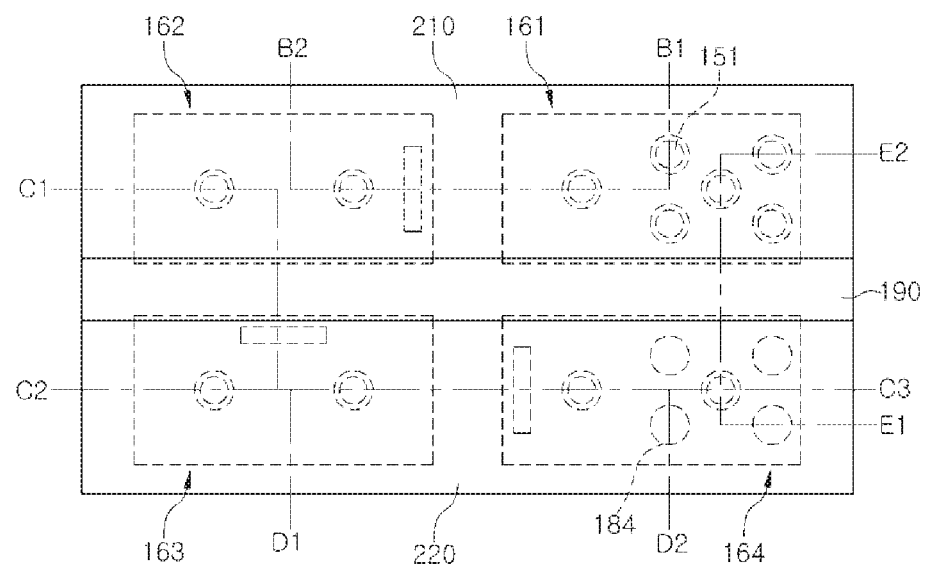
FIG. 91 is a plan view showing that first and second pads are formed in the structure of FIG. 86.

FIG. 91 is a plan view showing that first and second pads are formed in the structure of FIG. 86.

Referring to FIG. 91, the first pad 210 may be formed over the first and second cell regions 161 and 162. Accordingly, the first pad 210 can be electrically connected to the first lower electrode 151 in the first cell region 161, which is exposed in FIG. 86.

Moreover, the second pad 220 is formed to be spaced apart from the first pad 210 at a predetermined distance, and may be formed over the third and fourth cell regions 163 and 164. The second pad 220 is electrically connected to the fourth upper electrode 184 in the fourth cell region 164, which is exposed in FIG. 86.

Figure 92:
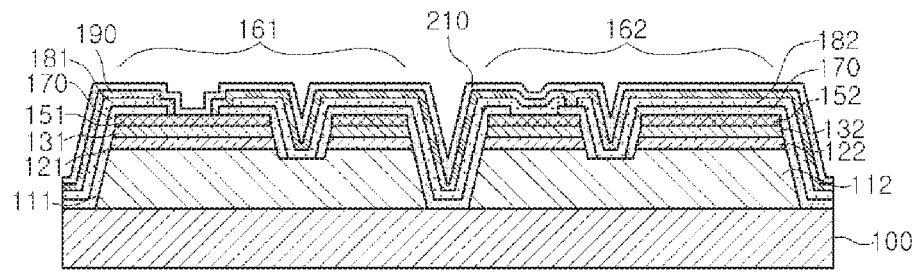
FIGS. 92 to 95 are sectional views taken along specific lines in the plan view of FIG. 91.
Figure 93:
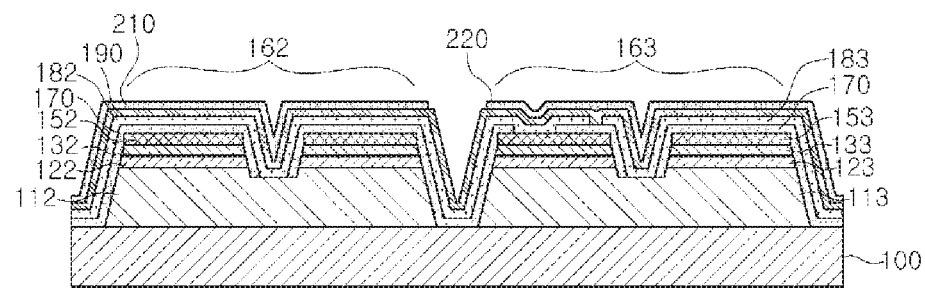
Figure 94:
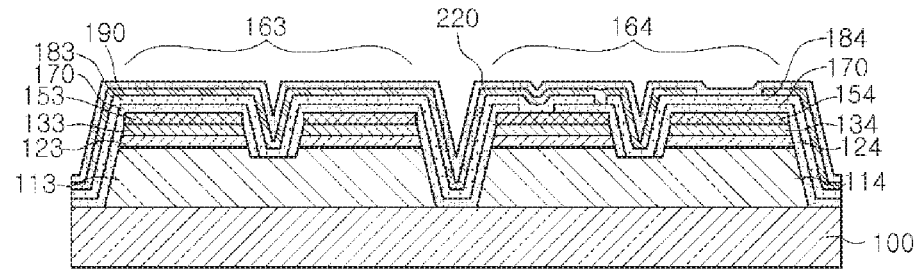
Figure 95:
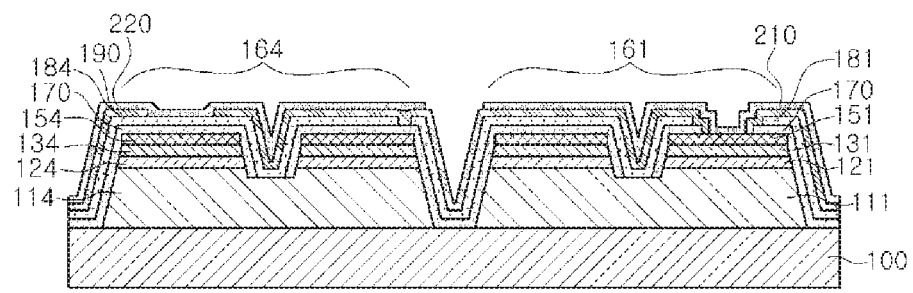

FIG. 92 is a sectional view taken along line B1-B2 in the plan view of FIG. 91, FIG. 93 is a sectional view taken along line C1-C2 in the plan view of FIG. 91, FIG. 94 is a sectional view taken along line D1-D2 in the plan view of FIG. 91, and FIG. 95 is a sectional view taken along line E1-E2 in the plan view of FIG. 91.

Referring to FIG. 92, the first pad 210 is formed over the first and second cell regions 161 and 162. The first pad 210 is formed on the first lower electrode 151 exposed in the first cell region 161, and on the second interlayer insulating layer 190 in the other cell regions. Thus, the first pad 210 is electrically connected to the second semiconductor layer 131 in the first cell region 161 through the first lower electrode 151.

Referring to FIG. 93, the first pad 210 is formed in the second cell region 162, and the second pad 220 is formed in the third cell region 163 to be spaced apart from the first pad 210. The electrical contact of the first or second pad 210 or 220 with the lower or upper electrode is blocked in the second and third cell regions 162 and 163.

Referring to FIG. 94, the second pad 220 is formed over the third and fourth cell regions 163 and 164. Particularly, the second pad 220 is electrically connected to the fourth upper electrode 184 opened in the fourth cell region 164. Thus, the second pad 220 is electrically connected to the first semiconductor layer 114 in the fourth cell region 164.

Referring to FIG. 95, the second pad 220 is formed in the fourth cell region 164, and the first pad 210 is formed to be spaced apart from the second pad 220 in the first cell region 161. The first pad 210 is formed on the first lower electrode 151 in the first cell region 161 and electrically connected to the second semiconductor layer 131.

Figure 96:
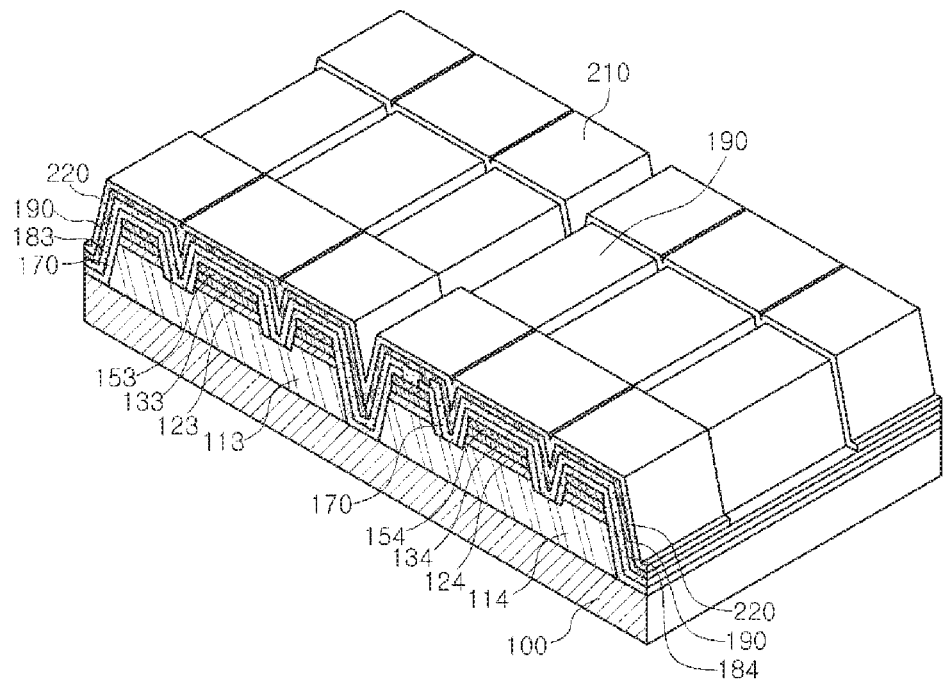
FIG. 96 is a perspective view taken along line C2-C3 in the plan view of FIG. 91.

FIG. 96 is a perspective view taken along line C2-C3 in the plan view of FIG. 91.

Referring to FIG. 96, the first semiconductor layer 113 in the third cell region 163 is electrically connected to the third upper electrode 183. The third upper electrode 183 shields the space between the third and fourth cell regions 163 and 164 and is electrically connected to the fourth lower electrode 154 in the fourth cell region 164. The first and second pads 210 and 220 are spaced apart from each other and formed on the second interlayer insulating layer 190. Of course, as described above, the first pad 210 is electrically connected to the second semiconductor layer 131 in the first cell region 161, and the second pad 220 is electrically connected to the first semiconductor layer 114 in the fourth cell region 164.

Referring to the modeling of FIG. 85, the first semiconductor layers 111, 112, 113 and 114 in the respective cell regions are modeled as n-type semiconductors, and the second semiconductor layers 131, 132, 133 and 134 in the respective cell regions are modeled as p-type semiconductors. The first lower electrode 151 formed on the second semiconductor layer 131 in the first cell region 161 is modeled as the anode electrode of the first light emitting diode D1. Thus, the first pad 210 can be modeled as wiring connected to the anode electrode of the first light emitting diode D1. The fourth upper electrode 184 electrically connected to the first semiconductor layer 114 in the fourth cell region 164 is modeled as the cathode electrode of the fourth light emitting diode D4. Thus, the second pad 220 can be modeled as wiring connected to the cathode electrode of the fourth light emitting diode D4.

Accordingly, an array structure in which the four light emitting diodes D1 to D4 are connected in series formed, and electrical connection thereof to the outside is achieved through the two pads 210 and 220 formed on the single substrate 100.

In the present disclosure, there is shown that the four light emitting diodes are formed while being separated from one another and an anode terminal of one of the light emitting diodes is electrically connected to a cathode terminal of another of the light emitting diodes through the lower and upper electrodes. However, the four light emitting diodes in this embodiment are merely an example, and a various number of light emitting diodes may be formed.

Figure 97:
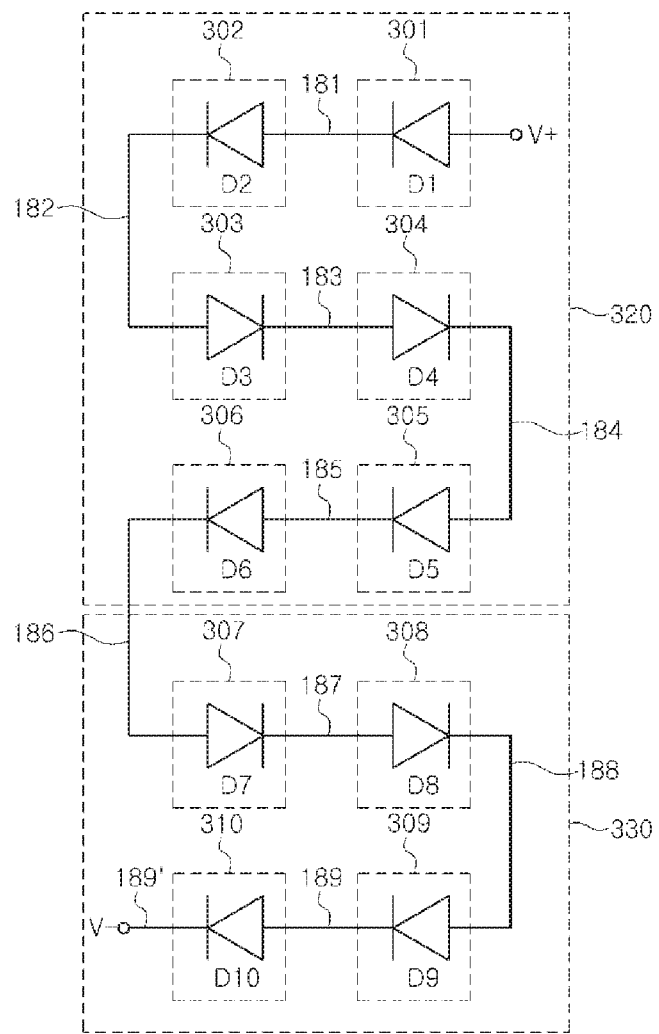
FIG. 97 is a circuit diagram obtained by modeling a connection of ten light emitting diodes in series according to an embodiment of the present disclosure.

FIG. 97 is a circuit diagram obtained by modeling a connection of ten light emitting diodes in series according to an embodiment of the present disclosure.

Referring to FIG. 97, ten cell regions 301 to 310 are defined using the process shown in FIG. 71. A first semiconductor layer, an active layer, a second semiconductor layer and a lower electrode in each of the cell regions 301 to 310 are separated from those in other cell regions. The respective lower electrodes are formed on the second semiconductor layers so as to form anode electrodes of light emitting diodes D1 to D10.

Subsequently, a first interlayer insulating layer and first to tenth upper electrodes 181, 182, 183, 184, 185, 186, 187, 188, 189 and 189' are formed using the processes shown in FIGS. 72 to 83. The upper electrodes 181, 182, 183, 184, 185, 186, 187, 188, 189 and 189' shield the space between adjacent cell regions. The first to ninth upper electrodes 181, 182, 183, 184, 185, 186, 187, 188 and 189 serve as wiring for achieving electrical connection between an anode electrode of one of a pair of adjacent light emitting diodes and a first semiconductor layer of the other of the pair of adjacent light emitting diodes. The tenth upper electrode 189' is electrically connected to the first semiconductor layer of the light emitting diode D10.

Furthermore, a second interlayer insulating layer is formed using the processes shown in FIGS. 86 to 95. The lower electrode of the first light emitting diode D1 connected to a positive power voltage V+ on a current path is exposed, and the upper electrode of the tenth light emitting diode D10 connected to a negative power voltage V− on the current path is opened. Then, a first pad 320 is formed and connected to the anode terminal of the first light emitting diode D1, and a second pad 330 is formed and connected to a cathode terminal of the tenth light emitting diode D10.

The other light emitting diodes are connected in series/parallel so as to form an array.

Figure 98:
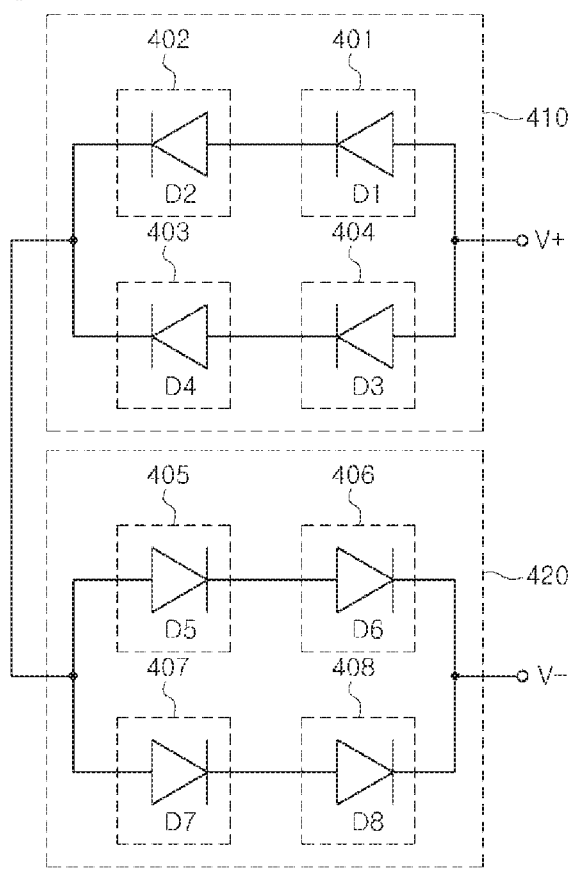
FIG. 98 is a circuit diagram obtained by modeling an array having light emitting diodes connected in series/parallel according to an embodiment of the present disclosure.

FIG. 98 is a circuit diagram obtained by modeling an array having light emitting diodes connected in series/parallel according to an embodiment of the present disclosure.

Referring to FIG. 98, a plurality of light emitting diodes D1 to D8 are connected in series and/or in parallel to one another. The light emitting diodes D1 to D8 are formed independently of one another through the definitions of cell regions 401 to 408. As described above, an anode electrode of each of the light emitting diode D1 to D8 is formed through a lower electrode. Wiring between a cathode electrode of each of the light emitting diodes D1 to D8 and the anode electrode of an adjacent light emitting diode is made by forming an upper electrode and performing an appropriate wiring process. However, the lower electrode is formed on a second semiconductor layer, and the upper electrode is formed to shield the space between adjacent cell regions.

Finally, a first pad 410 supplied with a positive power voltage V+ is electrically connected to the lower electrode formed on the second semiconductor layer of the first or third light emitting diode D1 or D3, and a second pad 420 supplied with a negative power voltage V− is electrically connected to the upper electrode that is a cathode electrode of the sixth or eighth light emitting diode D6 or D8.

According to the present disclosure described above, light generated in the active layer of each of the light emitting diodes is reflected from the lower and upper electrodes toward the substrate, and the flip-chip type light emitting diodes are electrically connected through wiring of the upper electrodes on a single substrate. Specifically, the upper electrode serves as wiring for achieving electrical connection between the first semiconductor layer of one of a pair of adjacent light emitting diodes and the second semiconductor layer of the other of the pair of adjacent light emitting diodes. In this case, the upper electrode includes a reflective conductive layer, thereby reflecting light emitted from a light-emitting layer to enhance light extraction efficiency.

in some embodiments, the upper electrode is shielded from the outside through the second interlayer insulating layer. The first pad supplied with a positive power voltage is electrically connected to a lower electrode of a light emitting diode connected most closely to the positive power voltage. The second pad supplied with a negative power voltage is electrically connected to an upper electrode of a light emitting diode connected most closely to the negative power voltage.

Thus, it is possible to solve inconvenience in a process of mounting a plurality of flip-chip type light emitting diodes on a submount substrate and implementing two terminals to an external power source through wiring arranged on the submount substrate. In addition, the space between adjacent cell regions can be shielded by the upper electrode, thereby maximizing the reflection of light toward the substrate.

Further, the second interlayer insulating layer protects a laminated structure, which is arranged between the substrate and the second interlayer insulating layer, from external temperature or humidity and the like. Thus, it is possible to implement a structure that can be directly mounted on a substrate without intervention of any separate packaging means.

In particular, since a plurality of flip-chip type light emitting diodes can be implemented on a single substrate, there is an advantage in that a commercial power source can be directly used without having to implement a voltage drop, a conversion of voltage level or a conversion of waveform for the commercial power source.

Only a few embodiments, implementations and examples are described and other embodiments and implementations, and various enhancements and variations can be made based on what is described and illustrated in this document.

The invention claimed is:

1. A light emitting diode array, comprising:
a substrate;
first and second light emitting diodes positioned over the substrate, each light emitting diode including a first semiconductor layer, an active layer, and a second semiconductor layer, wherein each light emitting diode is disposed between an internal side surface and an external side surface that are located on opposite sides of the each light emitting diode, the internal side surfaces of the first and second light emitting diodes being inclined and positioned facing each other;
a reflective layer disposed over the second semiconductor layer of corresponding light emitting diodes and configured to be in ohmic-contact with the second semiconductor layer;
a first interlayer insulating layer disposed over the reflective layer to expose portions of the reflective layer of the first and second light emitting diodes; and
an electrode formed over the first and second light emitting diodes and electrically connected to the first semiconductor layer of the first light emitting diode and the second semiconductor layer of the second light emitting diode through an exposed portion of the reflective layer,
wherein the electrode covers the internal side surfaces of the first and second light emitting diodes and has an inclined side surface formed along the internal side surfaces of the first and second light emitting diodes.

2. The light emitting diode array of claim 1, further including a second interlayer insulating layer disposed over the electrode.

3. The light emitting diode array of claim 1, wherein the first interlayer insulating layer includes a distributed Bragg reflector.

4. The light emitting diode array of claim 1, wherein the internal and external side surfaces of the first and second light emitting diodes have an inclination angle of 10 to 60 degrees with respect to a surface of the substrate.

5. The light emitting diode array of claim 1, wherein the first interlayer insulating layer has a thickness of 2000 to 20000 Å.

6. The light emitting diode array of claim 1, wherein the inclined side surface of the electrode has an inclination angle of 10 to 45 degrees with respect to a surface of the second semiconductor layer.

7. The light emitting diode array of claim 1, wherein the exposed portion of the reflective layer is located over the second light emitting diode.

8. The light emitting diode array of claim 1, wherein the electrode is further electrically connected to the first semiconductor layer of the second light emitting diode.

9. The light emitting diode array of claim 1, wherein the electrode includes a first portion formed over the first light emitting diode and the second light emitting diode and a second portion formed over the second light emitting diode, the first portion being separated from the second portion.

10. The light emitting diode array of claim 9, wherein the first portion contacts the first semiconductor layer of the first light emitting diode and the reflective layer of the second light emitting diode.

11. The light emitting diode array of claim 9, wherein the second portion contacts the first semiconductor layer of the second light emitting diode.

12. The light emitting diode array of claim 1, wherein the reflective layer includes Al, Ag, Rh or Pt.

13. The light emitting diode array of claim 1, wherein one of light emitting diodes comprising a via hole structure exposing a portion of the corresponding first semiconductor layer, and
wherein the via hole structure includes an inclined side surface.

14. A light emitting diode array, comprising:
a substrate having a first cell region and a second cell region that are arranged between edges of the substrate;
a first light emitting diode formed in a first cell region and a second light emitting diode formed in a second cell region, each light emitting diode formed over the substrate and including a first semiconductor layer, an active layer, and a second semiconductor layer and having an internal side surface and an external side surface that are disposed on opposite sides of each light emitting diode, the external side surfaces located closer to an edge of the substrate than the internal side surfaces;
a first electrode over the second semiconductor layer of the first light emitting diode and the second light emitting diode and configured to be in ohmic-contact with the second semiconductor layer;
a first interlayer insulating layer disposed over the first electrode to expose a portion of the first electrode in the first cell region; and
a second electrode electrically connecting the first light emitting diode to the second light emitting diode, the second electrode covering the external side surface of the second light emitting diode,
wherein the second electrode contacts the portion of the first electrode in the first cell region and does not contact with the first electrode in the second cell region.

15. The light emitting diode array of claim 14, wherein the second electrode formed over the first light emitting diode is extended to a portion over the second light emitting diode.

16. The light emitting diode array of claim 14, wherein the internal side surface and the external side surface of the first electrode has an inclination angle of 10 to 45 degrees with respect to a surface of the second semiconductor layer.

17. The light emitting diode array of claim 14, wherein the internal and external side surfaces of the first light emitting diode and the second light emitting diode have an inclination angle of 10 to 60 degrees with respect to a surface of the substrate.

18. The light emitting diode array of claim 14, further including a second interlayer insulating layer disposed over the second electrode.

19. The light emitting diode array of claim 14, wherein the second electrode is electrically connected to the first semiconductor layer of the first light emitting diode in the first cell region and to the second semiconductor layer of the second light emitting diode in the second cell region.

20. The light emitting diode array of claim 14, wherein the second electrode includes a first portion formed over the first light emitting diode and the second light emitting diode and a second portion formed over the second light emitting diode, the first portion being separated from the second portion.

21. The light emitting diode array of claim 14, wherein the second electrode is electrically connected to the first semiconductor layer of the second light emitting diode in the second cell region.

22. The light emitting diode array of claim 14, wherein the first electrode includes a reflective layer.

23. The light emitting diode array of claim 14, wherein the second electrode includes a reflective conductive layer.

* * * * *